(12) United States Patent
Hofmeister et al.

(10) Patent No.: US 8,562,271 B2
(45) Date of Patent: Oct. 22, 2013

(54) COMPACT SUBSTRATE TRANSPORT SYSTEM

(75) Inventors: Christopher Hofmeister, Hempstead, NH (US); Alexander Krupyshev, Chelmsford, MA (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 439 days.

(21) Appl. No.: 12/123,329

(22) Filed: May 19, 2008

(65) Prior Publication Data
US 2009/0003976 A1    Jan. 1, 2009

Related U.S. Application Data

(60) Provisional application No. 60/938,913, filed on May 18, 2007.

(51) Int. Cl.
*H01L 21/677* (2006.01)

(52) U.S. Cl.
USPC ............................ 414/217; 414/939; 414/941

(58) Field of Classification Search
USPC ............................ 414/217, 416.03, 939, 941
See application file for complete search history.

(56) References Cited

U.S. PATENT DOCUMENTS

| | | | |
|---|---|---|---|
| 5,102,280 A | 4/1992 | Poduje et al. | 414/225 |
| 5,534,761 A | 7/1996 | Crippa | 318/568.1 |
| 5,611,655 A | 3/1997 | Fukasawa et al. | 414/217 |
| 5,944,857 A | 8/1999 | Edwards et al. | 29/25.01 |
| 6,042,623 A | 3/2000 | Edwards | 29/25.01 |
| 6,335,284 B1 | 1/2002 | Choi et al. | 438/689 |
| 6,375,746 B1 | 4/2002 | Stevens et al. | 118/719 |
| 6,431,807 B1 | 8/2002 | Stevens et al. | 414/217 |
| 6,623,798 B2 | 9/2003 | Shin et al. | 427/248.1 |
| 6,669,434 B2 * | 12/2003 | Namba et al. | 414/744.5 |
| 6,722,835 B1 | 4/2004 | Stevens et al. | 414/217 |
| 6,918,731 B2 | 7/2005 | Talmer | 414/217 |
| 6,932,871 B2 | 8/2005 | Chang et al. | 118/719 |
| 6,960,057 B1 * | 11/2005 | Hofmeister | 414/744.5 |
| 6,977,014 B1 | 12/2005 | Stevens et al. | 118/719 |
| 7,286,890 B2 | 10/2007 | Machiyama et al. | |
| 7,455,747 B2 | 11/2008 | Shimizu | |

(Continued)

FOREIGN PATENT DOCUMENTS

| | | |
|---|---|---|
| JP | 2001053131 | 2/2001 |
| JP | 2001135704 | 5/2001 |

(Continued)

*Primary Examiner* — Scott Lowe
(74) *Attorney, Agent, or Firm* — Perman & Green, LLP; Colin C. Durham

(57) ABSTRACT

A substrate processing system including a load port module configured to hold at least one substrate container for storing and transporting substrates, a substrate processing chamber, an isolatable transfer chamber capable of holding an isolated atmosphere therein configured to couple the substrate processing chamber and the load port module, and a substrate transport mounted at least partially within the transfer chamber having a drive section fixed to the transfer chamber and having a SCARA arm configured to support at least one substrate, the SCARA arm being configured to transport the at least one substrate between the at least one substrate container and the processing chamber with but one touch of the at least one substrate, wherein the SCARA arm comprises a first arm link, a second arm link, and at least one end effector serially pivotally coupled to each other, where the first and second arm links have unequal lengths.

22 Claims, 44 Drawing Sheets

(56) References Cited

U.S. PATENT DOCUMENTS

| | | | |
|---|---|---|---|
| 7,472,581 B2 | 1/2009 | Kitazawa et al. | |
| 7,572,742 B2 | 8/2009 | Hiroki | |
| 7,672,502 B2 | 3/2010 | Osada et al. | |
| 7,682,517 B2 | 3/2010 | Nishimura et al. | |
| 7,736,942 B2 | 6/2010 | Nishimura et al. | |
| 7,738,987 B2 | 6/2010 | Numakura | |
| 2001/0041129 A1 | 11/2001 | Tsuneda et al. | 414/744.1 |
| 2002/0014205 A1 | 2/2002 | Shine et al. | 118/715 |
| 2002/0061650 A1 | 5/2002 | Choi et al. | 438/689 |
| 2003/0014155 A1 | 1/2003 | Pencis et al. | 700/213 |
| 2003/0194493 A1 | 10/2003 | Chang et al. | 427/248.1 |
| 2003/0219536 A1 | 11/2003 | Shin et al. | 427/255.28 |
| 2004/0105737 A1* | 6/2004 | Ozawa et al. | 414/217 |
| 2004/0144316 A1 | 7/2004 | Lee et al. | 118/719 |
| 2005/0111938 A1* | 5/2005 | van der Meulen | 414/217 |
| 2005/0271814 A1 | 12/2005 | Change et al. | 427/248.1 |
| 2006/0011297 A1* | 1/2006 | Kim | 156/345.32 |
| 2006/0056952 A1 | 3/2006 | Haris | 414/744.6 |
| 2006/0188359 A1 | 8/2006 | Talmer | 414/217 |
| 2007/0020082 A1* | 1/2007 | Caveney et al. | 414/744.5 |

FOREIGN PATENT DOCUMENTS

| | | |
|---|---|---|
| JP | 2001160584 | 6/2001 |
| JP | 2005259858 | 9/2005 |
| WO | 9850946 | 11/1998 |
| WO | 9935673 | 7/1999 |
| WO | 0109020 | 2/2001 |
| WO | 2004093166 | 3/2004 |
| WO | 2007126289 | 11/2007 |

* cited by examiner

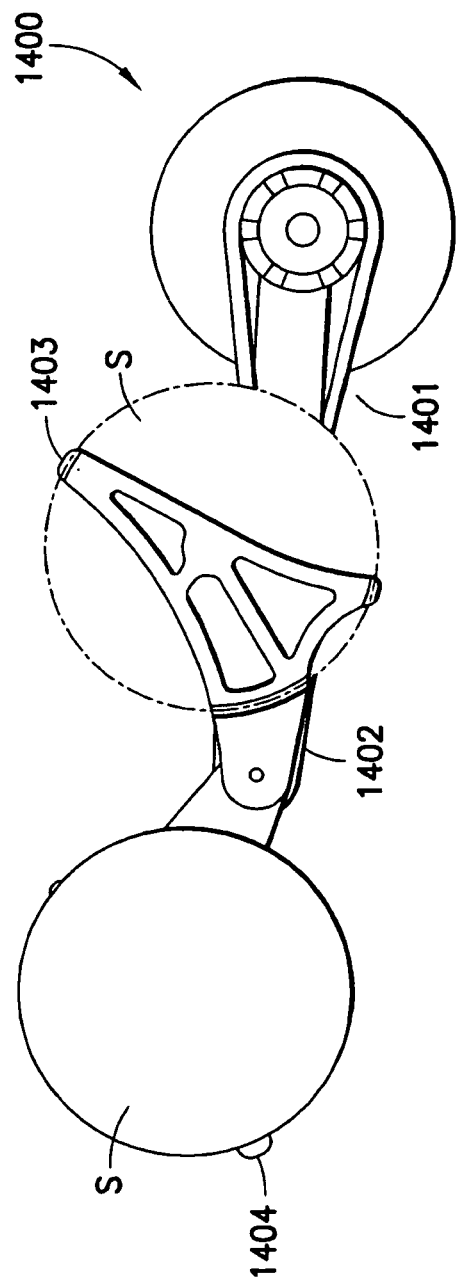
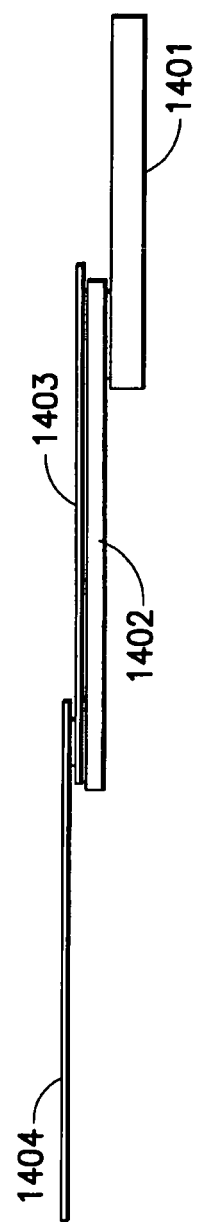
FIG. 14A
FIG. 14C

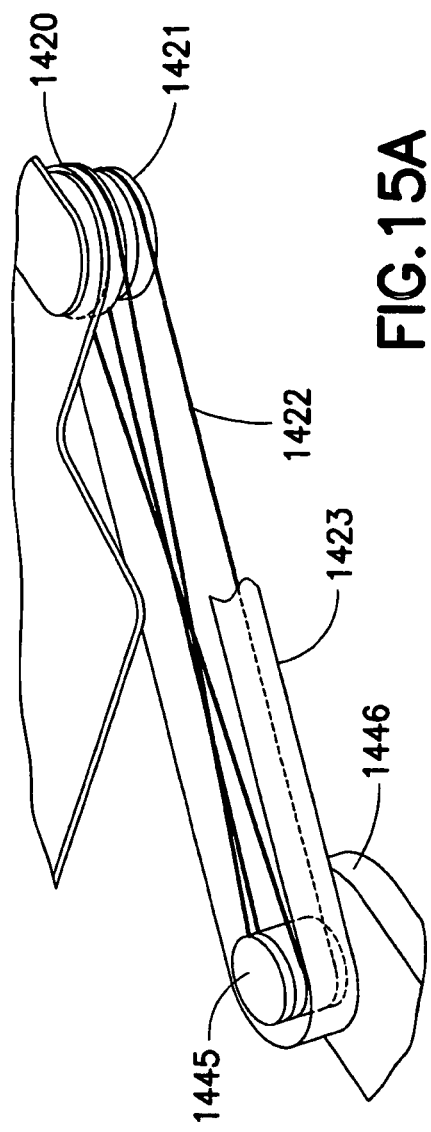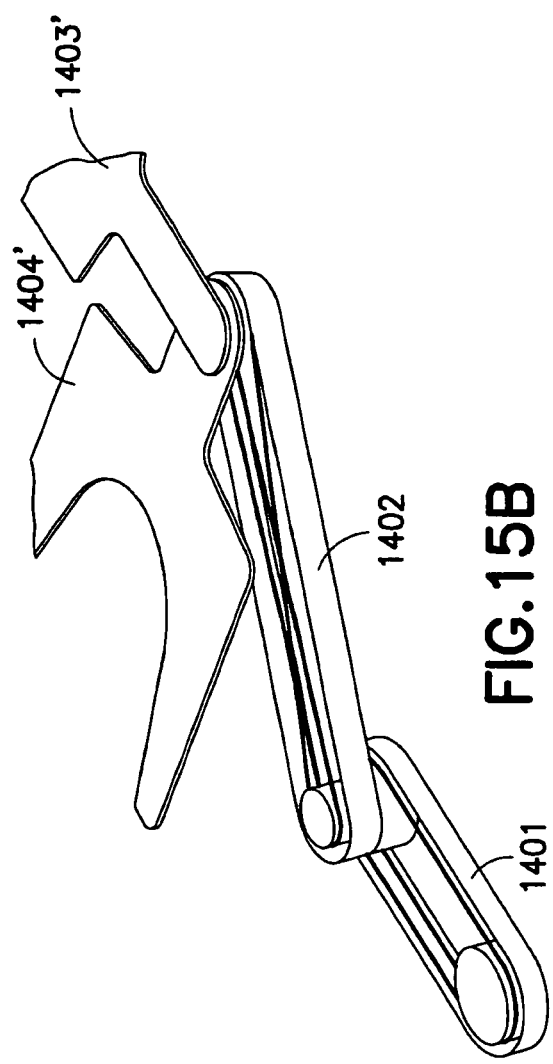
FIG. 15A
FIG. 15B

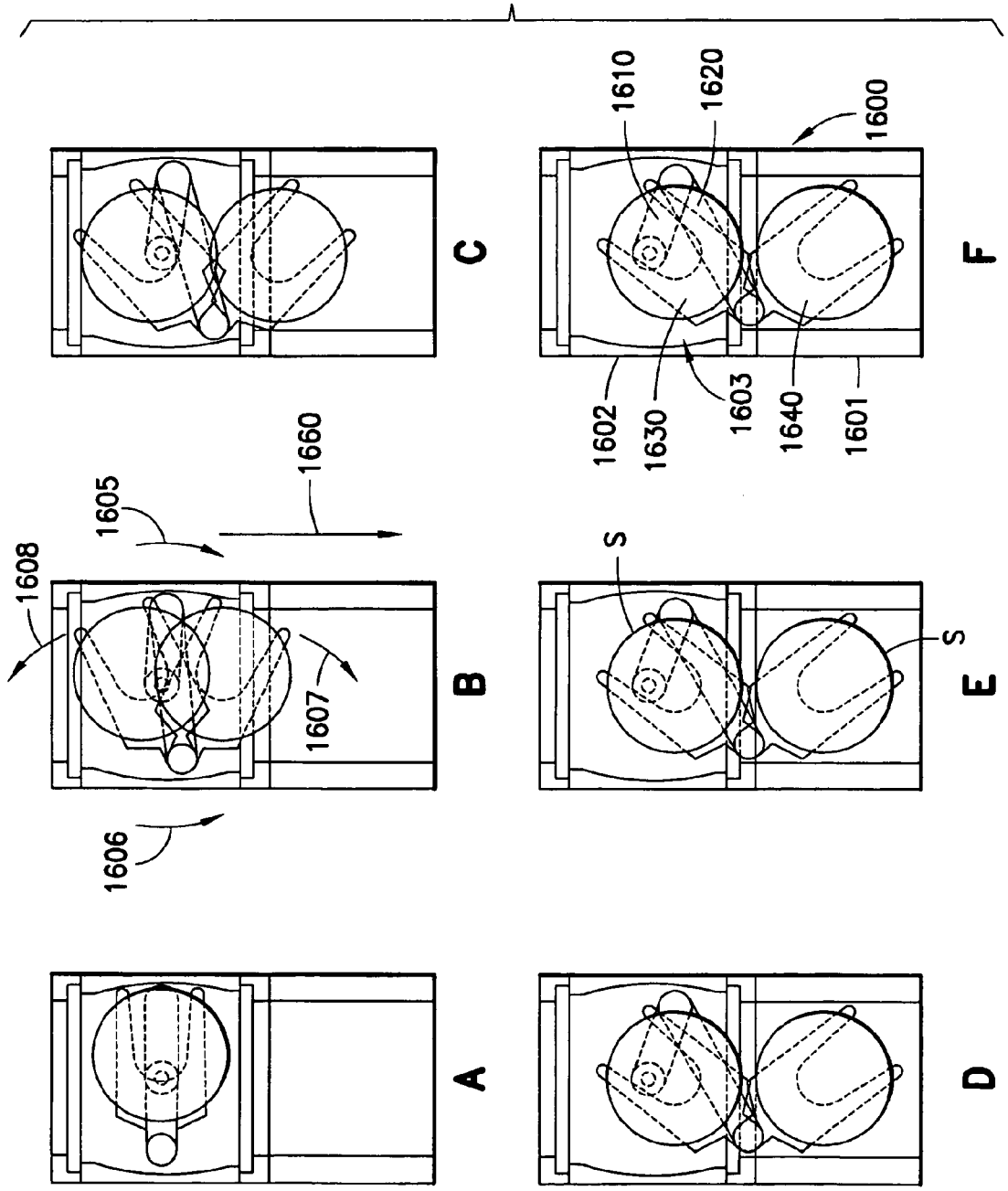

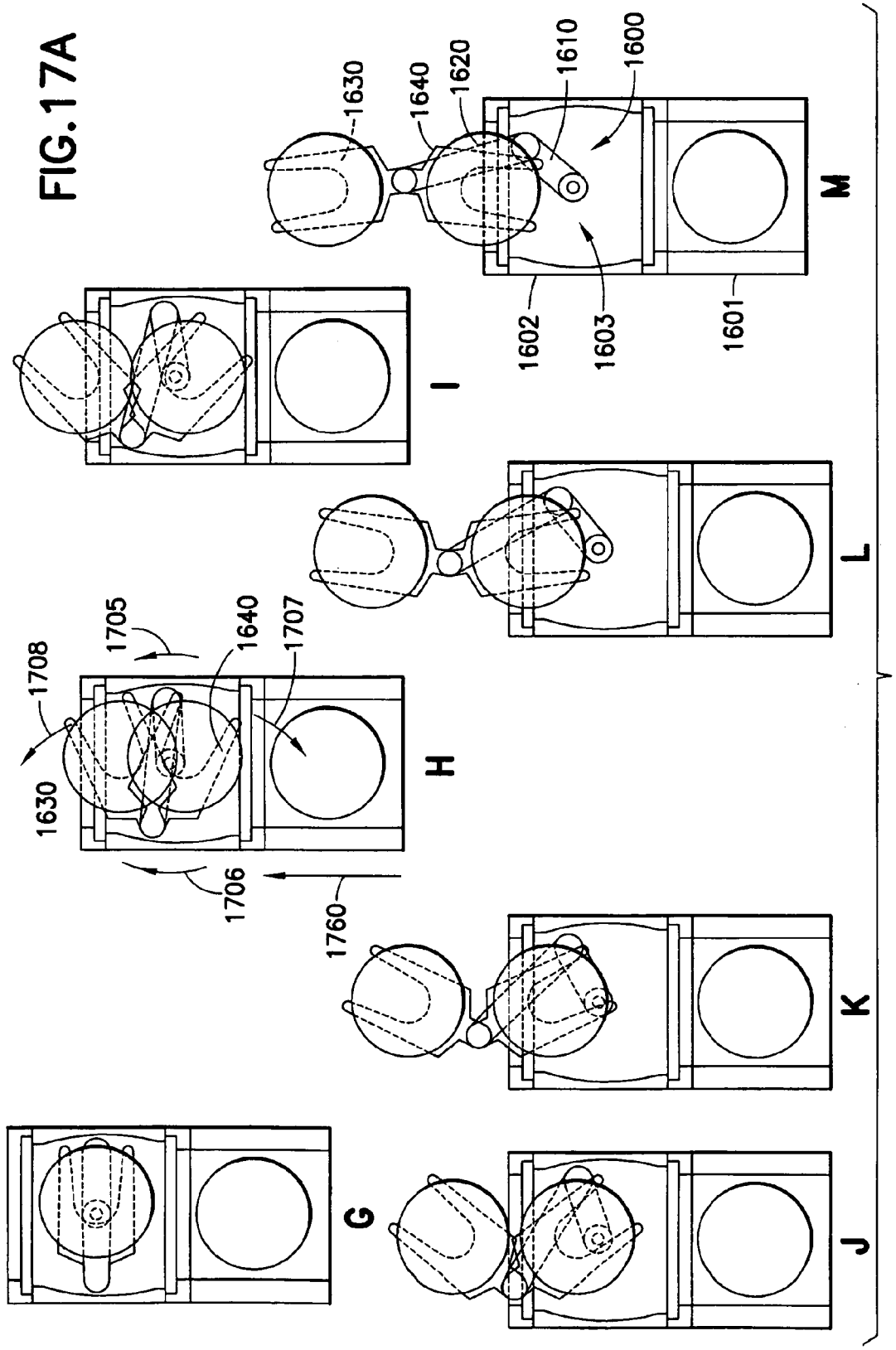

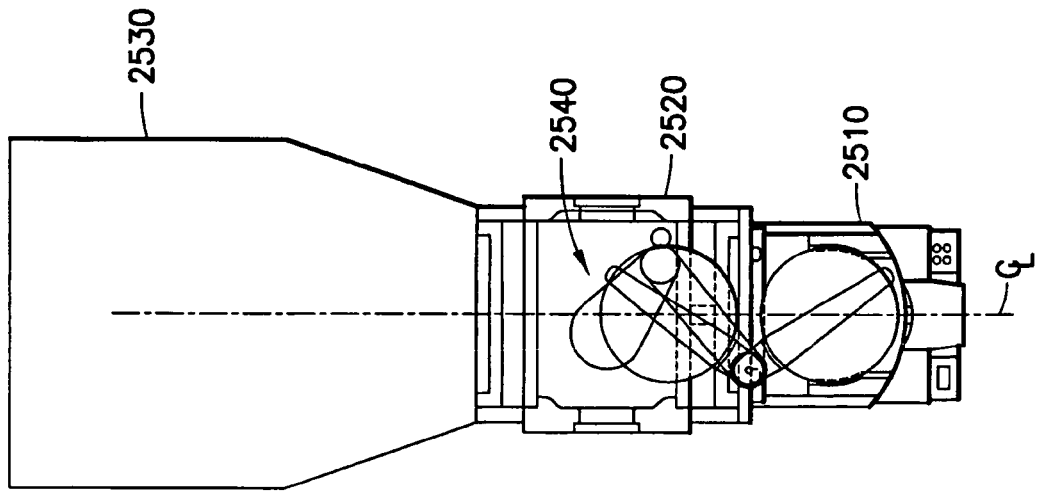
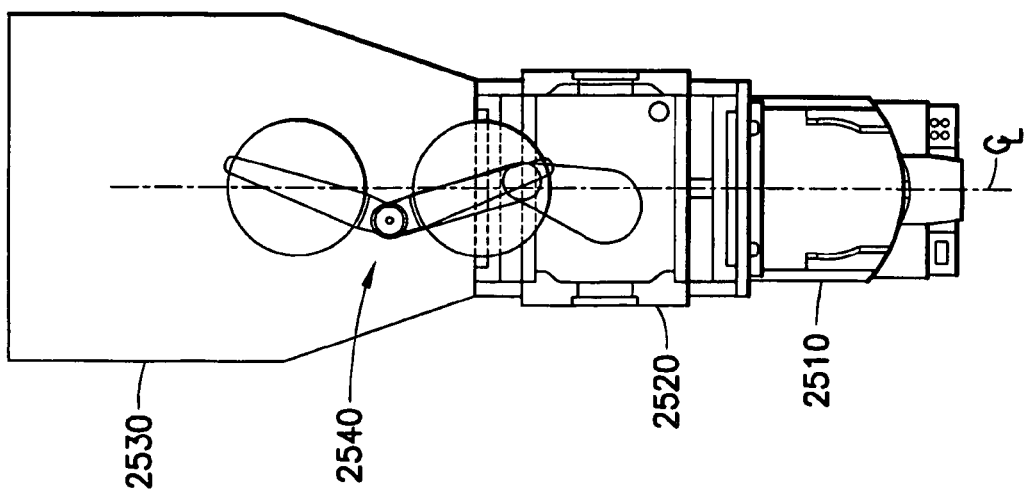

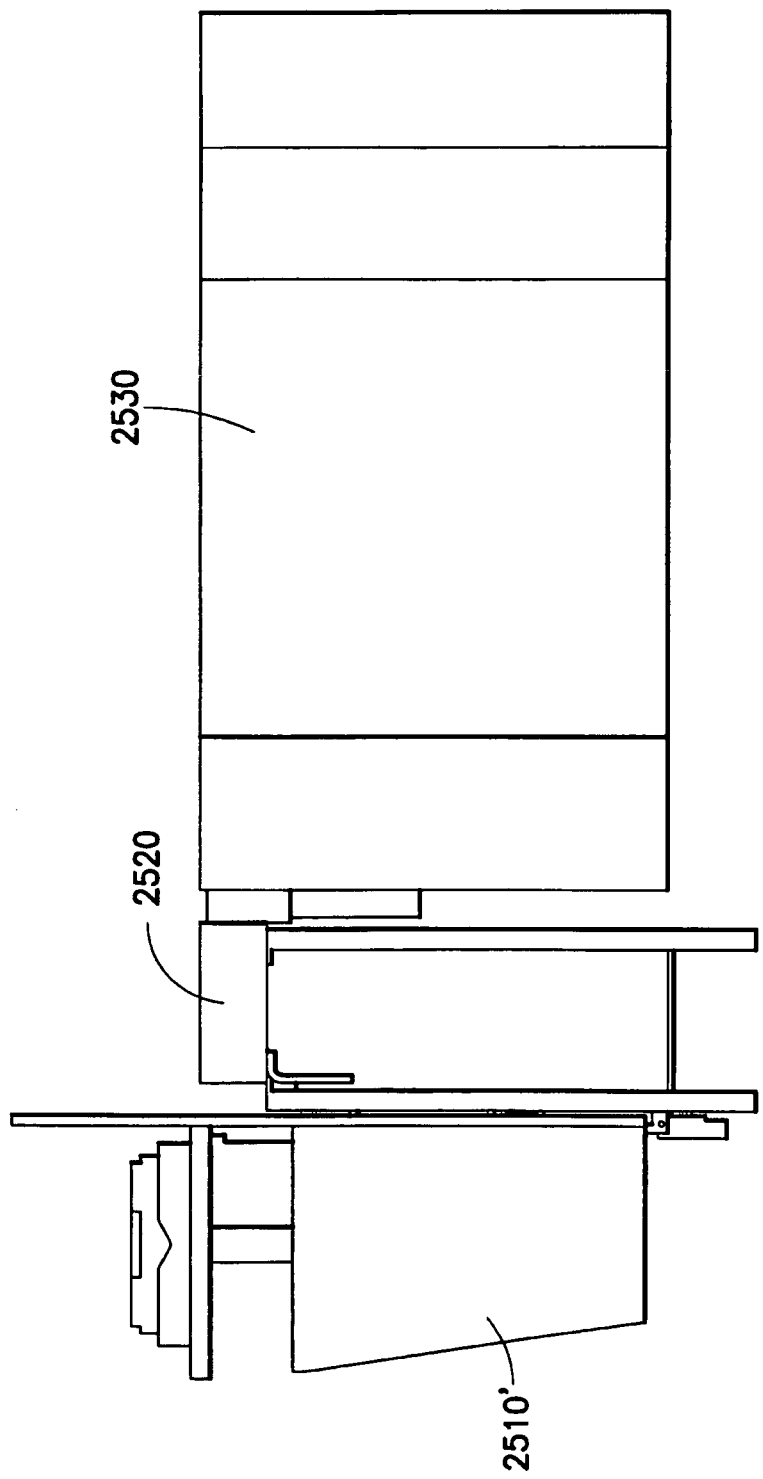

COMPACT SUBSTRATE TRANSPORT SYSTEM

CROSS-REFERENCE TO RELATED APPLICATION(S)

This application claims the benefit of U.S. Provisional Patent Application No. 60/938,913, filed on May 18, 2007, the disclosure of which is incorporated by reference herein in its entirety.

BACKGROUND

1. Field

The exemplary embodiments generally relate to substrate transfer systems and, more particularly, to a robot transfer arm of a substrate transport apparatus.

2. Brief Description of Related Developments

The processing of semiconductors often involves multiple process steps that are performed by single step tools. Such processing steps include the photo etching of the film deposited on a substrate, dry stripping, bevel edge processing, as well as heating, cooling and cleaning.

Each of the process operations is generally performed under vacuum in a specialized process chamber. Because of the need for extreme cleanliness and the delicate nature of each process, batch processing of semiconductor substrates has generally been replaced by individual substrate processing. This allows more control of the processing of each substrate, but limits the overall throughput of the system, because, for each process step, the process chamber must be vented, the substrate loaded, the chamber sealed and pumped to vacuum. After processing, the steps are reversed.

To improve the process volume, in a conventional manner a cluster of processing chambers are arranged around a conventional substrate transport chamber which is constructed to be kept under vacuum. One or more load lock chambers are connected through slit valves to the transport chamber, the transport chamber is connected to a front end module and generally multiple load port modules are coupled to the front end unit.

The load locks accommodate cassettes of substrates to be processed. The cassettes are delivered to the load lock by the front end delivery transport located in the front end module of the system. A load lock constructed to accommodate such cassettes is shown in U.S. Pat. No. 5,664,925 owned in common with the subject application. The disclosure of the '925 patent is incorporated herein by reference, in its entirety.

In this manner cycling times are reduced, while significantly increasing system throughput. The process and transport chambers are maintained continuously under vacuum, while only the load lock is cycled. The load lock receives the substrates to be processed after being sealed from the transport chamber and vented to atmosphere. The front end port is then sealed and the load lock is pumped to a vacuum consistent with the transport and processing chambers.

A robotic transfer mechanism is mounted within the transport chamber and operates to remove substrates from the load lock and deliver them to the selected process chambers. After processing, the substrates are picked up by the robot and transported to the next process chamber or to a load lock for removal from the transport chamber. In some instances, for timing purposes, these systems may employ buffer stations which are adapted to store substrates either before loading or at other times during the transport of the substrate through the system.

A system of this type is described in U.S. Pat. No. 5,882,413 and an example of a robotic transfer mechanism is shown in U.S. Pat. No. 5,647,724, each of which is assigned to an owner common to this application. The disclosures of these patents are incorporated herein by reference in their entirety.

It has been found that substrates up to 200 mm in diameter can be effectively processed with the conventional cluster type systems. As can be realized, the size of conventional cluster tools is largely dependent on the size of the conventional transport chamber, with communication to each of the processing modules of the cluster tool. Further, there is a trend towards increasing diameters and the cluster systems become unduly large when processing substrates of 300 mm, 450 mm or more in diameter. Processing systems having transports with two arm links may be used to reduce the containment to extension ratio of the transports. However, as the diameter or size of the substrates increases, the length of each of the two arm links of the transport also increases, thereby increasing the volume to accommodate the arm motion in the transport chamber.

As process device geometries shrink, film thickness reduces, suggesting shorter deposition and removal processing times. The pumping down of larger volume load locks may conflict with the shorter deposition and removal times as the pumping down of the load lock may take longer than the processing times.

It would be advantageous to have a compact substrate transport system allowing for decreased load lock pump down time. It would also be advantageous to have a substrate transport system that allows multiple processing modules to be arranged in close proximity to each other maximizing production facility floor space. It would further be advantageous to have a substrate transport system that can directly couple a load port with a processing module without the use of an equipment front end module.

SUMMARY

In one exemplary embodiment, a substrate processing system is provided. The substrate processing system includes a load port module configured to hold at least one substrate container for storing and transporting substrates, a substrate processing chamber, an isolatable transfer chamber capable of holding an isolated atmosphere therein configured to couple the substrate processing chamber and the load port module, and a substrate transport mounted at least partially within the transfer chamber having a drive section fixed to the transfer chamber and having a SCARA arm configured to support at least one substrate, the SCARA arm being configured to transport the at least one substrate between the at least one substrate container and the processing chamber with but one touch of the at least one substrate, wherein the SCARA arm comprises a first arm link, a second arm link, and at least one end effector serially pivotally coupled to each other, where the first and second arm links have unequal lengths.

In accordance with another exemplary embodiment, a substrate processing system is provided. The substrate processing system includes an equipment front end module having at least one transport path for transferring substrates from the equipment front end module, at least one substrate transfer module coupled directly to the equipment front end module, and at least one substrate processing module coupled to each of the at least one substrate transfer module, wherein the substrate processing system comprises a cluster tool and the equipment front end module, the at least one substrate transfer module and the at least one substrate processing module form independent parallel transport paths that are isolated from each other.

In accordance with yet another exemplary embodiment, a substrate transport system is provided. The substrate transport system includes a front end unit configured to transfer substrates from a substrate container, a transfer module joined to the front end unit, a substrate processing chamber coupled to the transfer module, where the transfer module and processing chamber have a substantially inline arrangement along a transport path of the front end unit for transferring substrates from the front end unit, and a substrate transport mounted at least partially within the transfer module and configured to transport substrates between the processing chamber and the transfer module, the substrate transport comprising a drive section substantially fixed to the transfer module, two arm links and at least one end effector pivotally joined to each other, a first one of the arm links being pivotally joined to a housing of the transfer module at a first end, the first arm link having a first length, a first end of a second one of the arm links being pivotally joined to a second end of the first arm link, the second arm link having a second length where a rotation of the second arm link is slaved to a rotation of the first arm link, and the at least one end effector being pivotally joined to a second end of the second arm link and being configured to hold at least one substrate, the at least one end effector being rotatably driven separately from the first and second links.

In accordance with yet another exemplary embodiment a substrate processing apparatus is provided. The substrate processing apparatus includes a front end module configured to hold at least one substrate container for storing and transporting substrates, at least one substrate processing chamber, at least one isolatable transfer chamber capable of holding an isolated atmosphere therein configured to couple a respective one of the at least one substrate processing chamber and the front end module, and a substrate transport mounted at least partially within each of the at least one transfer chambers having a drive section substantially fixed to a respective transfer chamber and having an unequal length SCARA arm configured to support at least one substrate, the SCARA arm being configured to transport the at least one substrate between the front end module and the processing chamber, wherein the front end module, at least one substrate processing chamber and at least one isolatable transfer chamber are arranged for transporting substrates between the front end module and each of the at least one substrate processing chamber along independent and isolatable paths.

In accordance with another exemplary embodiment, a method is provided. The method includes picking at least one substrate from a substrate container coupled to a load port of a substrate processing system with a substrate transport arm located within the substrate processing system and transferring the at least one substrate with the substrate transport arm directly from the substrate container to a processing module of the substrate processing system, where the at least one substrate is handled but one time by the substrate transport arm during the transfer.

BRIEF DESCRIPTION OF THE DRAWINGS

The foregoing aspects and other features of the disclosed embodiments are explained in the following description, taken in connection with the accompanying drawings, wherein:

FIGS. 14A-14C illustrate schematic views of a substrate transport in accordance with an exemplary embodiment;

FIGS. 15A and 15B show another schematic view of a portion of a substrate transport in accordance with an exemplary embodiment;

FIGS. 16A-B and 17A-B illustrate a transport path of a substrate transport in accordance with an exemplary embodiment;

FIGS. 25A-F illustrate another exemplary substrate processing system in accordance with an exemplary embodiment;

DETAILED DESCRIPTION OF THE EXEMPLARY EMBODIMENT(s)

Figure 1A:
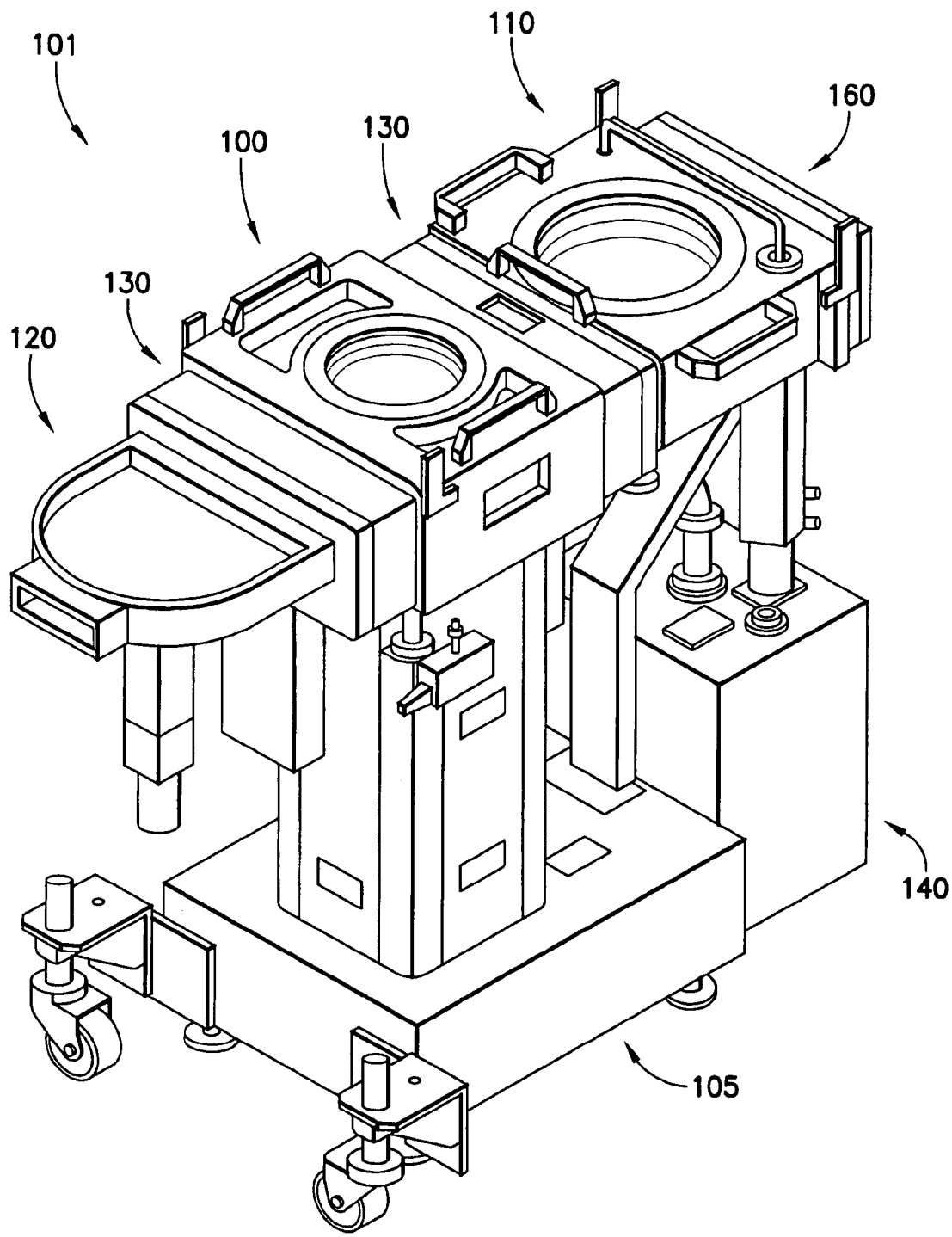
FIGS. 1A and 1B illustrate an exemplary substrate processing system in accordance with an exemplary embodiment.
Figure 1B:
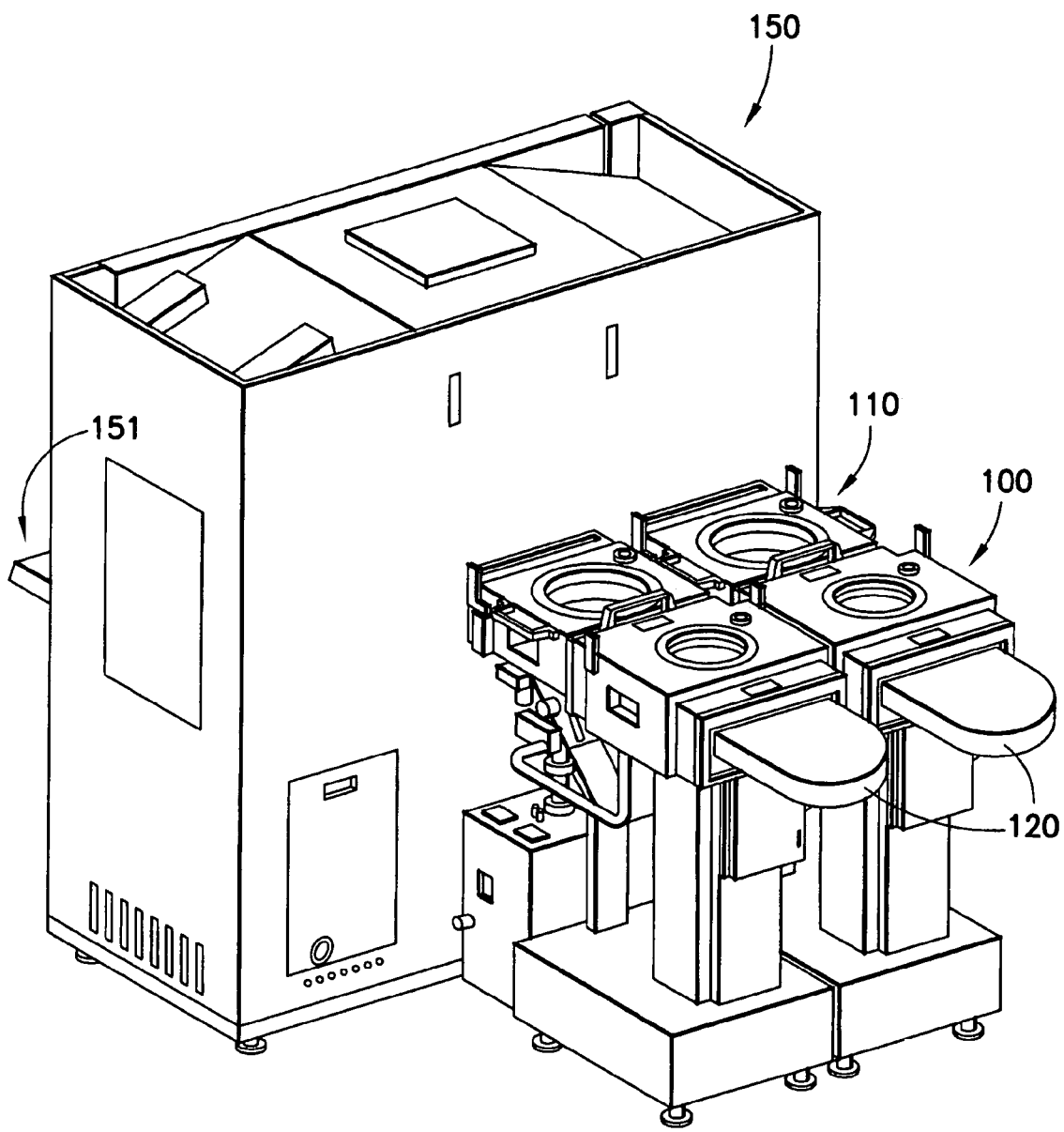
Figure 1C:
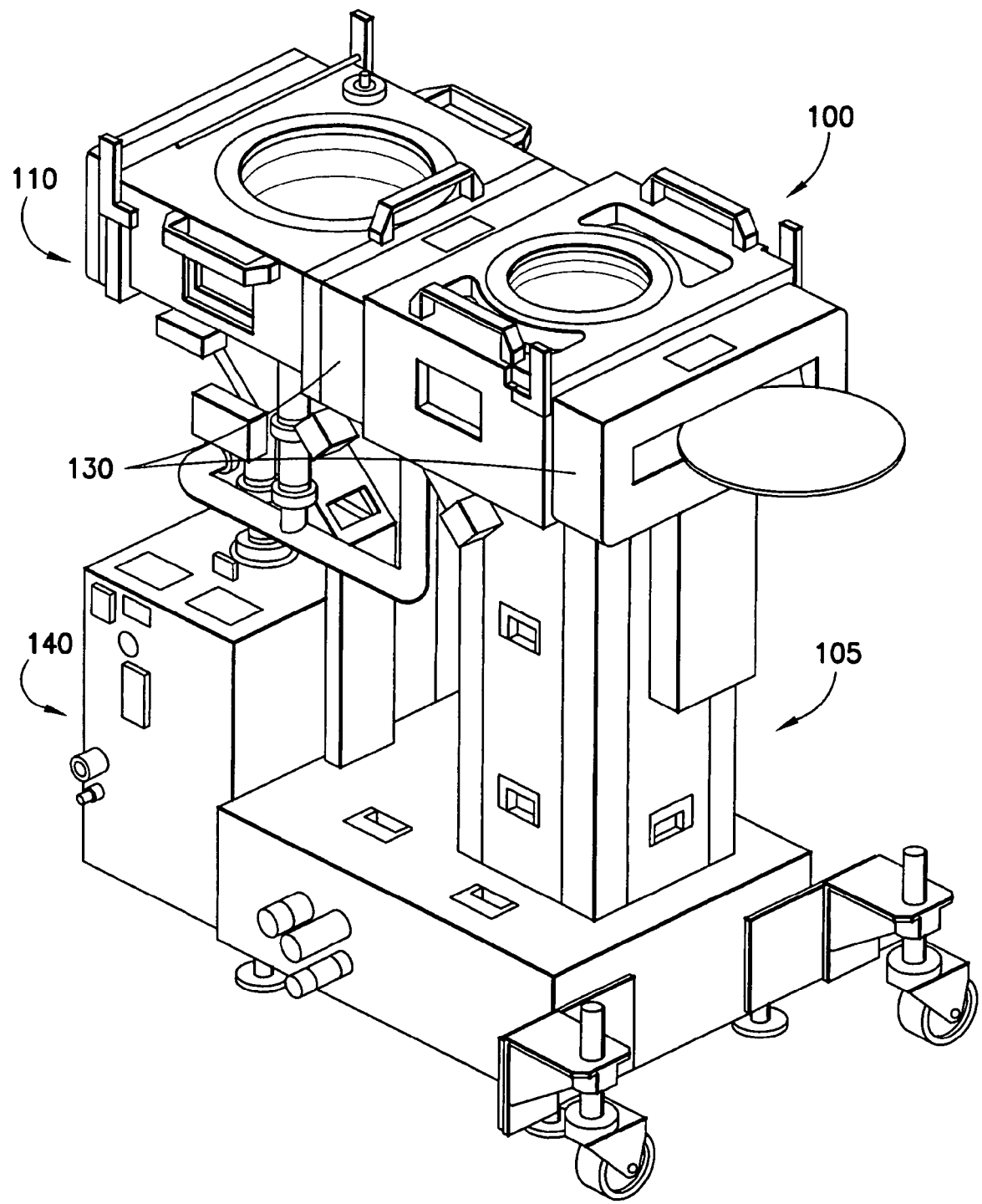
FIG. 1C illustrates a portion of the exemplary substrate processing system of FIGS. 1A and 1B.

FIGS. 1A-C illustrate an exemplary substrate processing system in accordance with an exemplary embodiment. Although the embodiments disclosed will be described with reference to the embodiments shown in the drawings, it should be understood that the embodiments disclosed can be embodied in many alternate forms. In addition, any suitable size, shape or type of elements or materials could be used.

As can be seen in FIGS. 1A-C the processing system, which may also be referred to as a cluster tool may include an equipment front end module (EFEM) 150, load port(s) 151 coupled to a first side of the EFEM 150, a load lock(s) 110 coupled a second side of the EFEM, a transfer chamber(s) 100 coupled to the load lock 110 and a processing module(s) 120 coupled to the transfer chamber(s) 100. The arrangements illustrated in FIGS. 1A-1C are merely exemplary, and in alternate embodiments, the tool may have any other desired arrangement. The load lock 110 and transfer chamber 100 may collectively be referred to as transfer module 101. It is noted that in alternate embodiments the load lock 110 may be replaced with a substrate buffer. It is also noted that the buffer may be any suitable buffer and may include a substrate cooling feature or any other suitable features, such as a metrology system, to aid in the processing of substrates. Adapters 130, which may include slit valves, couple the processing module 120, transfer chamber 100 and load lock 110 together as shown in the Figures. In alternate embodiments the processing module 120, transfer chamber 100 and load lock 110 may be coupled in any suitable manner. In this example the processing module 120 and the transfer chamber 100 may form a sealed enclosure that can be pumped down to a vacuum for substrate processing and maintained under vacuum by for example vacuum pump 140. The load lock may transition between a vacuum and some pressure other than vacuum. The vacuum pump 140 may also be utilized to pump down the load lock 110. As can be seen in the Figures, the load lock 110 may also include a valve 160 for isolating the load lock interior from the atmosphere of the EFEM 150 to allow for the pumping down of the load lock 110. In alternate embodiments, the processing system may have the transport chamber/load lock(s), such as in a vacuum system, connected to a load port without an intervening EFEM.

A first substrate transport robot may be housed at least partly within EFEM 150 for transporting substrates from, for example, a substrate cassette docked on the load port 151 to the load lock 110 (or buffer) through the valve 160. The first robot may be fixed or mounted on a track depending on the number of load port modules 151 and/or load locks 110 that it serves. An exemplary transport of this type is described in commonly owned U.S. Pat. No. 6,002,840, the disclosure of which is incorporated herein by reference in its entirety. The first robot may include a Z-axis drive and/or the load port may include a cassette elevator/indexer. A second transport robot may be housed at least partly within the transfer chamber 100 for transporting substrate between the load lock 110 and the processing module 120 through the valves 130. The transfer chamber 100 may be compact, such as for example having a width substantially equal to or less than load port(s) communicating with the transfer chamber or the process modules width. The second robot may be any suitable transport robot, an example of which will be described in greater detail below. Substrates may be transported by the first transport robot into the load lock 110 under ambient conditions. The load lock 110 may be closed, pumped to vacuum and opened to transfer chamber 100 through operation of the slit valve 130. In this manner the substrates may be supplied to the processing chamber 120 in a much more compact system as will be described in greater detail below. Other examples of compact transport systems can be found in commonly owned U.S. Pat. No. 6,918,731 and commonly assigned U.S. patent application Ser. No. 11/104,397, entitled "FAST SWAP DUAL SUBSTRATE TRANSPORT FOR LOAD LOCK" filed on Apr. 12, 2005, the disclosures of which are incorporated herein by reference in their entirety.

As can be seen best in FIG. 1B, multiple processing modules 120 may be aligned sequentially along a side of the EFEM. In this example, the substrate transfer system may be configured such that the processing modules may be arranged at a distance D of, for example, no more than 505 mm (See FIG. 20) which at present is a SEMI specified distance between operation paths of existing front end delivery systems such as EFEM 150 with respect to a 300 mm diameter substrate). In other exemplary embodiments the distance between operational paths of the EFEM may be more or less than 505 mm such as with systems configured to process, for example, 200 mm or 450 mm diameter substrates. In alternate embodiments the processing modules and their corresponding transport systems (e.g. transport systems 101 and 200 (FIGS. 1A and 2A-B)) may be located at any suitable distance such as a distance that is greater or less than 505 mm. Accordingly, a cluster tool in the exemplary embodiment may be configured so that the tool width may be defined substantially by the width of the EFEM or the process modules.

Figure 2A:
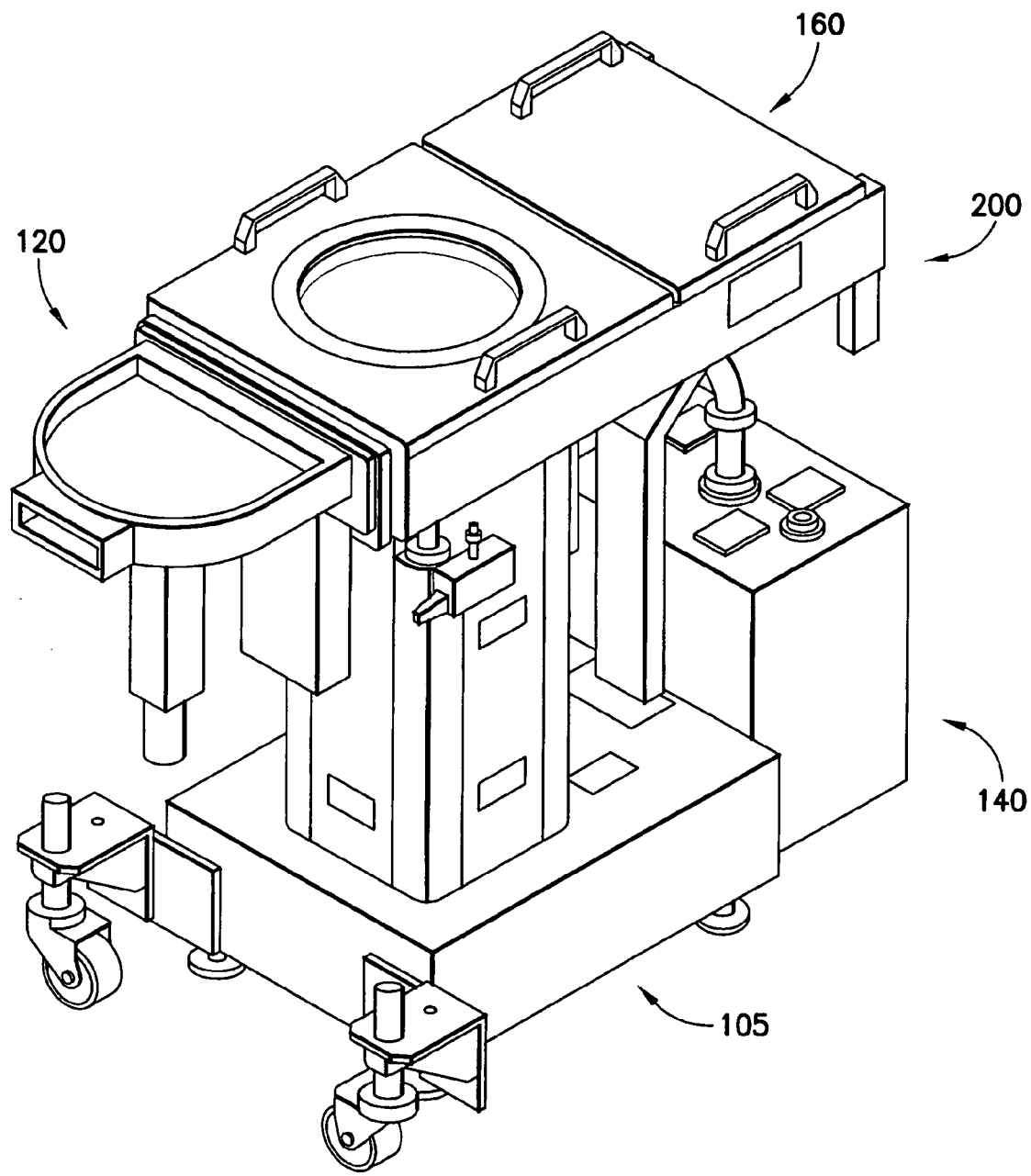
FIGS. 2A and 2B illustrate another exemplary substrate processing system in accordance with an exemplary embodiment.
Figure 2B:
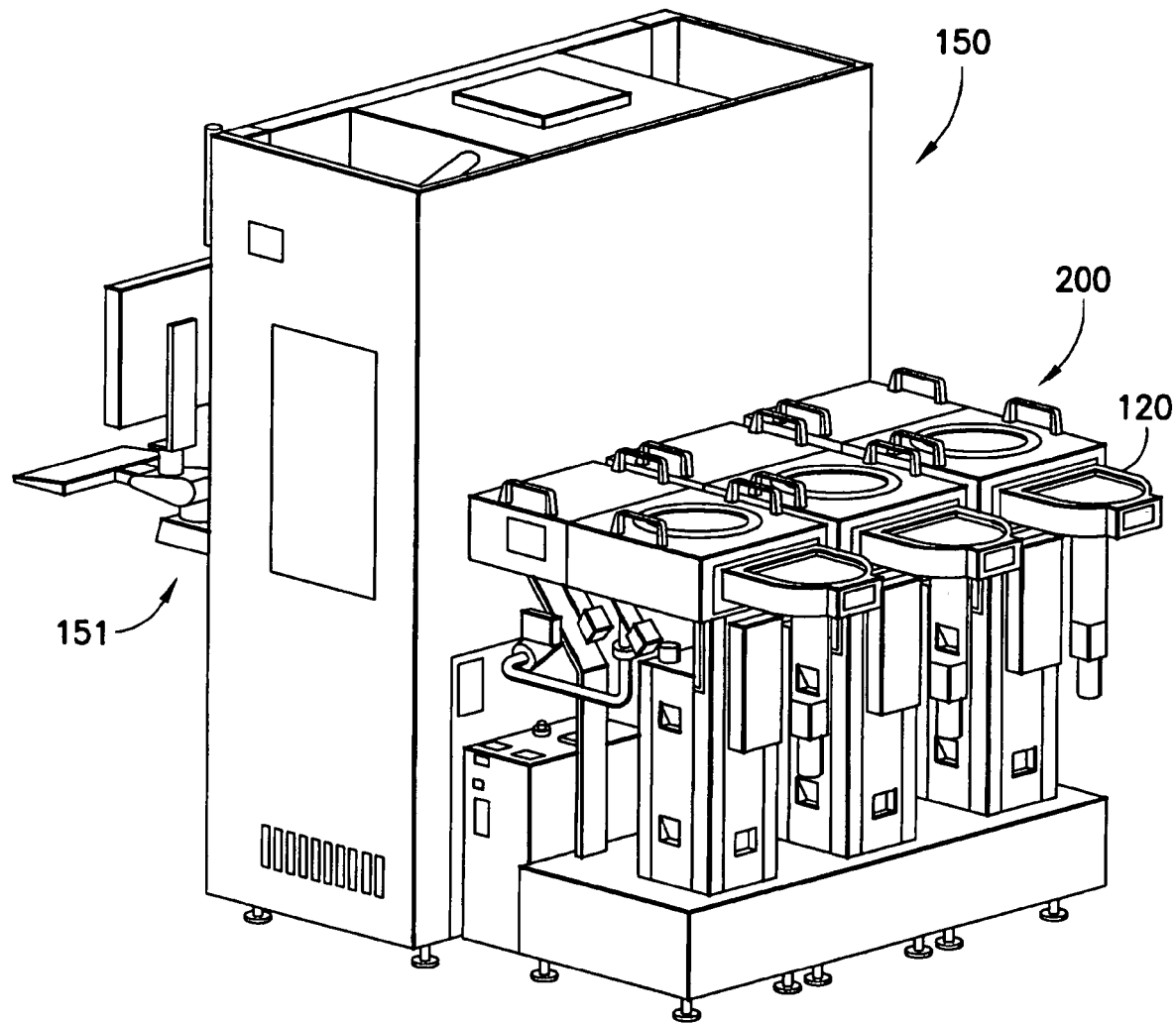

FIGS. 2A and 2B show another exemplary substrate transport system in accordance with an exemplary embodiment. The transport system of FIGS. 2A and 2B may be substantially similar to the transport system described above with respect to FIGS. 1A-C with like reference numerals assigned to like features. However, in this example, the transport chamber and load lock are integrated into a single module 200 which will be described in greater detail below. As can be seen in FIG. 2B the module 200 may allow for processing modules 120 to be aligned sequentially in a manner substantially similar to that described above with respect to FIG. 1B.

Figure 3A:
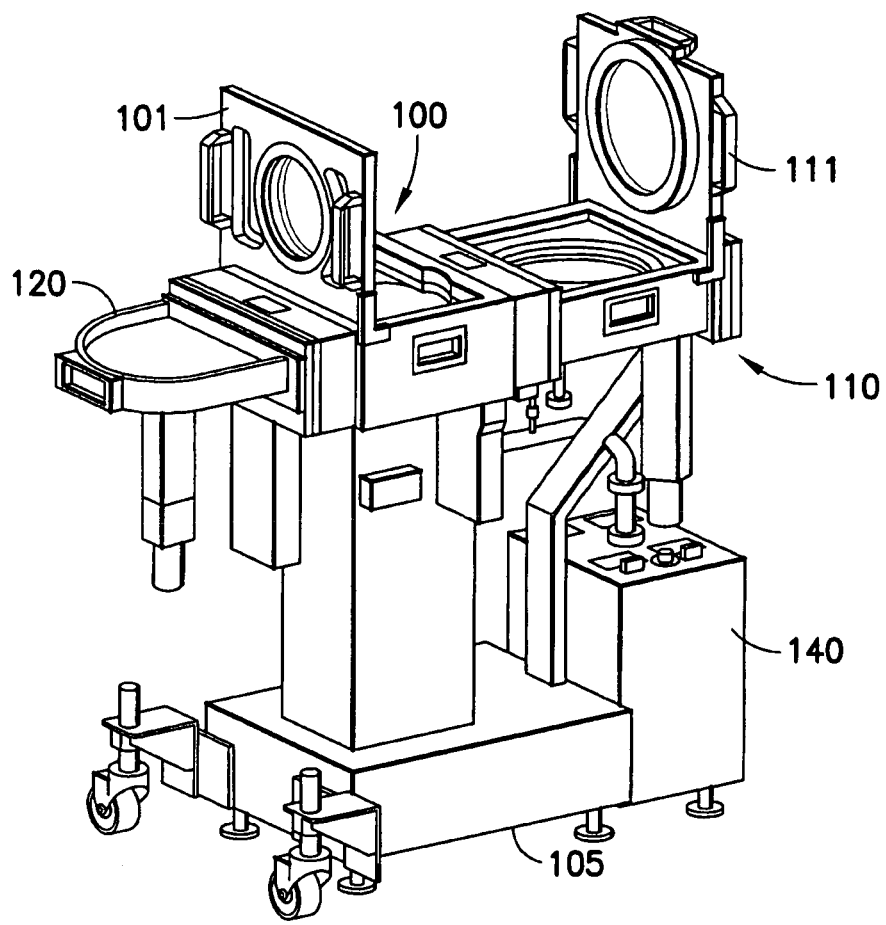
FIGS. 3A-3D, 4A, 4B, 5A and 5B illustrate a portions of exemplary substrate processing systems in accordance with an exemplary embodiment.
Figure 3B:
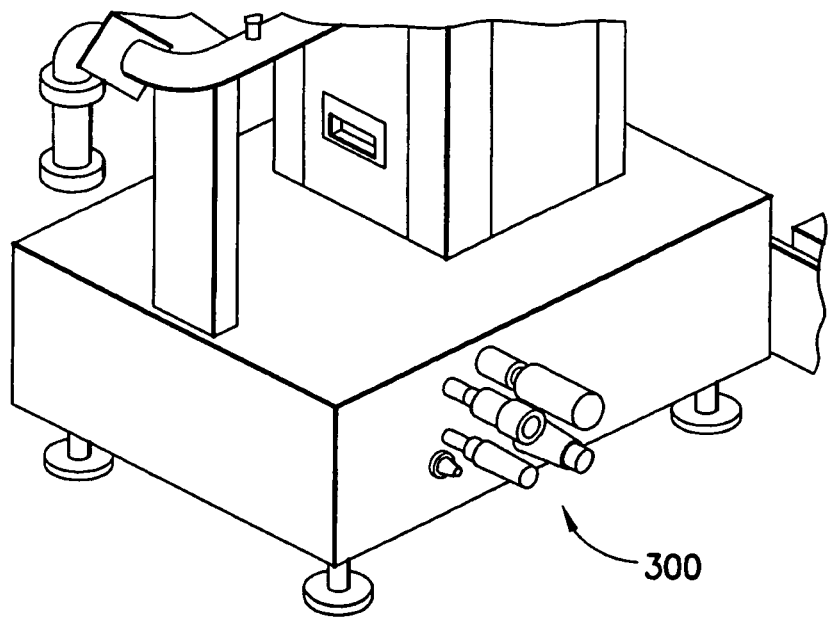
Figure 3C:
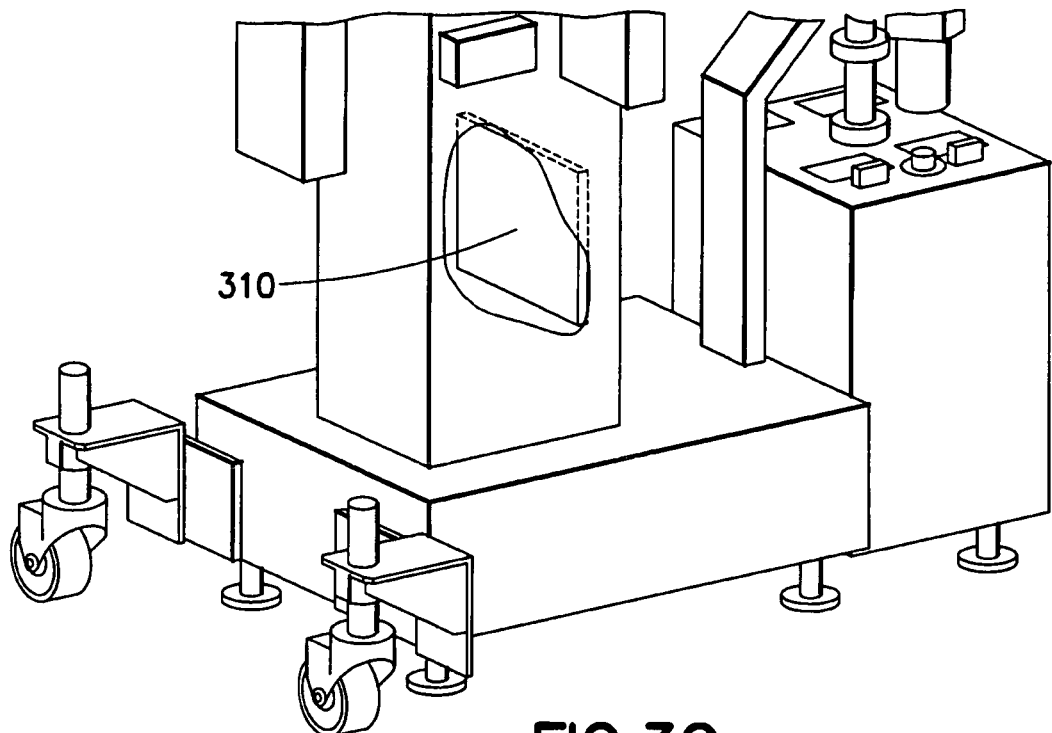

FIGS. 3A-C illustrate the load lock 110, transfer chamber 100 and processing module 120 in greater detail. i In FIG. 3A the load lock 110 is shown as having a lid 111 (that provides access to the interior of the load lock 110) only for example, and in alternate embodiments the transport chamber/load lock may not have a lid. Suitable seals may be provided around the lid 111 to prevent leakage when the lid is closed. In alternate embodiments the interior of the load lock may be accessible in any suitable manner. The transport chamber 100 may also have a lid 101 that is substantially similar to the lid 111. The transport system may also include a controller 310 that is connected to the processing module 120, transfer chamber 100 and/or load lock 110. The controller 310 may include any suitable programs or algorithms for controlling the operation of at least the processing module 120, transfer chamber 100, load lock 110, corresponding valves and vacuum pumps (and/or any other suitable features of the substrate processing system of which processing module 120, transfer chamber 100, load lock 110 form a part of). The controller 310 may be connected to and receive instructions from a central control module (not shown) that may be part of a clustered architecture. A suitable example of a control system having a clustered architecture can be found in U.S. patent application Ser. No. 11/178,615 filed on Jul. 11, 2005, the disclosure of which is incorporated by reference herein in its entirety. The controller 310 may be connected to the central controller through connections 300. The connections 300 may include electrical connections, vacuum line connections, gas line connections or any other suitable connections for the operation of the transport system. In alternate embodiments the controller 310 may be part of the central control module. The central control module may control the operation of the entire processing system, such as for example, the processing systems shown in FIGS. 1A-C and 2A-B. It should be realized that the transport module 200 may also include a controller substantially similar to controller 310 and electrical, vacuum, gas and/or air connections such as for example connections 300.

Referring now to FIGS. 4A-B and 5A-B, the load lock 110 described above provides a substantially linear path (e.g. the valves 460 and 130 are about one-hundred and eighty degrees apart) such that the transfer system is arranged in a substantially straight line. In other exemplary embodiments, the load locks 110', 110" may be configured such that the slit valves 460, 130 are ninety degrees apart. As can be seen in FIGS. 4A-B and 5A-B, the slit valve 460 can be located on either side of the load lock 110', 110". In alternate embodiments the slit valves in the transport chamber that allow the passage of substrates between, for example, the processing module and EFEM may have any suitable relationship with each other such as for example any suitable angle between zero and one-hundred-eighty degrees. The processing tool may thus be configured in any desired arrangement (e.g. load lock/transfer chamber and process module along side the EFEM).

Figure 6:
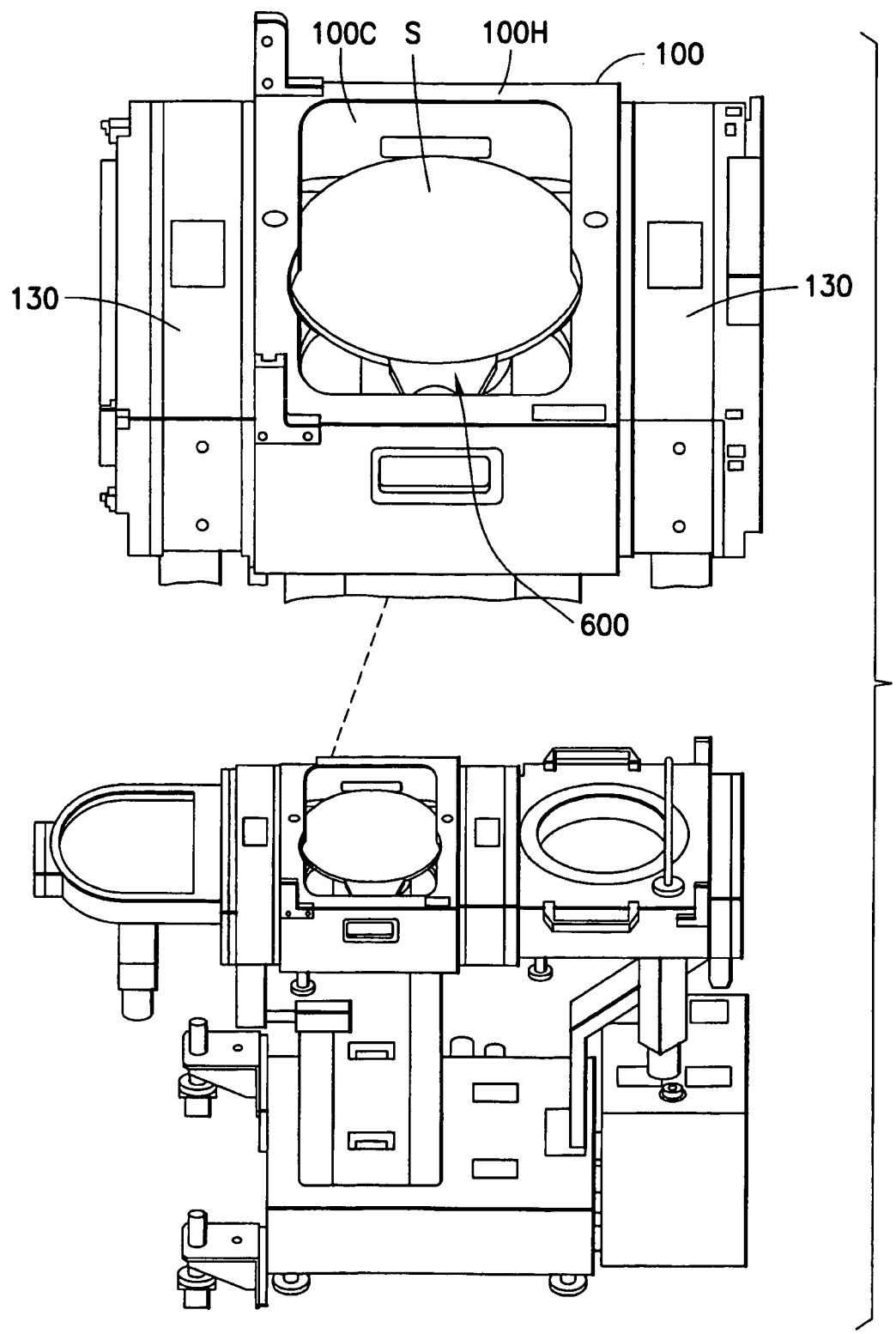
FIGS. 6 and 7 illustrate exemplary transfer chambers in accordance with exemplary embodiments.

Referring now to FIG. 6, the transport chamber 100 of FIG. 1A is shown in greater detail. In this example the lid 101 on the transport chamber 100 is removed for clarity. As can be seen in FIG. 6, the transport chamber 100 may have any suitably shaped housing 100H. In this example the housing is rectangular but in alternate embodiments the housing may have any other suitable shape. The housing 100H may be configured to couple with adapters 130 in any suitable manner and to provide a suitable seal between the adapters 130 and the housing 100H to prevent leakage of the atmosphere within the transport chamber 100. The transport chamber 100 includes any suitable transfer device or robot 600 for transporting substrates S through the transfer chamber 100. An exemplary transfer robot 600 will be described in greater detail below. The interior walls (e.g. top, bottom and sides) of the transfer chamber 100 may be contoured to follow a path of the substrate as it moves within the chamber 100 to reduce the internal volume of the chamber 100 as described in U.S. Pat. No. 6,918,731, previously incorporated by reference. For example, the internal cavity 100C of the transfer chamber 100 may be designed to allow only enough space to permit the free operation of the transport 600. By providing only sufficient operating clearance between the top, bottom and walls of the cavity 100C, the volume of the transfer chamber 100 may be minimized. This enables the cycling time of pumping the transfer chamber 100 to vacuum to be minimized in order to provide a cycle time consistent with the substrate processing time, when for example the transfer chamber 100 is directly coupled to a load port module and processing module as will be described below.

Figure 8:
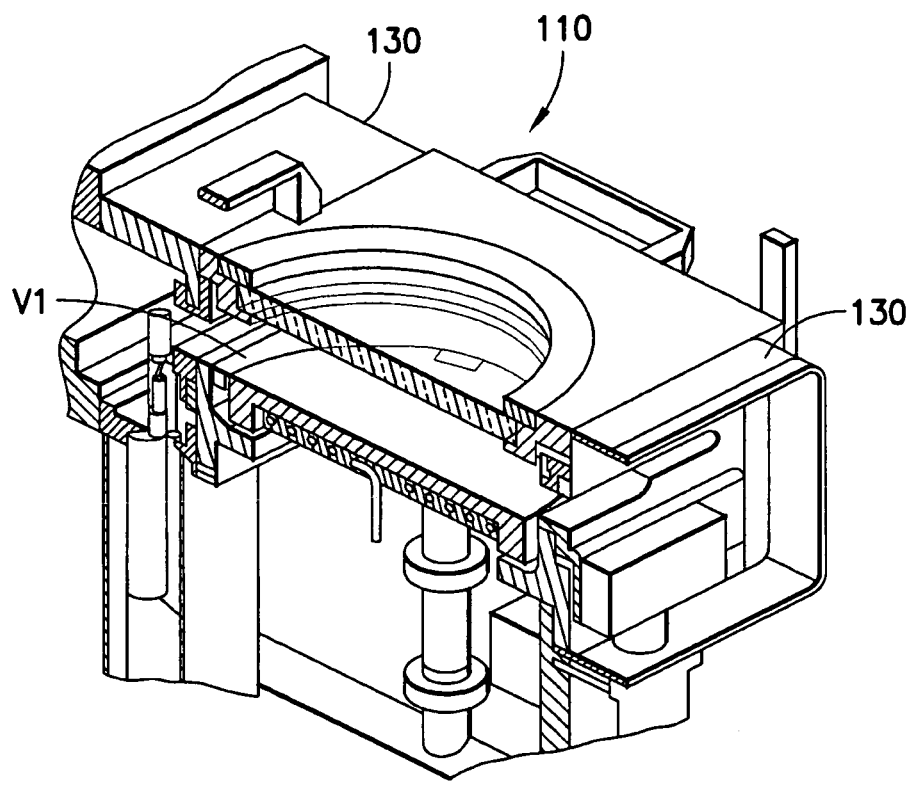
FIGS. 8 and 9 illustrate sectional views of the exemplary transfer chambers of FIGS. 6 and 7.

Referring now to FIG. 8, a cross sectional view of the load lock 110 of FIG. 1A is shown in greater detail. The interior walls (e.g. top, bottom and sides) of the load lock 110 may also be contoured to follow a path of the substrate as it moves within the load lock 110 to reduce the internal volume of the load lock 110 such that the cycle time for vacuum pump down or venting is reduced or minimized. In this exemplary embodiment and for exemplary purposes only, the volume V1 of the load lock 110 may be about seven liters with a gas flow rate through the load lock 110 of about sixty standard liters per minute (slpm). In alternate embodiments the load lock may have a volume greater or less than seven liters and have any suitable gas flow rate. The gas within the load lock 110 may be any suitable gas including, but not limited to, inert gases, controlled air and atmospheric air. The reduced volume and increased flow rate may allow for faster pump/vent cycles and higher substrate throughput. The load lock 110 may be configured to minimize particle contamination due to adiabatic expansion of the gas.

Figure 7:
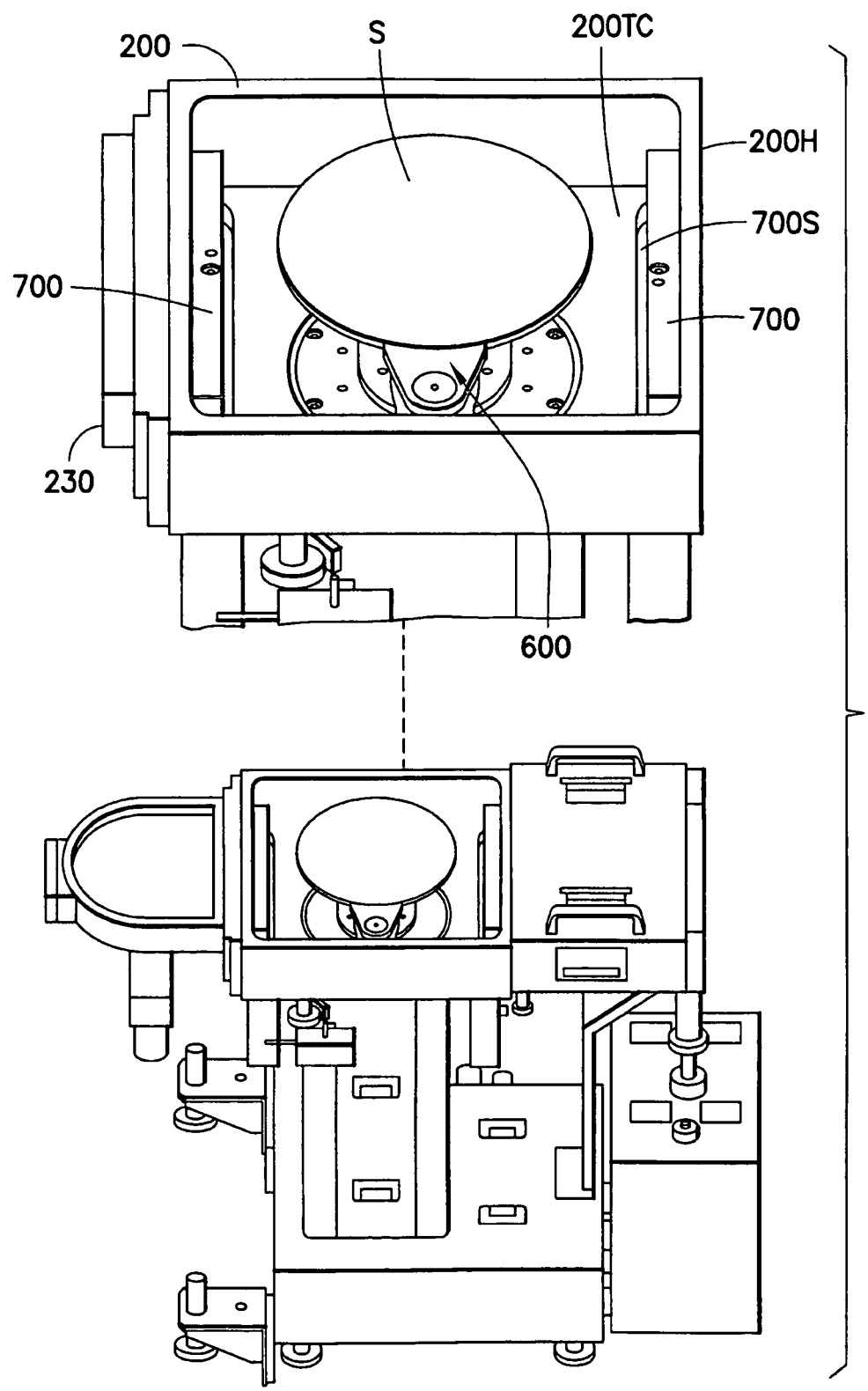

Referring now to FIG. 7, the transfer chamber portion 200TC of the transport unit 200 is shown in greater detail. It is noted that the lid of the transfer chamber 200TC is removed for clarity. As can be seen in FIG. 7, the transfer chamber is enclosed in housing 200H, which in this example is rectangular in shape. In alternate embodiments the housing 200H may have any suitable shape. The interior walls of the transport chamber 200TC are shown in this example as substantially following the outside contour of the housing 200H but in alternate embodiments, the interior walls (top, bottom and sides) may be contoured to follow a path of the substrate as it moves within the chamber 100 to reduce the internal volume of the chamber 100 for vacuum pump down purposes in a manner similar to that described above with respect to FIG. 6. In this exemplary embodiment, the transport chamber 200TC includes openings 700S for suitably coupling slit valves 700 to the housing 200H. The slit valves may serve to isolate the transfer chamber 200TC from the processing module and/or the load lock or buffer portion of the transfer module 200 as will be described below. As may be realized the slit valves 700 may be easily serviced by, for example dropping the valve out of or otherwise decoupling the valve from the opening 700S without having to disassemble or disconnect the transfer chamber 200TC from the other components of the transport system. It should be realized that in other exemplary embodiments, the valve 700 may be inserted through the top of the opening 700S (e.g. inserted through the housing 200H from within the transfer chamber 200TC) rather than from the bottom of the opening 700S. In alternate embodiments, the transfer chamber 200TC may be configured to allow the insertion/removal of the valve 700 through any suitable side of the transfer chamber housing 200H. The transport chamber 200TC may also include a compact connector 230 for coupling a processing module to the transfer chamber 200TC. The connector 230 may be any suitably configured connector having suitable seals to prevent leakage of the internal atmosphere of the process module and/or the transfer chamber 200TC. It is noted that in this exemplary embodiment, the slit valves 700 are located along an interior wall of the transfer chamber 200TC, but in alternate embodiments the slit valves 700 may be located in, for example, connectors such as connector 230 in a manner substantially similar to that described above. For example the connector may have an opening substantially similar to opening 700S through which the slit valve can be installed or removed. As can be seen in FIG. 7, the transfer chamber 200TC also includes a suitable transfer device or robot 600 for transporting substrates S through the transfer chamber 100 as will be described below.

Figure 9:
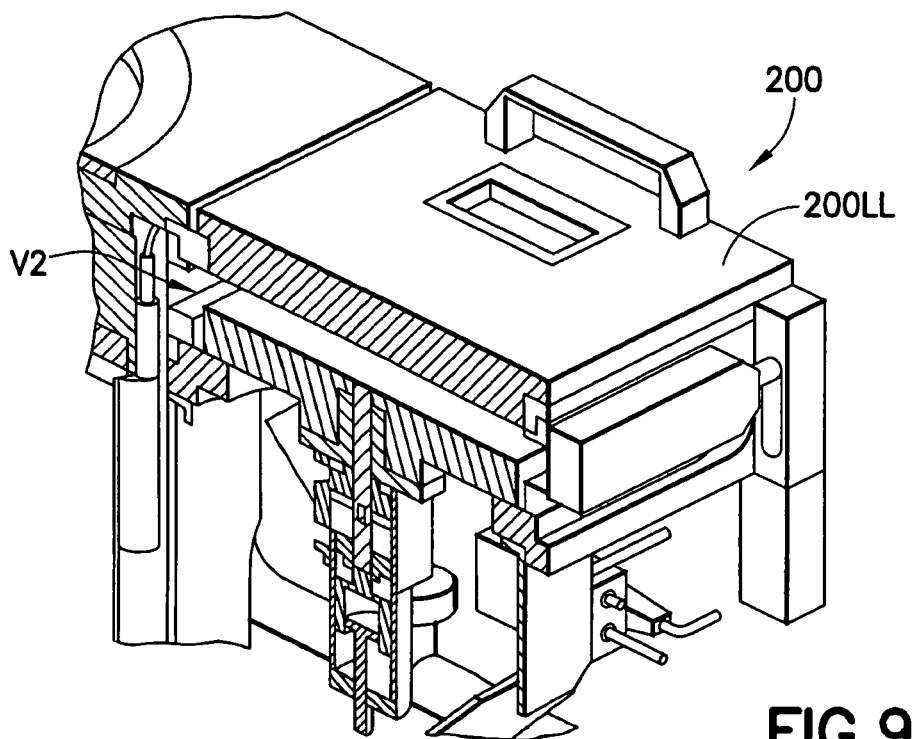
Figure 9A:
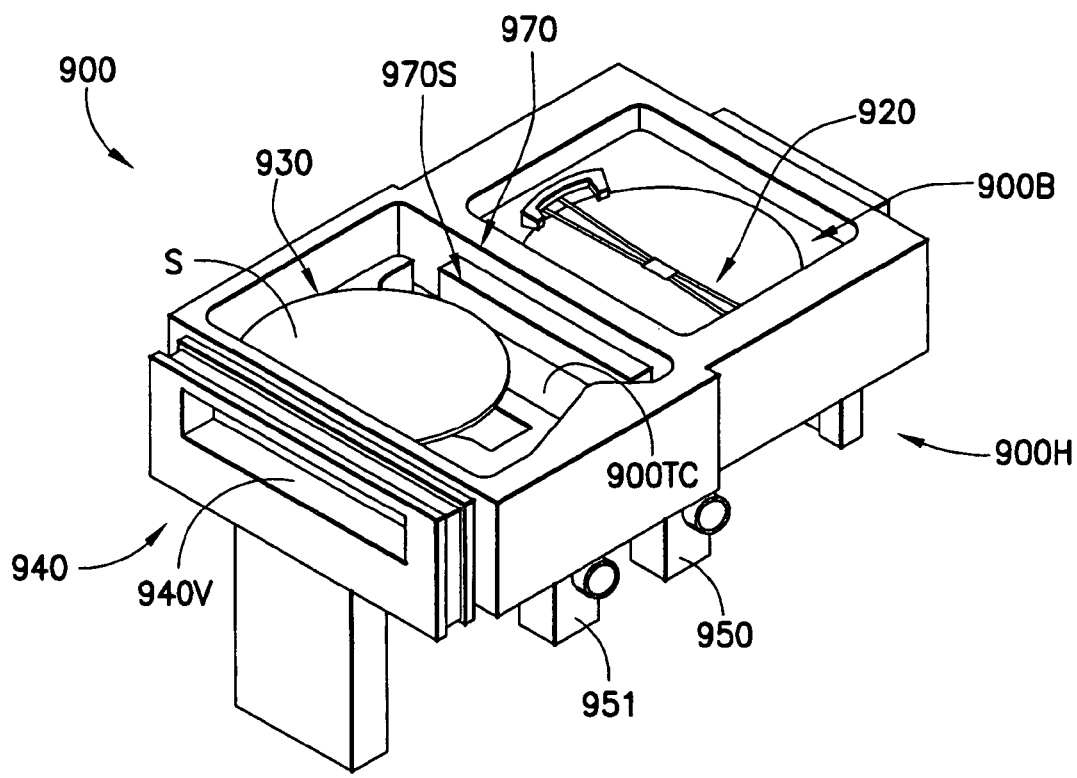
FIGS. 9A-D illustrate an exemplary transfer chamber module in accordance with an exemplary embodiment.
Figure 9B:
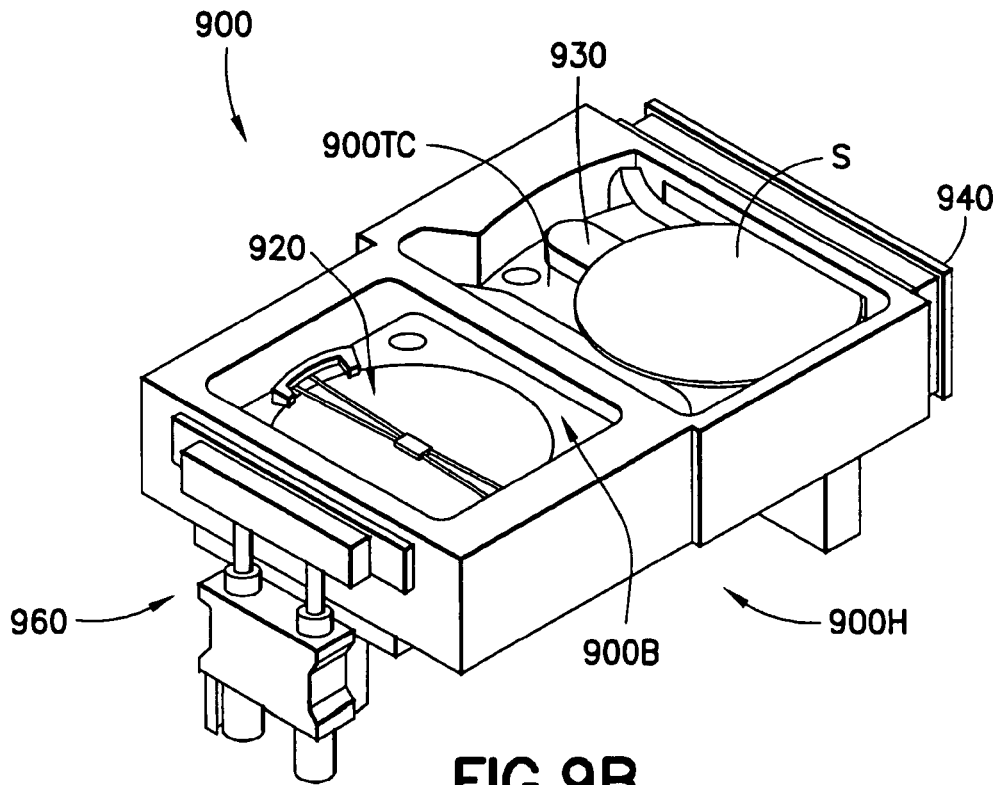
Figure 9C:
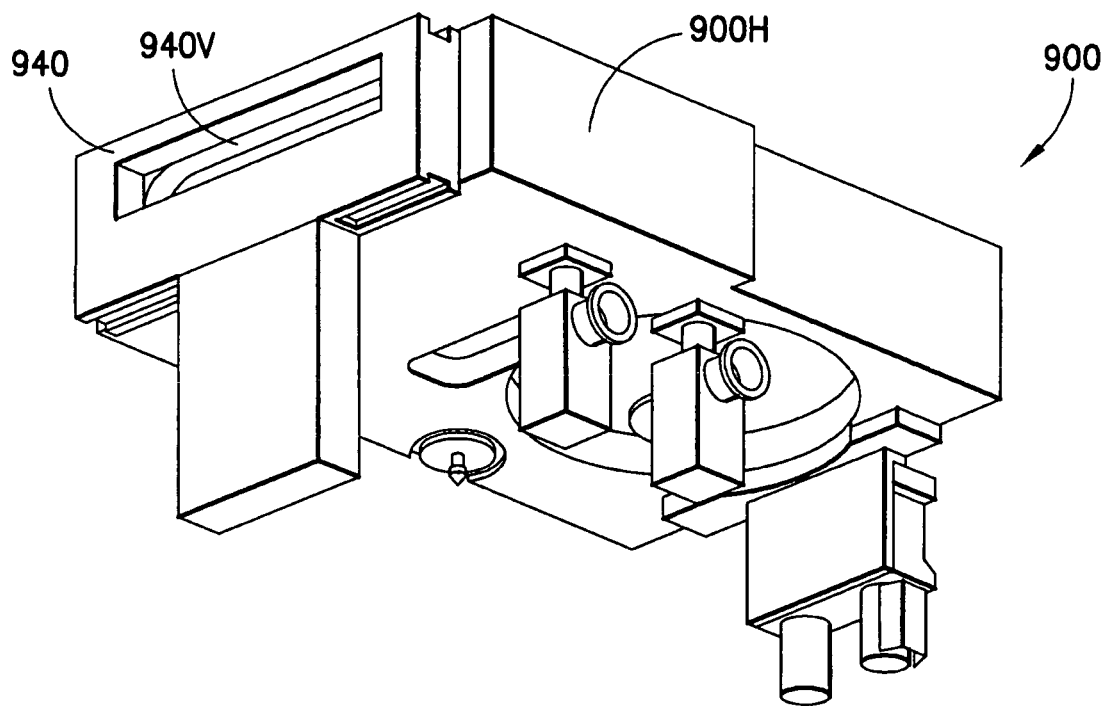
Figure 9D:
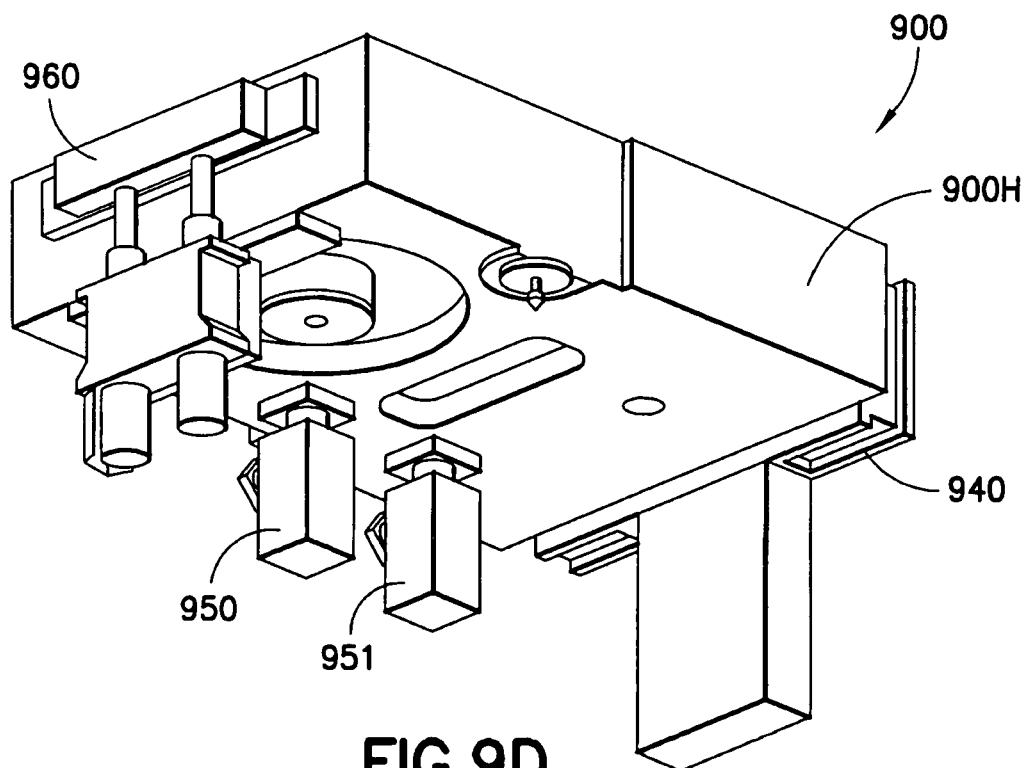
Figure 10A:
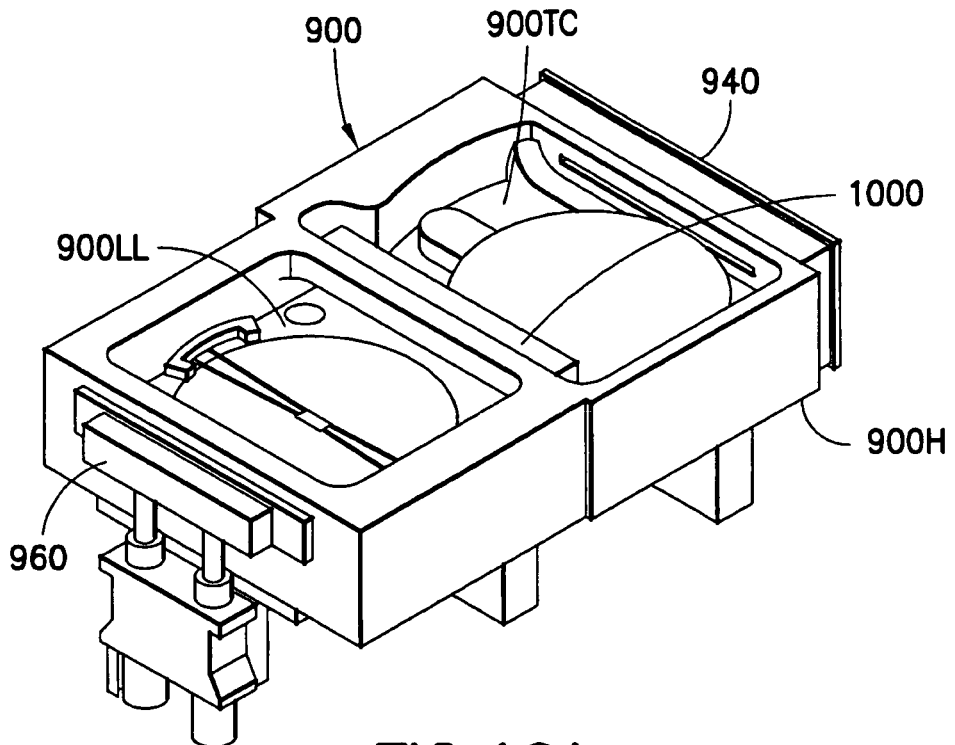
FIGS. 10A-D illustrate an exemplary transfer chamber module in accordance with an exemplary embodiment.
Figure 10B:
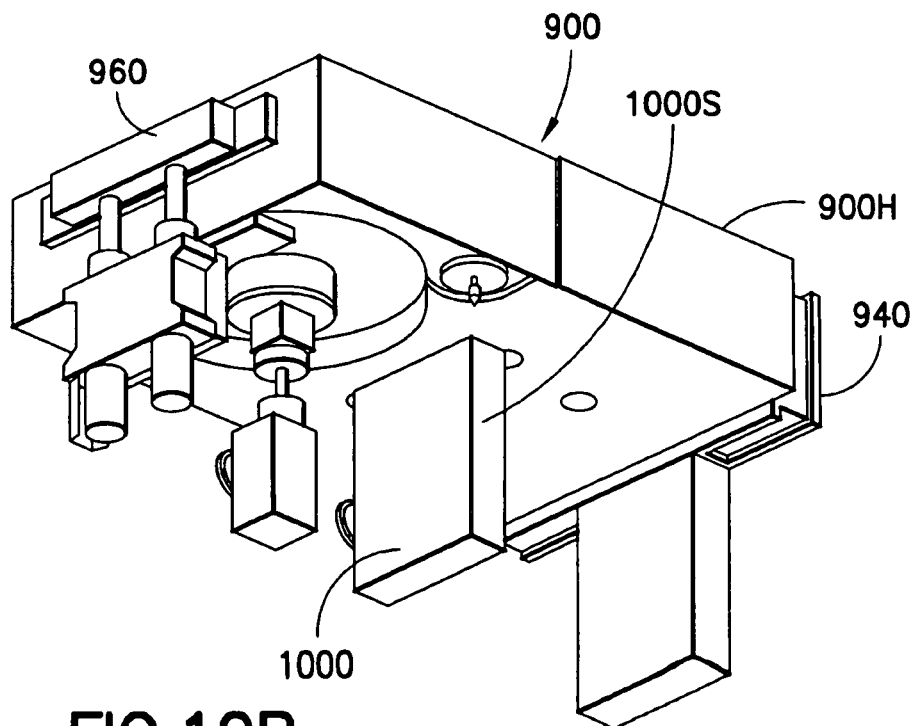
Figure 10C:
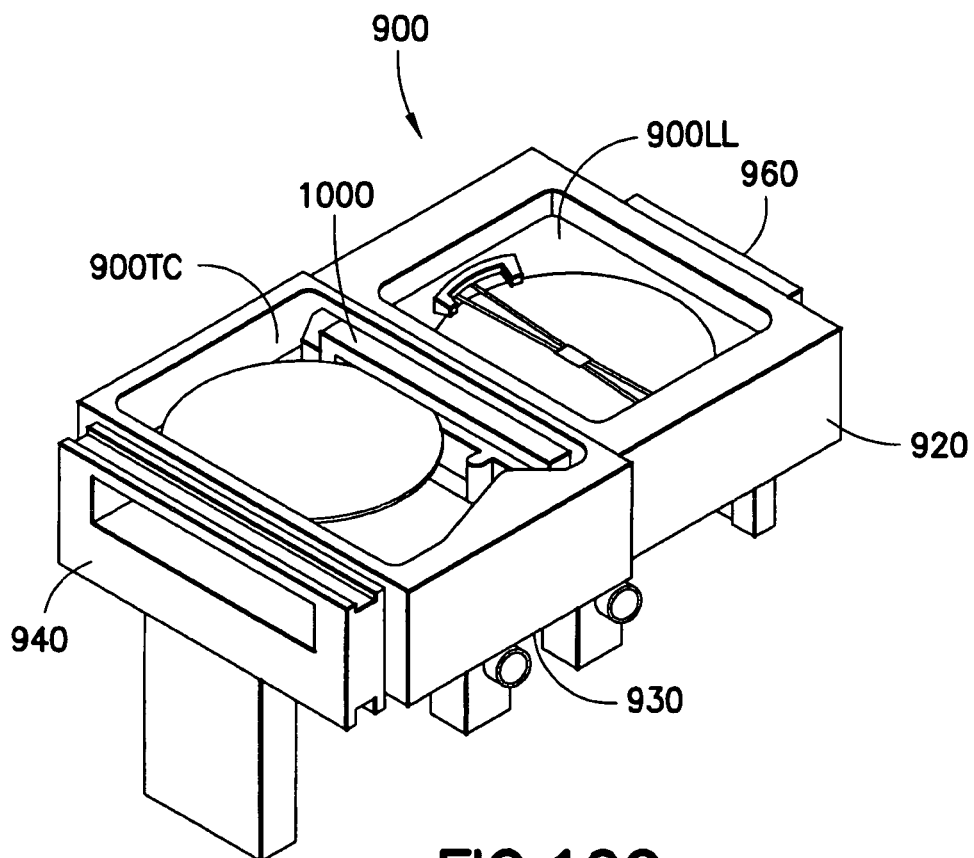
Figure 10D:
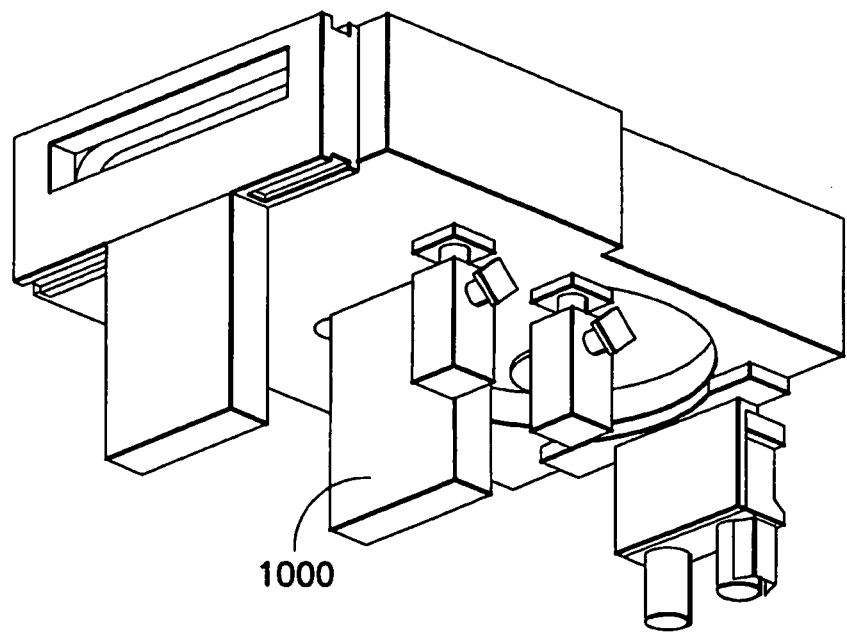

Referring now to FIG. 9, a cross sectional view of the load lock portion 200LL of the transfer module 200 of FIG. 2A is shown in greater detail. The interior walls (e.g. top, bottom and sides) of the load lock 200LL may also be contoured to follow a path of the substrate as it moves within the load lock portion 200LL to reduce the internal volume of the load lock portion 200LL so that the cycle time for vacuum pump down or venting is reduced or minimized. In this exemplary embodiment and for exemplary purposes only, the volume V2 of the load lock portion 200LL may be about three liters with a gas flow rate through the load lock portion 200LL of about ninety standard liters per minute (slpm). In alternate embodiments the load lock may have a volume greater or less than three liters and have any suitable gas flow rate. The gas within the load lock portion 200LL may be any suitable gas including, but not limited to, inert gases, controlled air and atmospheric air. The reduced volume and increased flow rate may allow for faster pump/vent cycles and higher substrate throughput. The load lock portion 200LL may also be configured to minimize particle contamination due to adiabatic expansion of the gas in the load lock portion 200LL.

Referring now to FIGS. 9A-9D another exemplary embodiment of a transfer module 900 is shown. In this exemplary embodiment the transfer module 900 includes a buffer portion 900B and a transfer chamber portion 900TC formed in, for example, one housing 900H. In this example the housing 900H may be of unitary or one piece construction. In alternate embodiments the housing 900H may be an assembly. The buffer portion 900B and a transfer chamber portion 900TC may be separated by a wall 970. The wall 970 may include an opening or slit 970S to allow the passage of substrates between the buffer portion 900B and the transfer chamber 900TC. It is noted that the combination of the buffer portion 900B and the transfer chamber portion 900TC may act as a load lock between the EFEM and the processing module. In this example, the buffer portion 900B and transfer chamber 900TC may not be isolatable from each other, but in other exemplary embodiments a slit valve may be removably located between the buffer portion 900B and the transfer chamber portion 900TC for isolating the portions from each other and for converting the buffer portion 900B into, for example, a load lock as will be described below. The buffer portion 900B may include a substrate buffer 920 for buffering at least one substrate. The buffer 920 may also have alignment capabilities for aligning, for example, a fiducial of the substrate for processing purposes. In other embodiments the buffer may provide cooling for hot substrates or any other process for aiding in the processing of the substrate. In still other embodiments the buffer may be configured to perform any suitable processing operations on a substrate(s).

The transfer chamber 900TC may include a transfer robot 930 for transporting substrate S through slit 970S from the buffer 920 and through valve 940V to a processing module and vice versa. The valve 940V may be part of a connector 940 for coupling the transfer module 900 to a processing module. In other exemplary embodiments the valve 940V may be inserted or coupled to the connector 940 through an opening in a manner substantially similar to that described above with respect to FIG. 7. In other exemplary embodiments the valve 940V may be inserted through an opening in, for example, the bottom of the transfer chamber 900TC against, for example, an interior wall of the transfer chamber 900TC as described above. In alternate embodiments the valve 940V may be located in any suitable portion of the transfer chamber 900TC and/or connector 940. Another valve 960 may be located on the other opposite side of the transfer module 900 allowing the connection of the buffer portion 900B to, for example an EFEM or any other suitable piece of processing equipment. In this exemplary embodiment the valve 960 is shown as an atmospheric valve but in other embodiments the valve 960 may be any suitable valve such as for example, a slit valve. The transfer module 900 may also have connections 950, 951 for connecting, for example vacuum and gas lines to the transfer chamber 900TC and/or buffer 900B.

Referring now to FIGS. 10A-10D another exemplary configuration of the transfer module 900 is shown. In this configuration, the transfer module housing 900H may have an opening 1000S through, for example, the bottom of the housing for suitably coupling a slit valve 1000 to the housing 900H via the opening 1000S as described above with respect to FIG. 7. The slit valve 1000 may serve to isolate the buffer from the transfer chamber 900TC converting the buffer into the load lock 900LL. As noted above, the opening 1000S and the valves 1000 may be configured to be inserted through the housing 900H either from the bottom of the housing or from within the transfer chamber. In alternate embodiments similar valves and openings may also be located within the load lock 900LL portions of the transfer module 900.

Figure 11A:
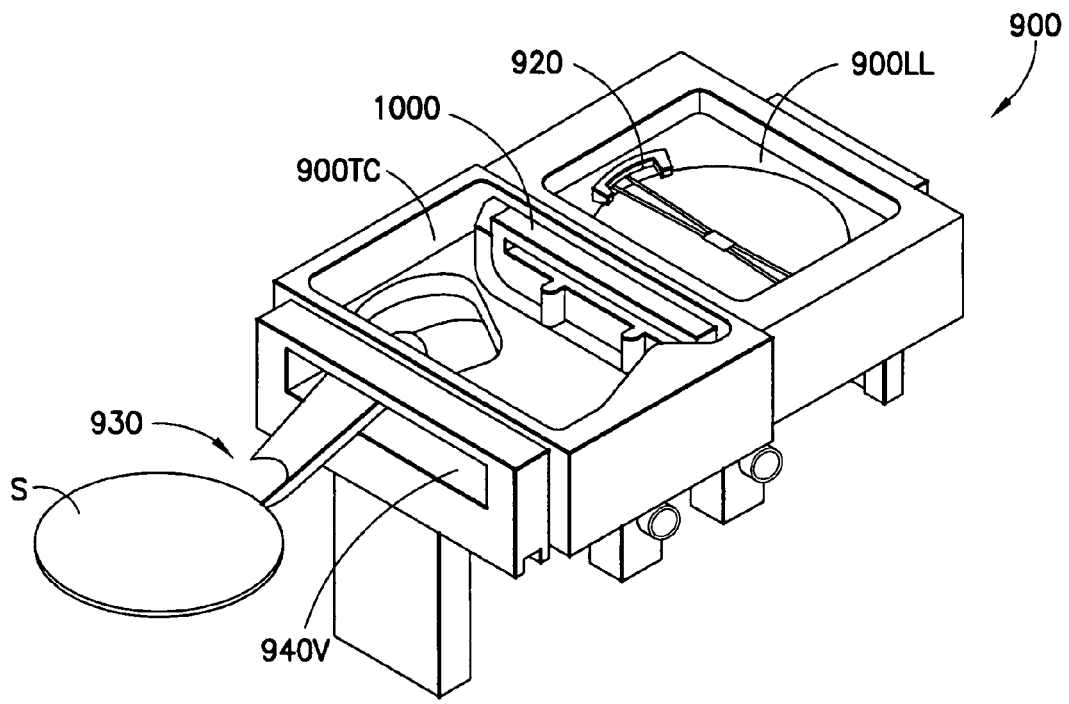
FIGS. 11A and 11B illustrate an exemplary transfer chamber module in accordance with an exemplary embodiment.
Figure 11B:
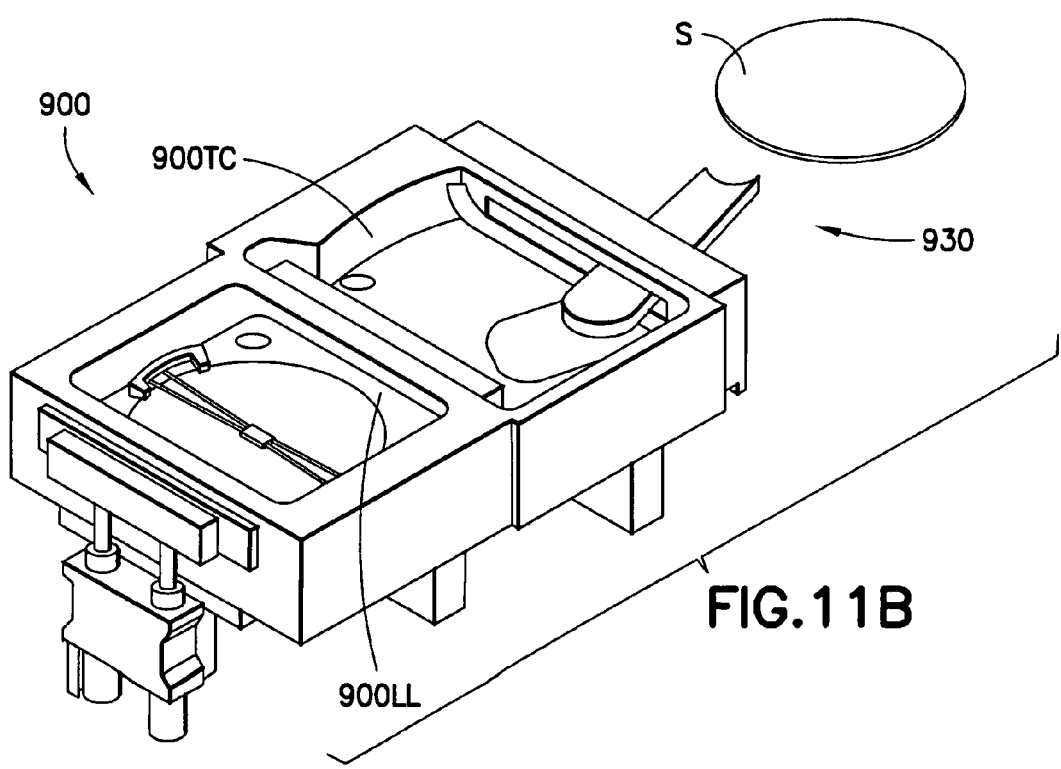
Figure 12A:
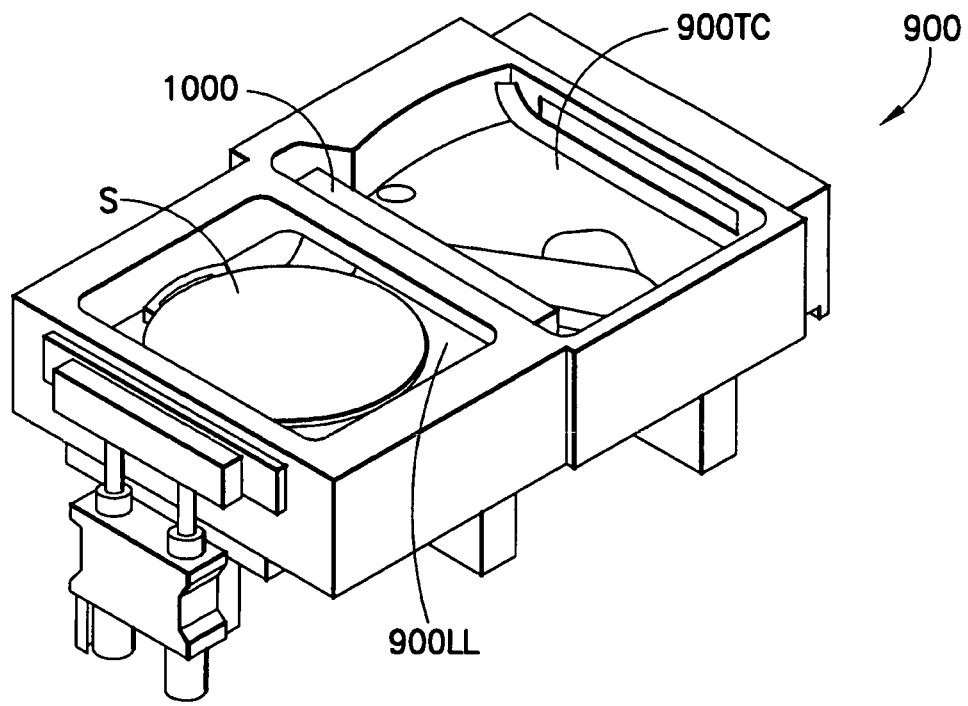
FIGS. 12A and 12B illustrate the exemplary transfer chamber module of FIGS. 11A and 11B with a substrate transport in different positions.
Figure 12B:
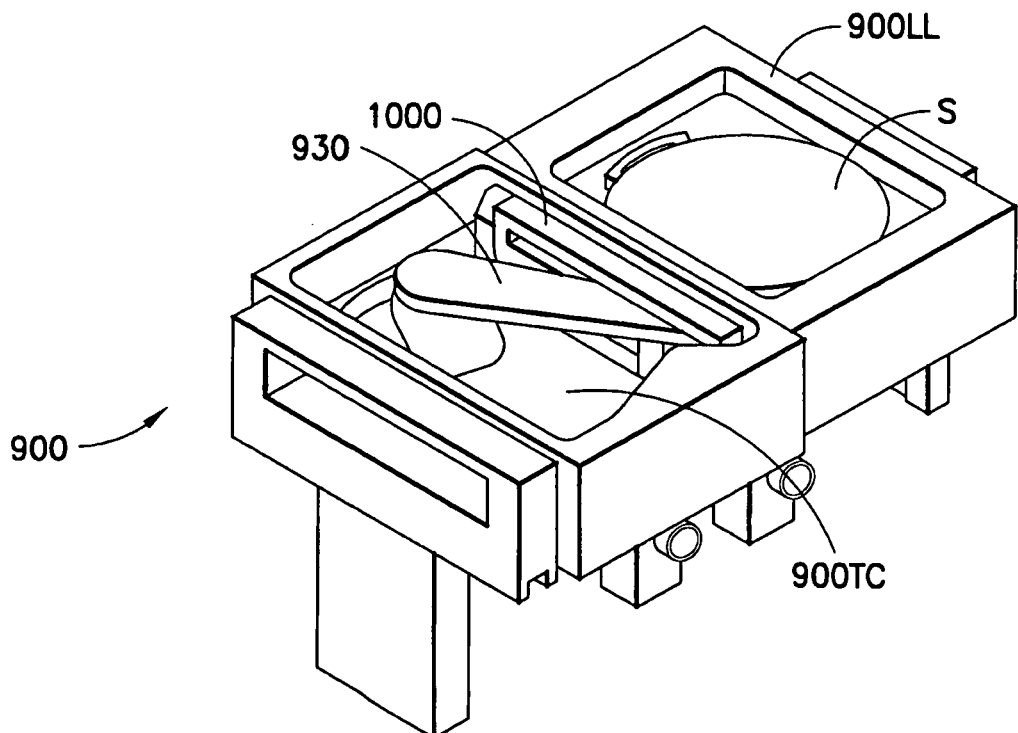

FIGS. 11A-12B illustrate the transfer module 900 with the transfer robot 930 extended in various positions. For example, FIGS. 11A and 11B show the transfer robot 930 extended through the valve 940V while FIGS. 12A and 12B show the transfer robot 930 extending into the load lock 900LL (or buffer portion) of the transfer module 900. The motion of the transfer robot 930 will be described in greater detail below.

Figure 13A:
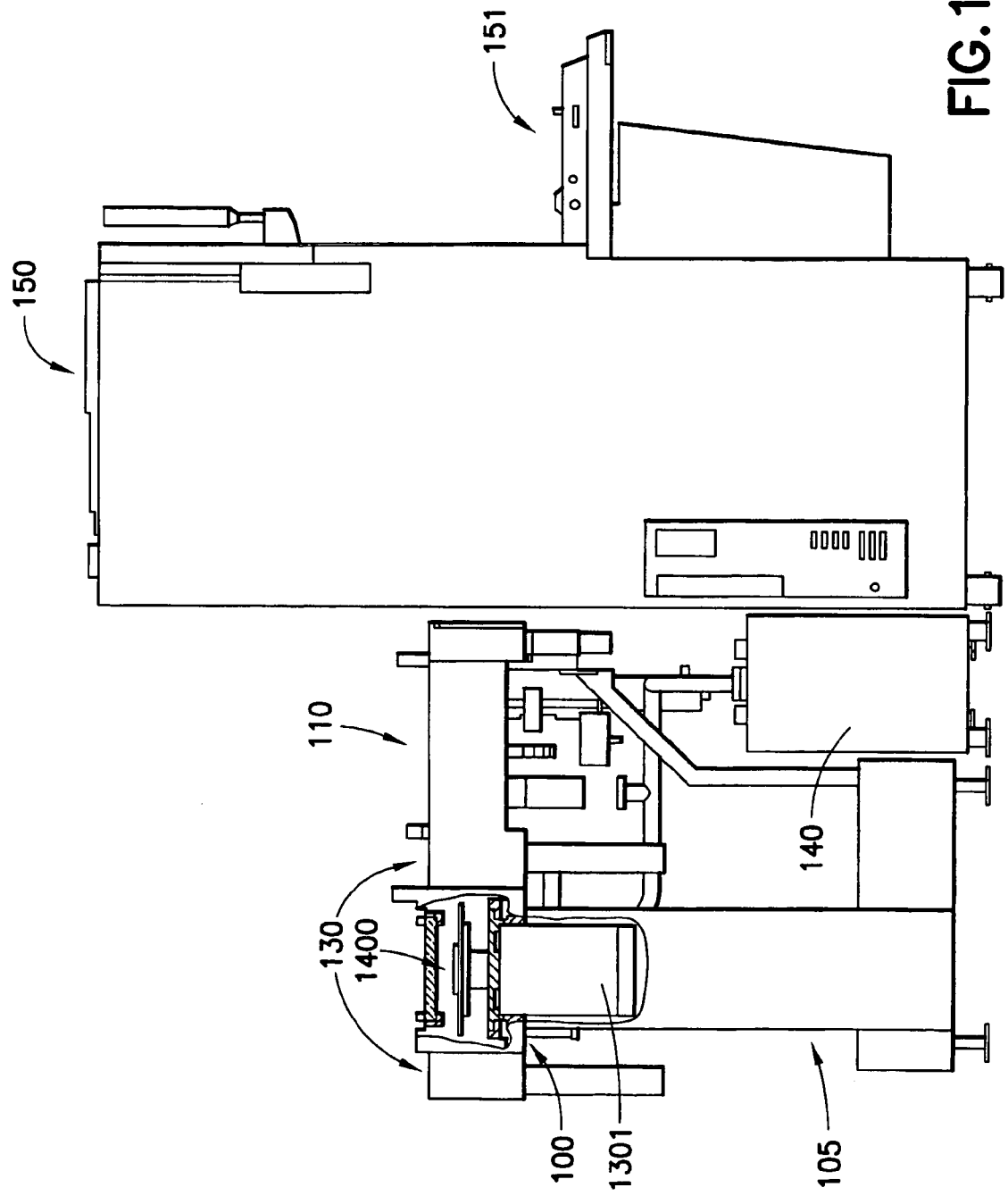
FIG. 13A illustrates a schematic view of a substrate processing system in accordance with an exemplary embodiment.

Referring now to FIGS. 13A-B, 14A-C and 15A-B an exemplary substrate transport 1400 in accordance with an exemplary embodiment will now be described. The exemplary compact, fast swap, bi-directional transport described below may include a two-axis drive having unequal length arms and two differentially coupled end effectors arranged in what may be referred to as a general SCARA arm arrangement. In alternate embodiments the transport 1400 may have any suitable configuration with more or less than two end effectors and/or more or less than two drive axes. As can be seen in FIG. 13A the transport 1400 is shown as being located in, for example, the transport chamber 100 of the processing system. In alternate embodiments the transport 1400 may be located in any suitable portion of the processing system.

Figure 13B:
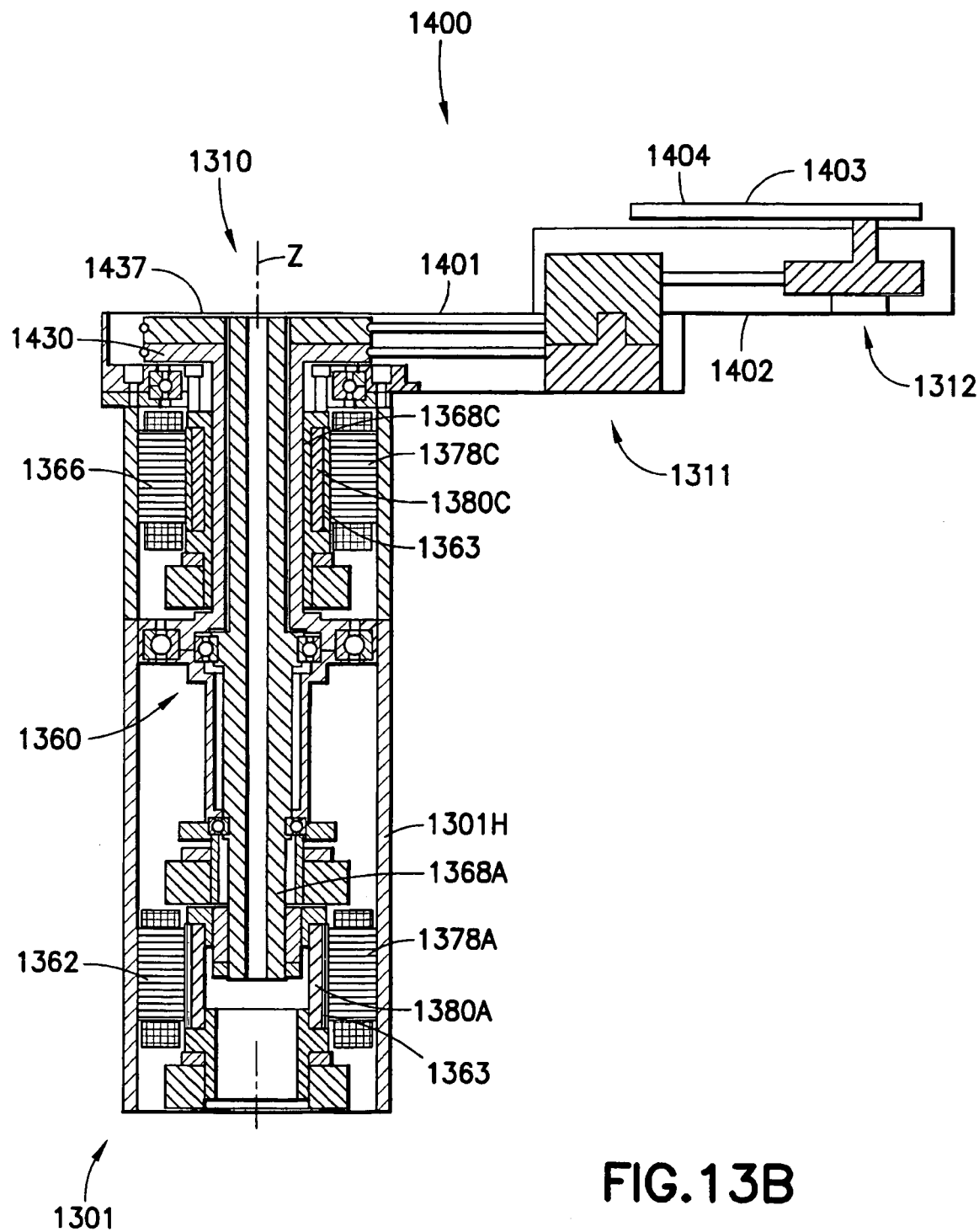
FIG. 13B illustrates an exemplary drive in accordance with an exemplary embodiment.

The transport 1400 may have a two-axis coaxial drive system 1301, as can be seen best in FIG. 13B, substantially similar to that described in, for example, commonly assigned U.S. patent application Ser. No. 11/179,762, entitled "UNEQUAL LENGTH SCARA ARM", filed on Jul. 11, 2005, the disclosure of which is incorporated herein by reference in its entirety. For example, the drive 1301 may include an outer housing 1301H that houses a coaxial shaft assembly 1360 and two motors 1362 and 1366. In alternate embodiments the drive 1301 may have more or less than two motors. The drive shaft assembly 1360 has two drive shafts 1368A and 1368C. In alternate embodiments more or less than two drive shafts may be provided. The first motor 1362 comprises a stator 1378A and a rotor 1380A connected to the inner shaft 1368A. The second motor 1366 comprises a stator 1378C and a rotor 1380C connected to the outer shaft 1368C. The two stators 1378A, 1378C are stationarily attached to the housing 1301H at different vertical heights or locations along the housing. In this embodiment, for illustrative purposes only, the first stator 1378A is the bottom stator, the second stator 1378C is the top stator. Each stator generally comprises an electromagnetic coil. The two shafts 1368A and 1368C are arranged as coaxial shafts. The two rotors 1380A, 1380C are preferably comprised of permanent magnets, but may alternatively comprise a magnetic induction rotor, which does not have permanent magnets. Sleeves 1363 may be located between the rotor 1380 and the stators 1378 to allow the transporter 1400 to be useable in a vacuum environment where the drive shaft assembly 1360 is located in a vacuum environment and the stators 1378 are located outside of the vacuum environment. However, the sleeves 1363 need not be provided if the transporter 1400 is only intended for use in an atmospheric environment. In other exemplary embodiments the robot may be configured to isolate the interior of the arm, the rotors and the stators from the vacuum environment. In alternate embodiments there may be suitable seals for isolating the rotors and the stators from the vacuum environment so that the volume of the load lock is not increased by the drive of the transfer robot.

Figure 3D:
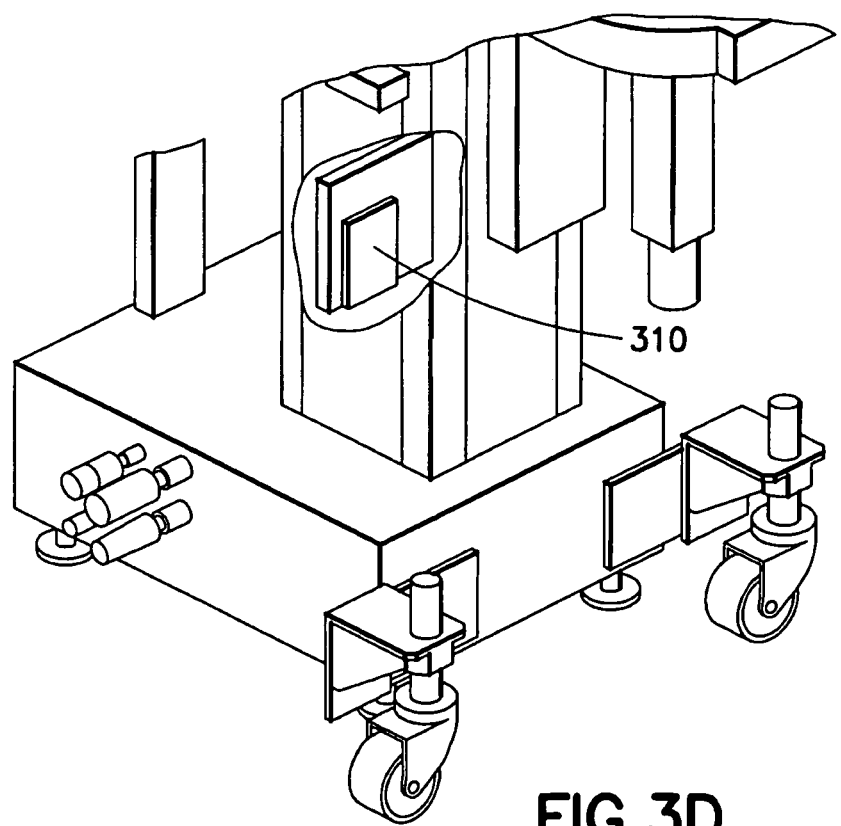
Figure 4A:
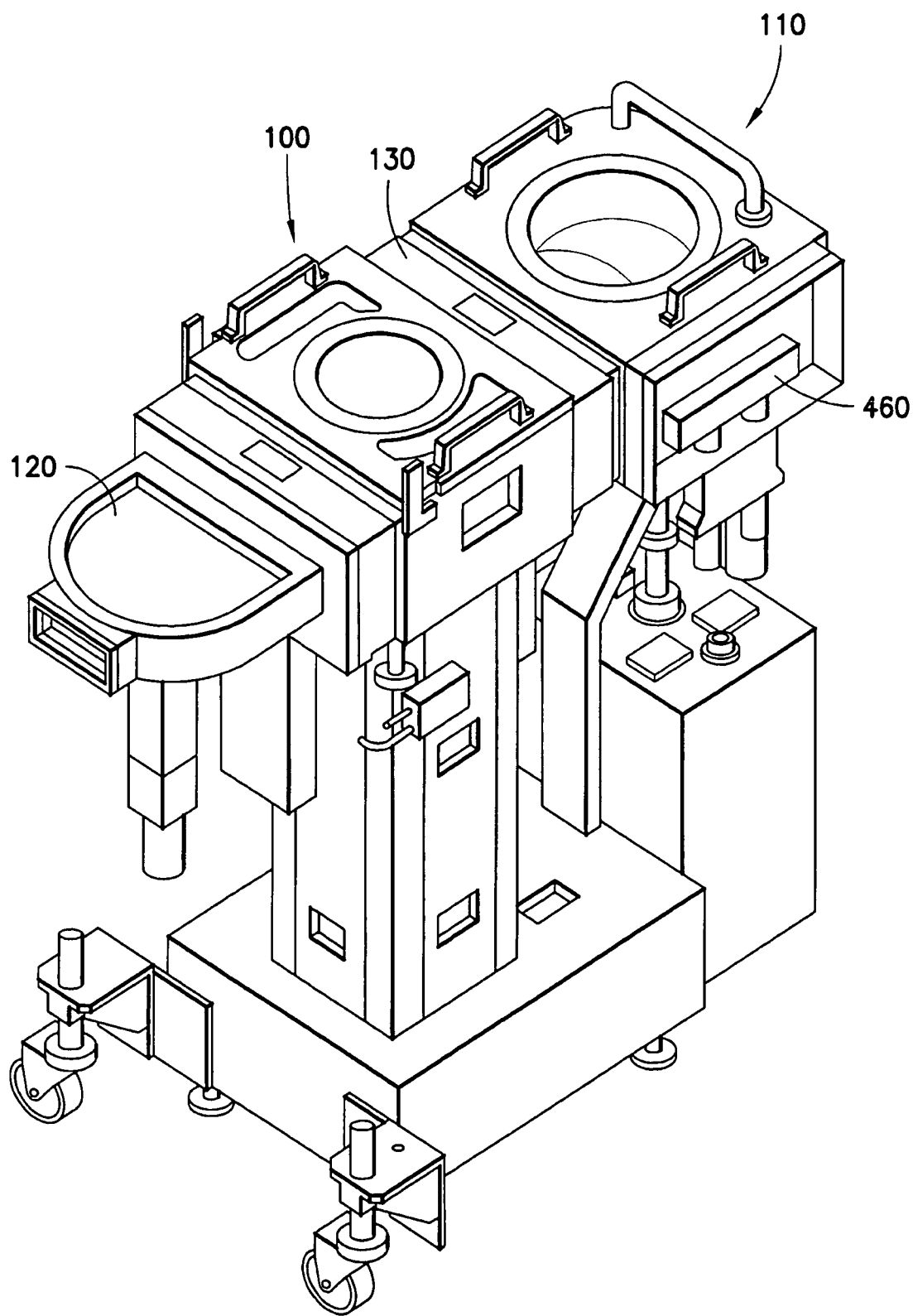
Figure 4B:
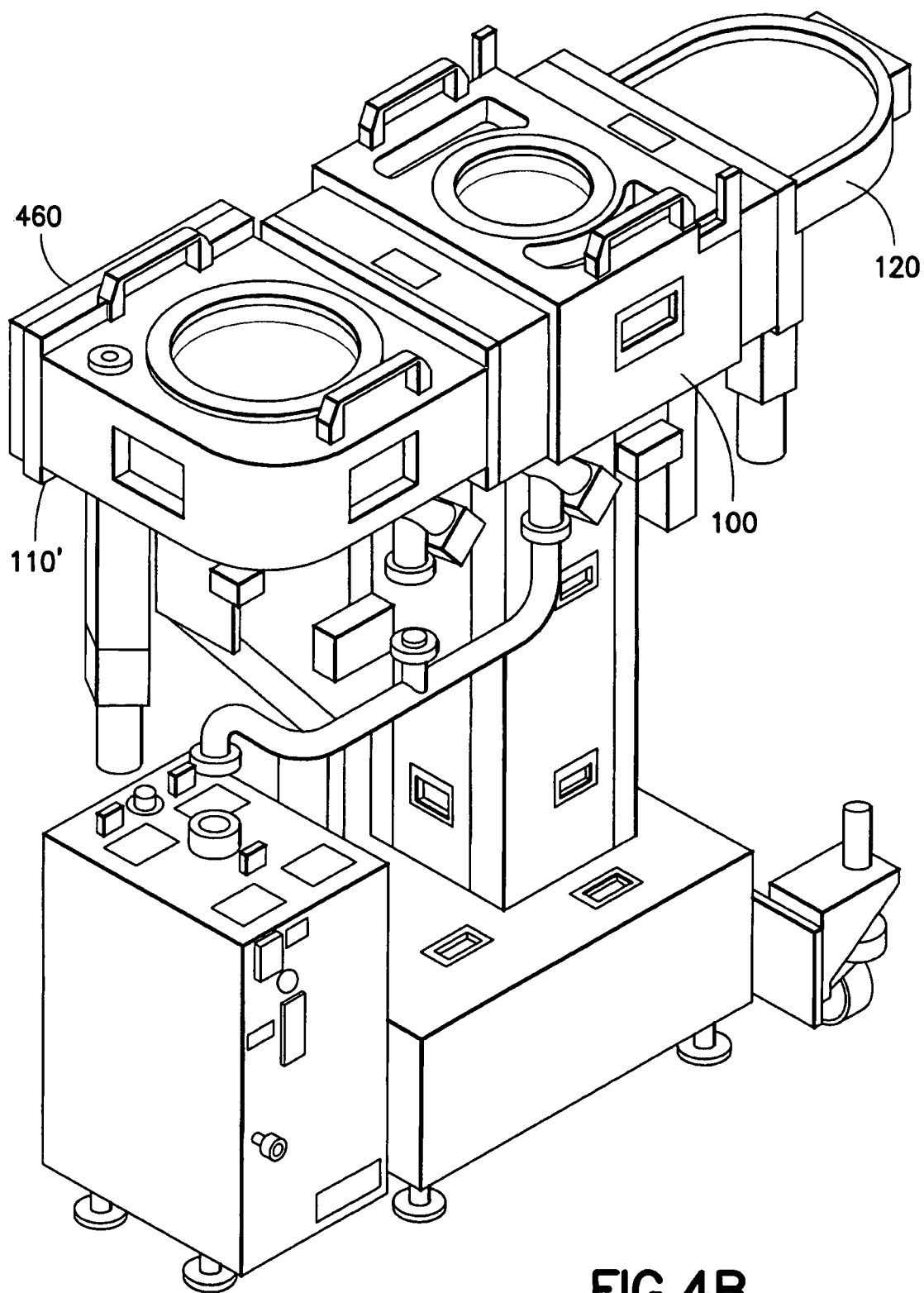
Figure 5A:
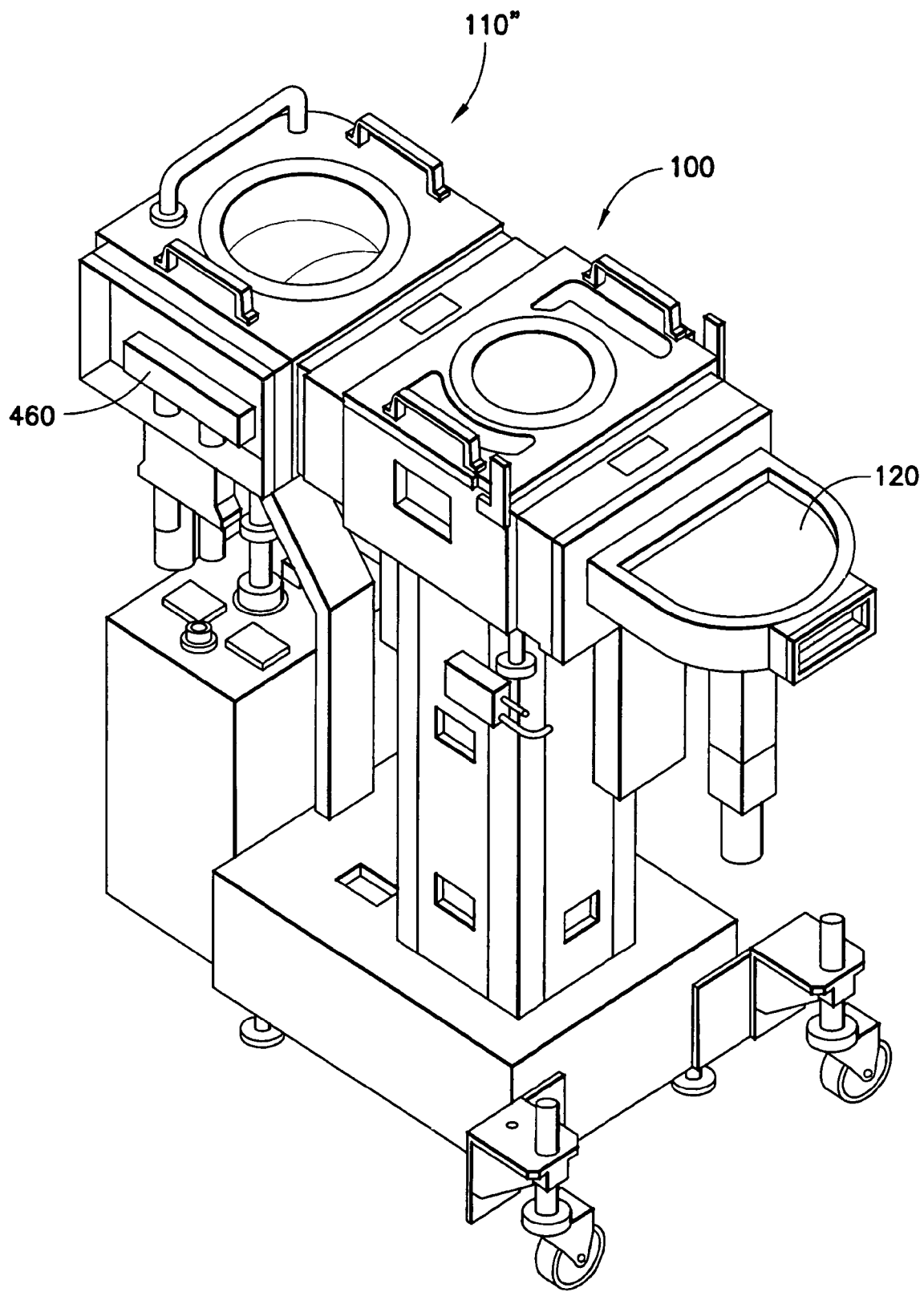
Figure 5B:
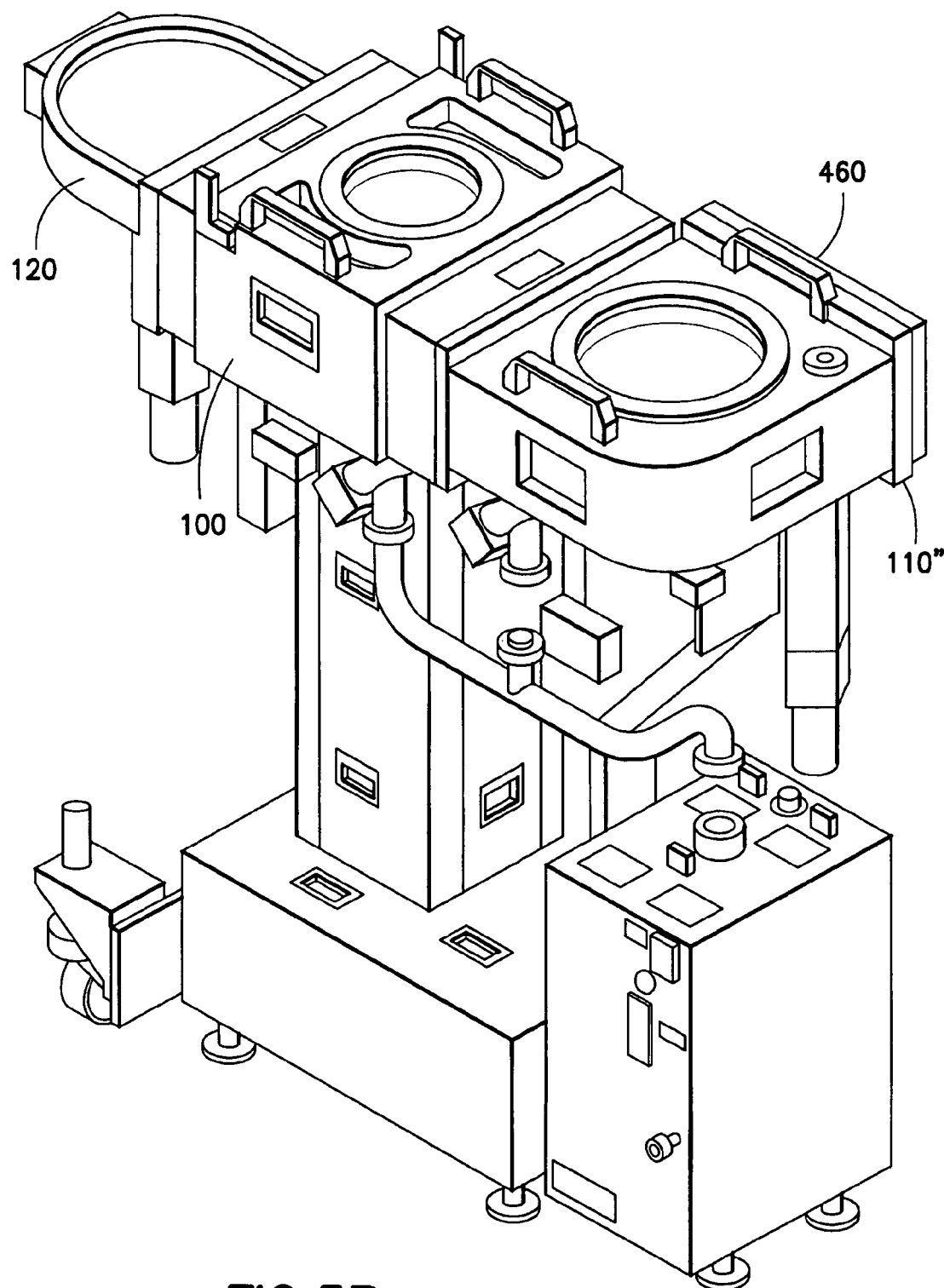

The first shaft 1368A is the inner shaft and extends from the bottom stator 1378A. The inner shaft has the first rotor 1380A aligned with the bottom stator 1378A. The outer shaft 1368C extends upward from the top stator 1378C. The outer shaft has the second rotor 1380C aligned with the upper stator 1378C. Various bearings are provided about the shafts 1368 and the housing 1301H to allow each shaft to be independently rotatable relative to each other and the housing 1301H. In alternate embodiments the motors 1362, 1366 may be configured as self bearing motors such that the rotors 1380A, 1380C are supported within the housing substantially without contact such as by forces exerted on the rotors 1380A, 1380C by their respective stators 1378A, 1378C. In other alternate embodiments the motors may be incorporated into walls of the transport chamber 100 as described in, for example, United States Patent Application entitled "Substrate Processing Apparatus with Motors Integral to Chamber Walls", U.S. Ser. No. 60/950,331, filed Jul. 17, 2007 and United States Patent Application entitled "Substrate Transport Apparatus", U.S. Ser. No. 12/117,355, filed May 8, 2008, the disclosures of which are incorporated by reference herein in their entirety. Each shaft 1368A, 1368C may be provided with a suitable position sensor to signal the controller 310 (see FIG. 3D) of the rotational position of the shafts 1368 relative to each other and/or relative to the housing 1301H. Any suitable sensor could be used including, but not limited to, optical and induction sensors.

The outer shaft 1368C is fixedly connected to the upper arm 1401 so that shaft 1368C and upper arm 1401 rotate together as a unit about axis Z. The second shaft 1368C may be coupled to the end effector pulley 1437 for driving the end effectors 1403, 1404 as will be described below.

In alternate embodiments the drives for each drive axis (i.e. upper arm and end effectors) may be located at a respective joint on the arm. For example the drive for rotating the upper arm may be located at the shoulder joint 1310 and the drive for rotating the end effector(s) may be located at the wrist joint 1312. In alternate embodiments the transport may have any suitable drive system (coaxial or non-coaxial) which may have more or less than two drive axes. In other exemplary embodiments the drive system may include a Z-axis drive for vertical movement of the arm assembly.

Figure 14B:
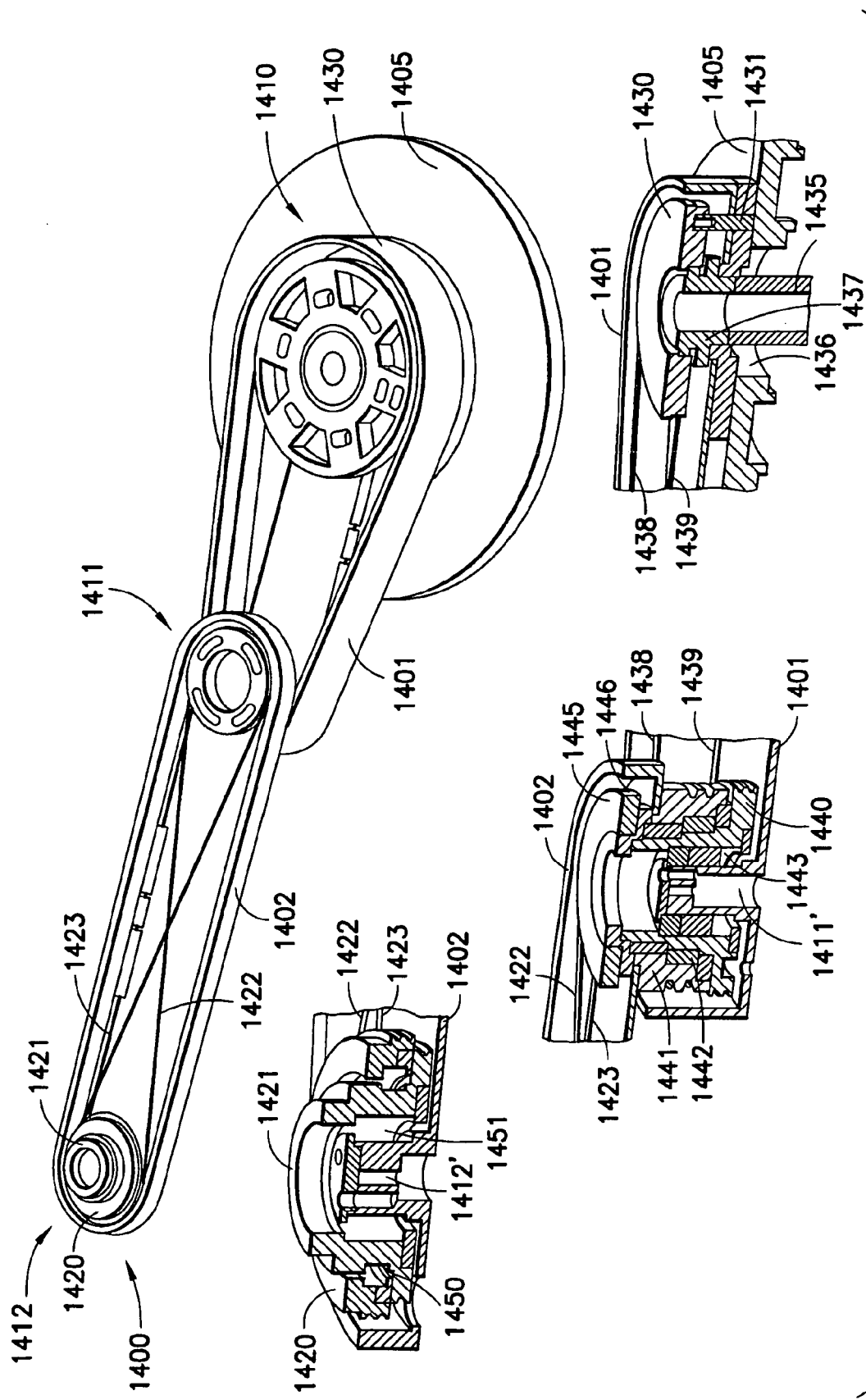

As can best be seen in FIGS. 14A-C, the transport 1400 includes a base 1405, an upper arm 1401, a forearm 1402 and two end effectors 1403, 1404. In this exemplary embodiment, the upper arm 1401 and the forearm 1402 may have unequal lengths as described in U.S. patent application Ser. No. 11/179,762, previously incorporated by reference. For example, the forearm 1402 may be longer than the upper arm 1401 such that the transport containment to extension ratio is maximized. The unequal lengths of the upper arm 1401 and the forearm 1402 may allow the swing diameter of the arm assembly, while in a retracted position, to remain the same as the swing diameter of a conventional arm assembly having an equal length upper arm and forearm. However, the unequal lengths of the upper arm 1401 and forearm 1402 may allow, for example, greater reach or extension than an arm having equal length links with the same swing diameter, thus increasing the reach to containment ratio of the arm 1400. The upper arm 1401 may be rotatably coupled to the base 1405 at a shoulder joint 1410. The forearm 1402 may be rotatably coupled to the upper arm 1401 at an elbow joint 1411. The end effectors 1403, 1404 may be rotatably coupled to the forearm 1402 at a wrist joint 1412. While the exemplary embodiment shown in FIGS. 14A-C are shown having two end effectors, it should be realized that the arm may have more or less than two end effectors.

The upper arm may be rotatably driven at the shoulder joint 1410 by a first drive shaft 1436 (which may be substantially similar to shaft 1368C of the drive system 1301). A second drive shaft 1435 (which may be substantially similar to shaft 1368A of the drive system 1301) may be coupled to and rotatably drive a first end effector pulley 1437. A shoulder pulley 1430 may also be freely mounted on the second shaft 1435 and supported by suitable bearings 1431 such that the shoulder pulley 1430 does not rotate when the second shaft 1435 and/or the upper arm 1401 rotates. For example, the shoulder pulley 1430 may be fixedly connected to the base 1405 through connecting member 1431 to prevent the rotation of the shoulder pulley 1430 (e.g. the forearm is slaved to the upper arm). In alternate embodiments, where theta motion of the transport (e.g. rotation of the transport arm as a unit) is desired, the shoulder pulley 1430 may be coupled to another motor of the drive section to prevent relative movement between the forearm 1402 and upper arm 1401 when the transport is rotated as a unit. The upper arm 1401 may be suitably configured so that the connecting member 1431 passes through the upper arm 1401 to connect with the base 1405. In alternate embodiments the shoulder pulley 1430 may be fixed from rotation in any suitable manner, including but not limited to, a third non-rotatable shaft.

A second end effector pulley 1440 is located at the elbow joint 1411. The second end effector pulley 1440 may be freely rotatable and suitably supported about elbow shaft 1411' by, for example, suitable bearings 1443. The first and second end effector pulleys may be coupled to each other by, for example, belt 1439. Although one belt is shown in the Figures it is noted that any suitable number of belts may be used. It is noted that in alternate embodiments belt 1439 may be replaced with any suitable coupler including, but not limited to, chains, bands and linkages. An elbow pulley 1441 may also be freely rotatable about the elbow shaft 1411' and suitably supported by, for example, bearings 1442. The elbow pulley 1441 may be fixedly coupled to the forearm 1402 such that the elbow pulley 1441 drives the rotation of the forearm 1402 about the shoulder joint 1411. The elbow pulley 1441 may be coupled to the shoulder pulley 1430 by, for example, belt 1438 in a manner substantially similar to that described above with respect to the end effector pulleys 1437, 1440. In this exemplary embodiment the diameters of the shoulder and elbow pulleys 1430, 1441 may have a ratio of about two to one such that a predetermined arm trajectory is maintained during extension and retraction of the transport 1400. In alternate embodiments the shoulder and elbow pulleys may have any suitable diametrical ratio.

A third and fourth end effector pulley 1445, 1446 may be located within the forearm 1402 at the elbow joint 1411 and drivingly coupled to the second end effector pulley 1440. In this example the third and fourth pulleys 1445, 1446 are shown as separate pulleys but in alternate embodiments there may only be one pulley with, for example, two grooves. In other alternate embodiments the pulleys may have any suitable configuration. A fifth and sixth end effector pulley 1420, 1421 may be located at the wrist joint 1412 within the forearm 1402 and rotatably supported on wrist shaft 1412' by, for example suitable bearings 1450, 1451. The third end effector pulley 1445 may be drivingly coupled to the fifth end effector pulley 1420 by, for example, a belt 1422 in a manner substantially similar to that described above. The fourth end effector pulley 1446 may be drivingly coupled to the sixth end effector pulley 1421 by, for example belt 1423 in a manner substantially similar to that described above. In this example the pulleys may be differentially coupled such that the end effectors rotate in opposite directions in a scissor like manner as will be described below. For example the belt 1422 may be twisted in a "figure eight" configuration as shown in the Figures such that pulley 1420 rotates in an opposite direction than its drive pulley 1445.

The first end effector 1404 may be fixedly coupled to the fifth end effector pulley 1420 such that when the pulley 1420 rotates the end effector 1404 rotates with it. The second end effector 1403 may be fixedly coupled to the sixth end effector pulley 1421 such that when the pulley 1421 rotates the end effector 1403 rotates with it. In alternate embodiments the transport 1400 may have more or less than two end effectors. The end effectors may have any suitable configuration including, but not limited to, the exemplary configurations of the end effectors 1403, 1404, 1403' and 1404' shown in the Figures.

It is noted that in this exemplary embodiment the pulleys are located within the upper arm 1401 and forearm 1402. The upper arm 1401 and forearm 1402 may be sealed and or vented by for example a vacuum pump to prevent particulates from the drive system from contaminating the substrate S carried by the transport 1400. In alternate embodiments, the pulleys may be located in any suitable location. It is further noted that the pulley configuration shown in FIGS. 14A-C and 15A-B is exemplary in nature and that the pulleys may have any suitable configuration for driving the robot arm and end effectors.

Figure 16B:
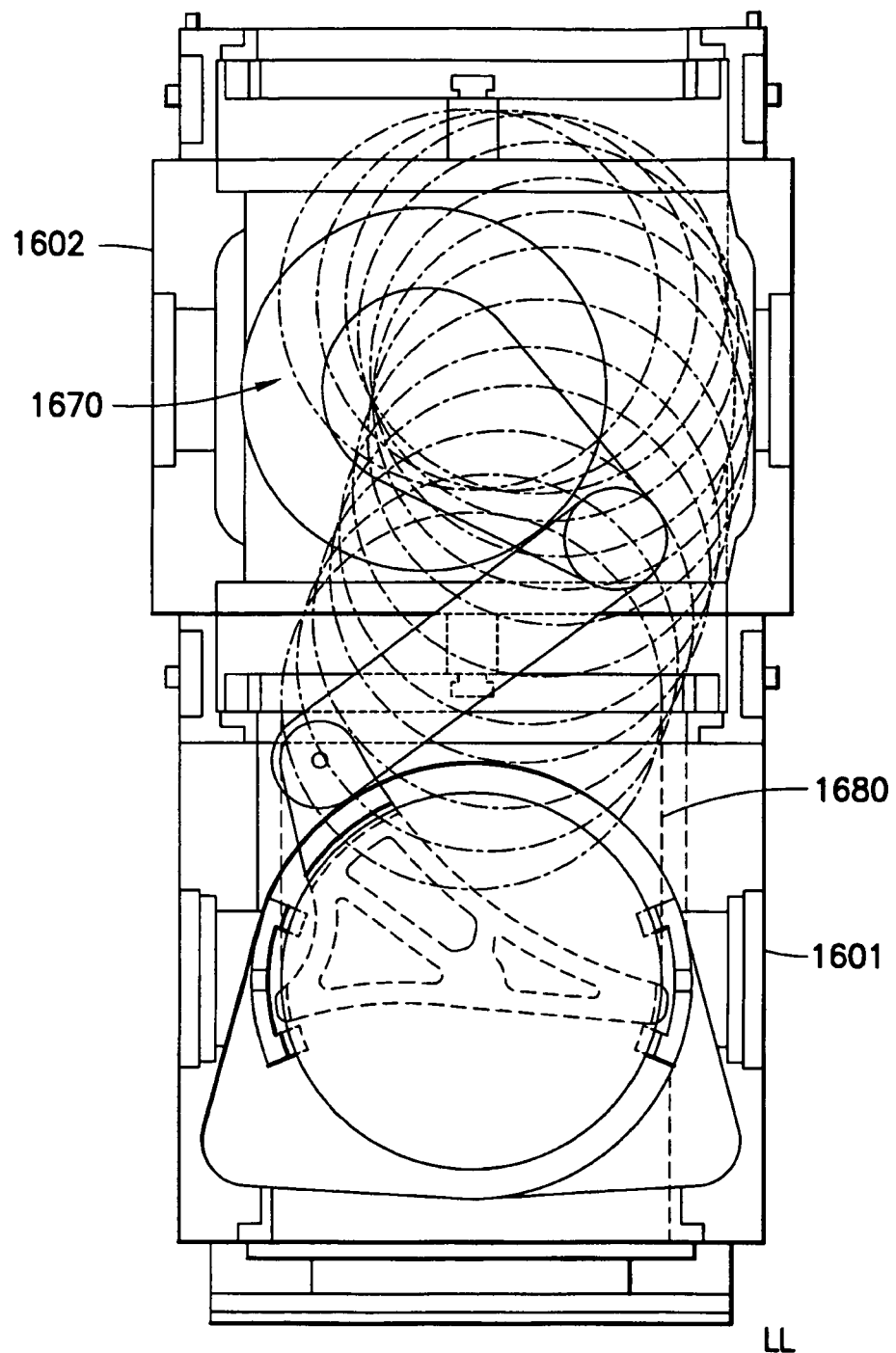

Referring now to FIGS. 16A and 16B the extension of the transport arm 1603 into, for example the load lock (or buffer) 1601 will be described. The transport 1600 may be substantially similar to the transport described above with respect to FIGS. 14A-C and 15A-B. In this example the arm 1630 is shown in six exemplary positions A-F where position A is referred to as the neutral or start position of the arm 1630 and position F is referred to as the extended position of the arm 1630 for exemplary purposes only. It is noted that the terms "start" and "extended" positions are used merely as a convenience in describing the motion of the arm. In position A, the end effectors 1630, 1640 are substantially aligned over the upper arm 1610. In order to extend or move the end effector (either one of the end effectors 1630, 1640) in the direction of arrow 1605 to the pick or place position (i.e. the position of the substrate within the load lock/buffer) the upper arm 1610 is rotated in the direction of arrow 1605. The transport drive 1301 (FIG. 13) moves arms and end effectors as directed by a control algorithm. The slaved forearm 1620 is driven via the rotation of the upper arm 1610 and fixed shoulder pulley 1430 in the direction of arrow 1606. The end effectors may be driven by the end effector pulleys and shaft 1435 such that end effector 1630 rotates in the direction of arrow 1608 and differentially coupled end effector 1640 rotates in the direction of arrow 1607. As can best be seen in FIG. 16B (in which the transfer robot is shown with one end effector for clarity purposes), the substrate located on the end effector may follow a substantially arcuate or U-shaped path 1670 while inside the transfer chamber 1602 and a substantially straight or linear path 1680 while outside of the transfer chamber 1602 (i.e. within the load lock or buffer 1601). Moreover, in the exemplary embodiment, the linear paths 1680 on opposite sides of the transfer chamber may be substantially aligned with each other, though as may be realized, in alternate embodiments the paths may be angled relative to each other. As may be realized retraction of the arm 1603 occurs in a manner substantially opposite to the extension of the arm 1603. As also may be realized, the motion of the three link transport arm is highly efficient having the minimum space envelope or footprint (of the transport with the substrate) for a given extension of the transport arm 1603. In this manner, the transport reach/extension to containment ratio is maximized. It is noted that the dual end effectors may be utilized for fast swapping of substrates as one end effector may pick a processed substrate while the other end effector places an unprocessed substrate within the load lock/buffer.

Figure 17B:
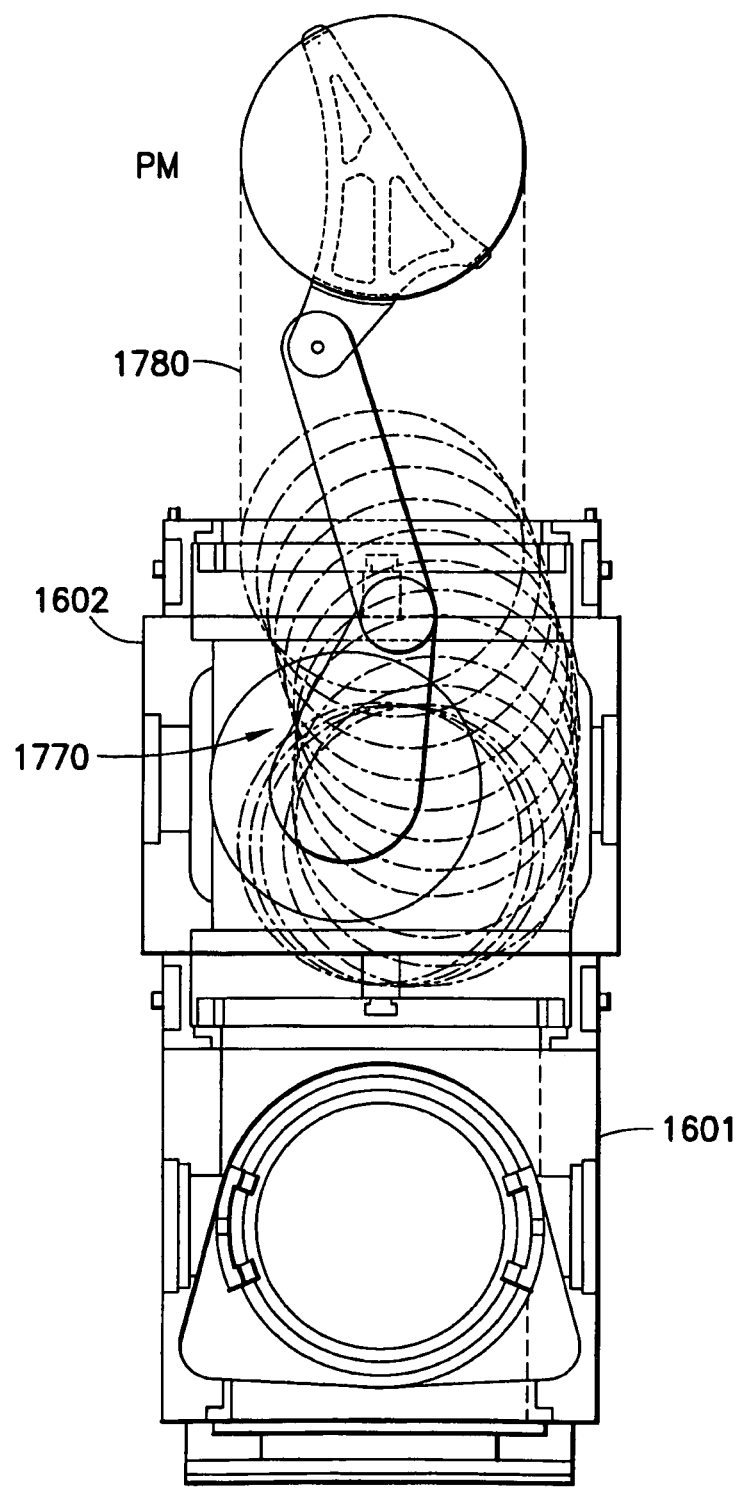

Referring now to FIGS. 17A and 17B the extension of the transport arm 1603 into, for example a processing module (not shown but indicated by the letters "PM" in the FIG. 17B) will be described. In alternate embodiments the arm 1630 may be extended into any suitable location in the manner described below. The transport 1600 may be substantially similar to the transport described above with respect to FIGS. 14A-C and 15A-B. In this example the arm 1630 is shown in seven exemplary positions G-M where position G is the start position of the arm 1630 and position M is the extended position of the arm 1630. Again, it is noted that the terms "start" and "extended" positions are used merely as a convenience in describing the motion of the arm. In position G, the end effectors 1630, 1640 are substantially aligned over the upper arm 1610. In order to extend or move the end effector (either one of the end effectors 1630, 1640) in the direction of arrow 1705 to the pick or place position (e.g. the position of the substrate within the processing module) the upper arm 1610 is rotated in the direction of arrow 1705. The transport drive 1301 (FIG. 13) moves arms and end effectors as directed by a control algorithm. The slaved forearm 1620 is driven via the rotation of the upper arm 1610 and fixed shoulder pulley 1430 in the direction of arrow 1706. The end effectors 1630, 1640 may be driven by the end effector pulleys and shaft 1435 such that end effector 1630 rotates in the direction of arrow 1708 and differentially coupled end effector 1640 rotates in the direction of arrow 1707. As can best be seen in FIG. 17B, the substrate located on the end effector follows a substantially arcuate or U-shaped path 1770 while inside the transfer chamber 1602 and a substantially straight or linear path 1780 while outside of the transfer chamber 1602 (e.g. within the processing module PM). As may be realized retraction of the arm 1630 from, for example, the processing module PM occurs in a manner substantially opposite to the extension of the arm 1603. Again, the motion of the three link transport arm is highly efficient having the minimum space envelope or footprint (of the transport with the substrate) for a given extension of the transport arm. In this manner, the transport reach/extension to containment ratio is maximized.

It is noted that the dual end effectors 1630, 1640 may be utilized for fast swapping of substrates as one end effector may pick a processed substrate while the other end effector places an unprocessed substrate within the processing module PM. For example, still referring to FIG. 17A the fast swap of substrates to, for example a processing module (not shown but indicated as PM) will be described. In this example, both end effectors 1630, 1640 may start off in position G having a substrate thereon where each substrate is substantially aligned with the folded robot arms 1610, 1620. A first substrate may be placed by end effector 1630 in the processing module PM as described above and shown in position M of FIG. 17A. After processing of the substrate end effector 1630 may be extended back into the processing module to pick the substrate. The end effector is retracted from the processing module in a manner substantially opposite to the extension of the transport until the processed substrate is at least partly within the transfer chamber 1602. Once the processed substrate is at least partially within the transfer chamber 1602 such that there is sufficient clearance between the processed substrate and the transfer chamber wall and/or slit valve the end effector drive rotates either clockwise or counterclockwise such that the end effectors 1630, 1640 swap positions. In this example end effector 1630 is closest to the processing module during the extension of the transport but after the end effectors swap positions the end effector 1640 becomes the closest to the processing module. It is noted that to effectuate the fast swapping of the substrates the transport arm 1603 may not have to be fully retracted to position G shown in FIG. 17A. For exemplary purposes only, sufficient clearance may exist between the substrate and the transfer chamber walls and/or slit valve when the arm 1603 is in position H (or any other suitable position along the transport path). After the swapping of positions of the end effectors 1630, 1640 the arm 1603 is extended in the manner described above and the unprocessed substrate is placed in the processing module by end effector 1640. It is noted that during the extension of the arm 1603 the substrates (on both end effectors 1630, 1640) are substantially positioned and travel along a center line of the processing module and/or the EFEM operational path) when one of the substrates is located outside of the transfer chamber 1602. As may be realized, the fast swapping of substrates to and from the buffer or load lock area of the transfer module may be performed in substantially the same manner as described above.

Figure 18:
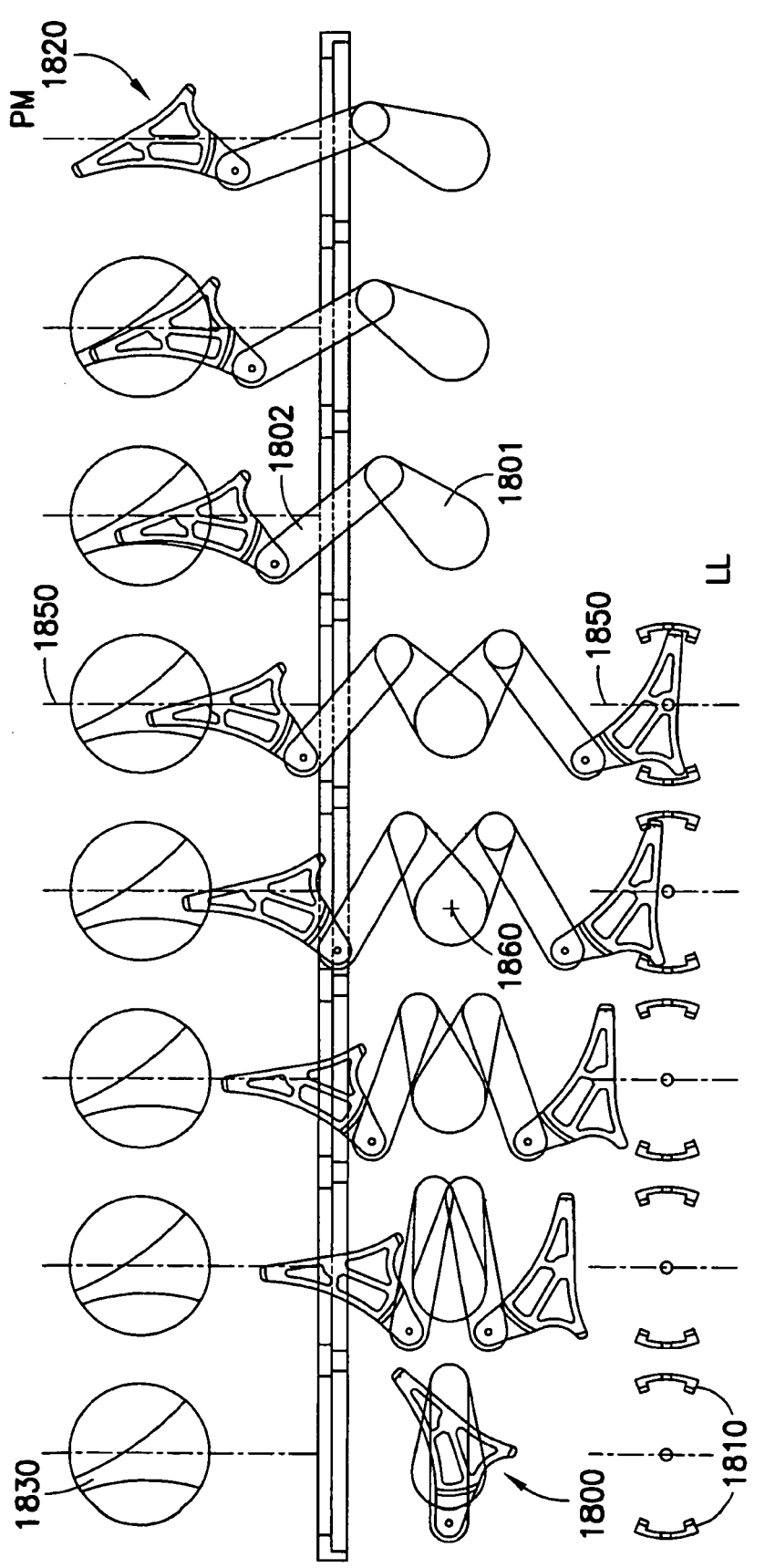
FIG. 18 illustrates an exemplary substrate transport configuration in accordance with an exemplary embodiment.

As can be seen in FIG. 18 in one exemplary configuration the arm 1800 may be configured such that the end effector 1803 fits within a clearance envelope 1830 in for example the processing module that may be defined by the substrate supports 1810 of the load lock/buffer as can be seen in the Figure. In this exemplary embodiment the processing module PM may have substrate supports 1820 that are located about one-hundred-and-twenty degrees apart from each other. In alternate embodiments the substrate supports may have any suitable spatial relationship with each other. The end effector may have the exemplary configuration shown in FIG. 18 such that as the upper arm 1801, the forearm 1802 and the end effector 1803 are extended into the processing module the end effector 1803 fits between the substrate supports 1820. Likewise, the end effector 1803 may also be configured to fit between the substrate supports 1810 of the load lock/buffer LL as the arm is extended into the load lock/buffer. In alternate embodiments the end effector may have any suitable configuration. The bi-directional movement of the transfer arm 1800 can also be seen in FIG. 18. For example, the arm 1800 can extend into both the processing module PM on one side of the upper arm axis of rotation 1860 and into the load lock/buffer LL on the other side of the axis of rotation 1860 along path 1850 without rotating the transfer arm 1800 as a unit about axis 1860 (i.e. the arm is capable of extension in two in-line opposite directions without rotation). In alternate embodiments the arm 1800 can be configured with an additional motor for rotating the arm as a unit to allow for extension in other directions other than along path 1850.

Figure 19B:
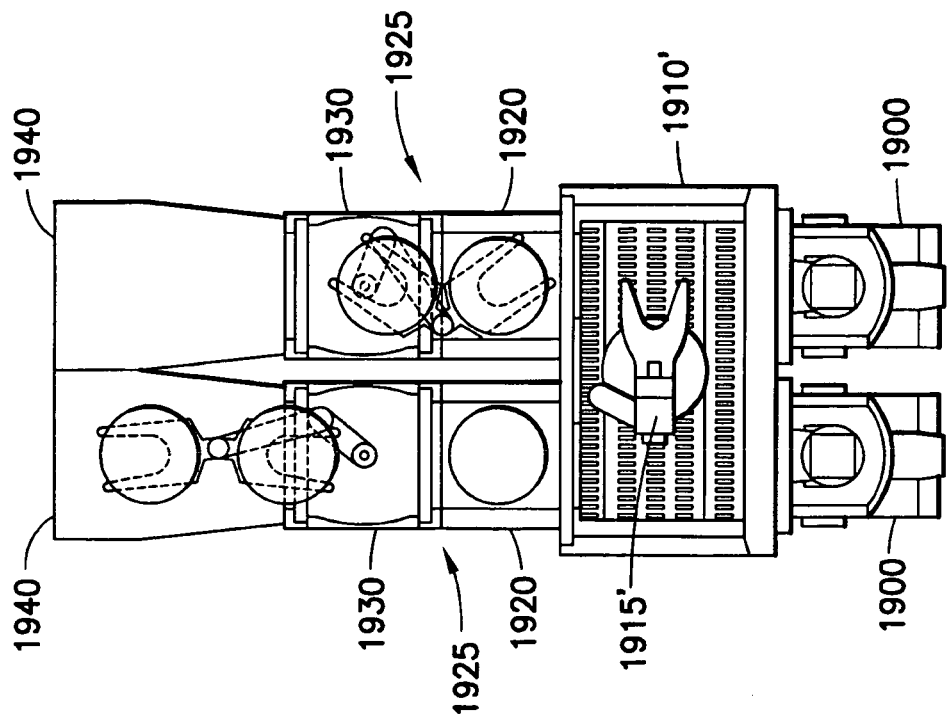
FIGS. 19A-D, 20, 21, 22 and 23 are schematic illustrations of exemplary substrate processing systems in accordance with exemplary embodiments.
Figure 19A:
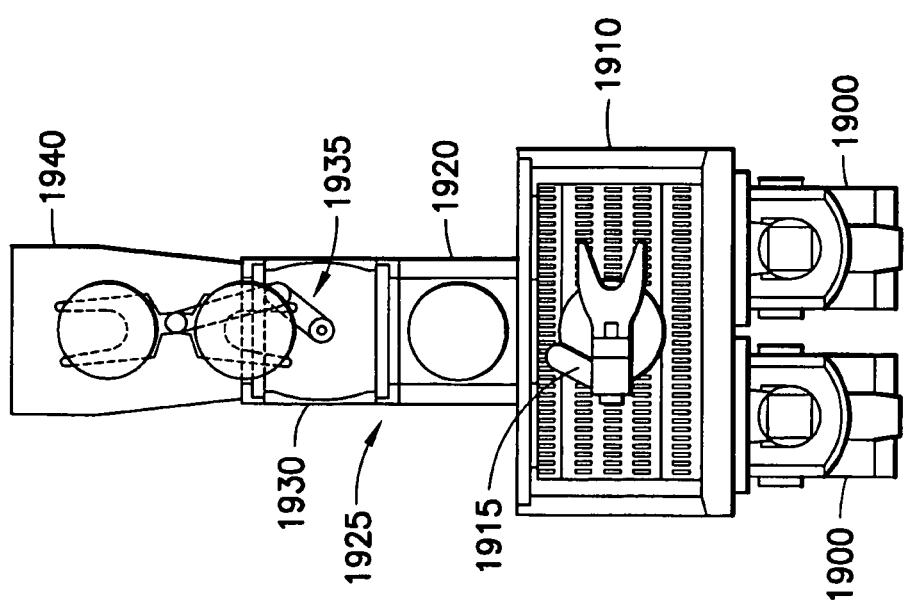
Figure 19D:
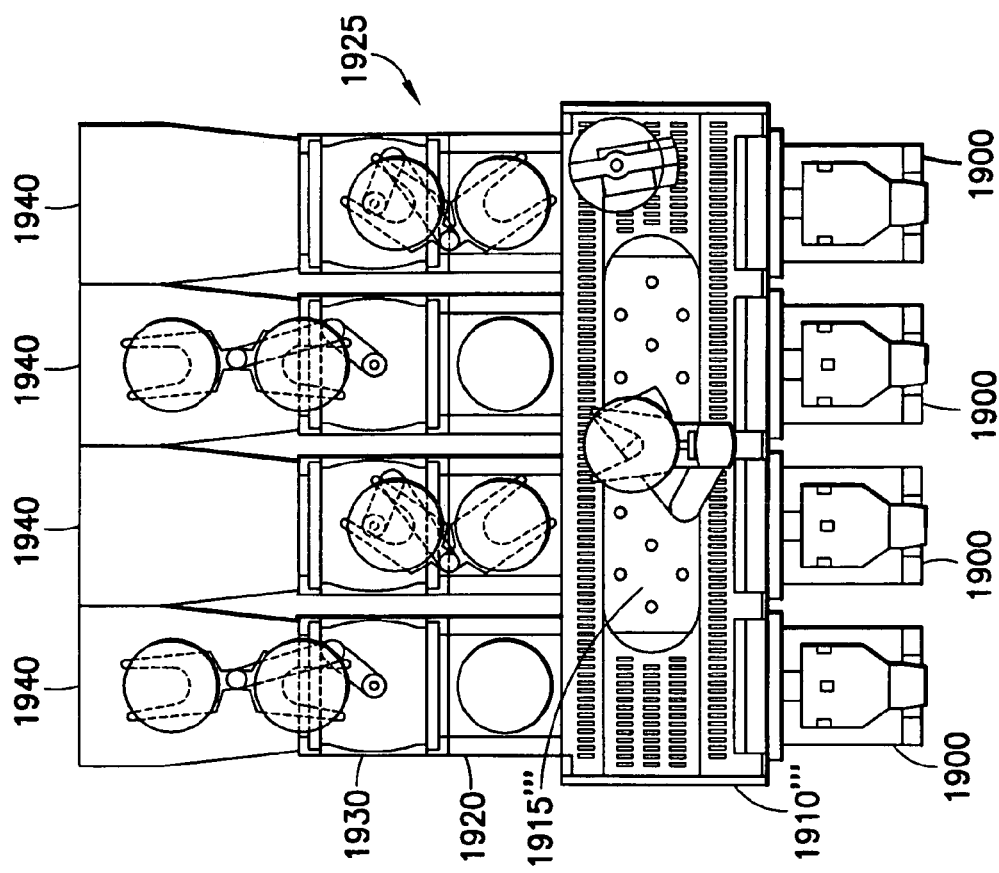
Figure 19C:
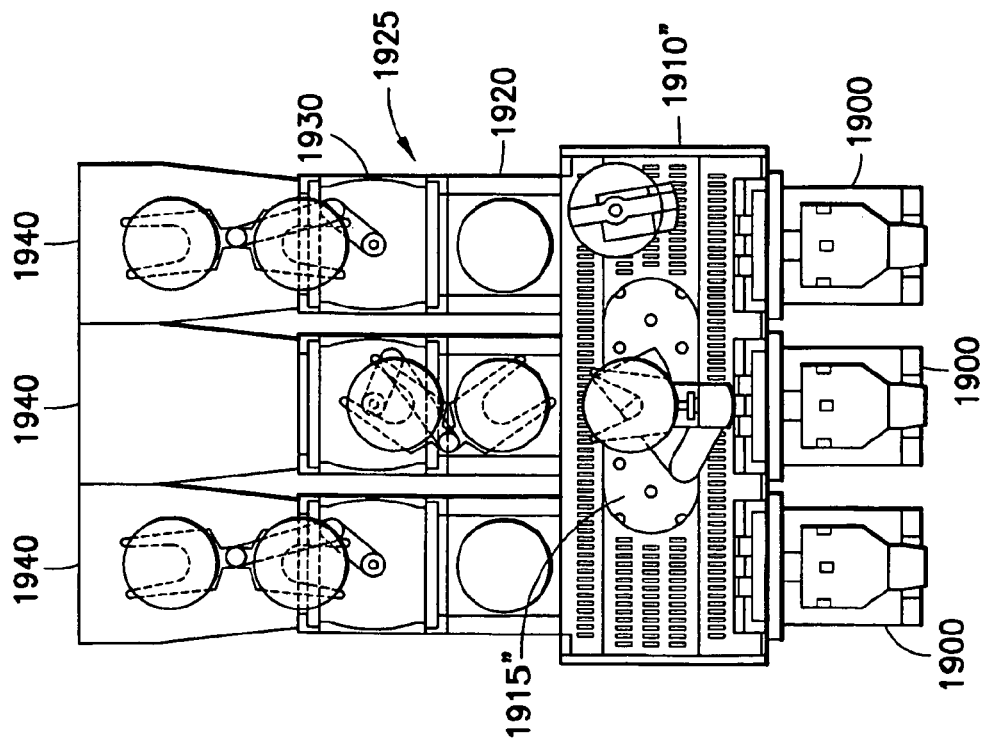

Referring now to FIGS. 19A-D and 20-23, the automated vacuum wafer transport system described herein may be utilized as a building block to configure cluster tools with any suitable number of processing modules as shown for example. In the exemplary embodiment, the width of the cluster tool may be independent of the width of the transport chamber and may depend for example but on the width of the EFEM or processing modules. In the exemplary embodiment shown, the cluster tools may be a series of single step process modules (e.g. each process module performs a single processing step) that are connected to each of the transfer modules which in turn are connected to a front end unit. In alternate embodiments, a front end unit may not be used between transport chamber (e.g. at vacuum) and load port. In alternate embodiments each of the processing modules may perform multiple processing steps. Exemplary configurations of the cluster tools having between one and four single step processing modules are shown in FIGS. 19A-D. In alternate embodiments, the cluster tools may have more than four processing modules. As noted above existing EFEMs have operational paths (two of which are indicated by reference numerals CL1 and CL2 in FIGS. 20-23) that are separated by a distance D of, for example, about 505 mm for 300 mm diameter wafers. As noted above, in alternate embodiments the distance D may be any suitable distance. It is noted that the exemplary embodiments described herein may be scalable in size and configuration to mate with EFEMs and processing modules configured for any suitably sized substrate. For example, the dimensions of the transfer robot, transfer chamber, load lock or any other suitable components of the transport units or modules described herein may be increased or decreased in size according to the size of the substrate being processed. Due to the three link unequal length arm transfer robot and transfer modules disclosed herein the transfer modules 101, 200 (FIGS. 1A, 2A) may have a width that is less than the spacing D between operational paths of the EFEM allowing the transfer modules 101, 200 and the processing modules 1940 to be aligned with the center line CL1, CL2 of the operational paths of the EFEMS. As can be seen in FIG. 19A, EFEM 1910 is configured with one transfer module 1925 which may include transfer chamber 1935 and load lock 1920 and any associated slit or atmospheric valves. EFEM 1910 may include a transfer robot 1915 configured to have access to the two load ports 1900 and load lock 1920. FIG. 19B shows EFEM 1910' configured with two transfer modules 1925. EFEM 1910' may include a transfer robot 1915' configured to have access to the two load ports 1900 and to the two load locks 1920. FIG. 19C shows EFEM 1910" configured with three transfer modules 1925. EFEM 1910" may include a transfer robot 1915" configured to have access to three two load ports 1900 and to the three load locks 1920. FIG. 19D shows EFEM 1910''' configured with four transfer modules 1925. EFEM 1910''' may include a transfer robot 1915''' configured to have access to the four load ports 1900 and to the four load locks 1920. It is noted that the transfer modules 1925 may be configured with load locks as can be seen in, for example, FIGS. 20 and 21 or with buffers as can be seen in, for example, FIGS. 22 and 23. It is noted that the processing modules 1940 coupled to the transfer modules 1925 in FIGS. 19A-19D may have a width less than the SEMI specified 750 mm width. In other exemplary embodiments the multiple processing modules that are coupled to each of the transfer modules such as those shown in FIGS. 19B-19D may be part of a single processing module having multiple processing chambers. For example, the two processing modules 1940 in FIG. 19B may be a single double processing module (e.g. two processing modules in a single unit), the three processing modules 1940 in FIG. 19C may be a single triple processing module (e.g. three processing modules in a single unit) and so on.

Figure 21:
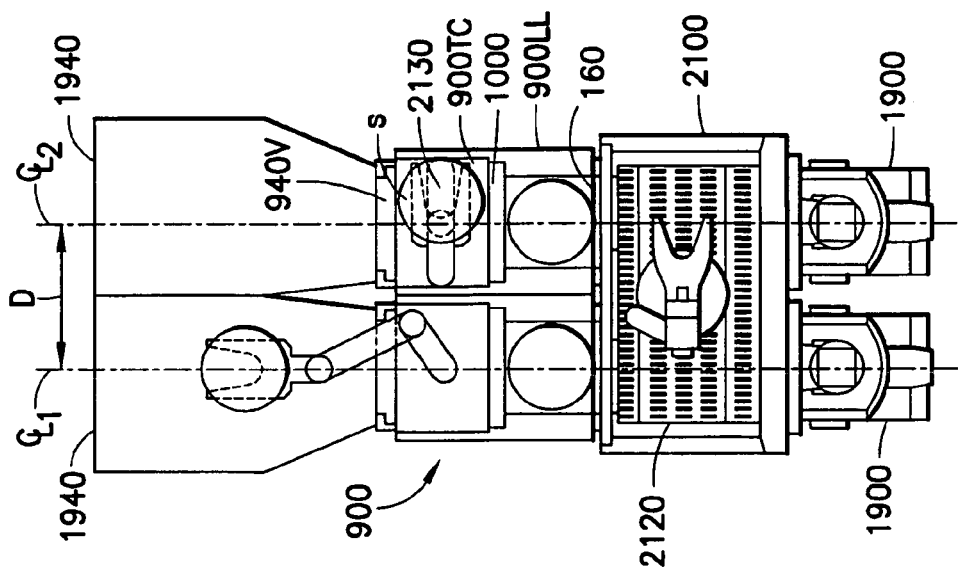
Figure 24A:
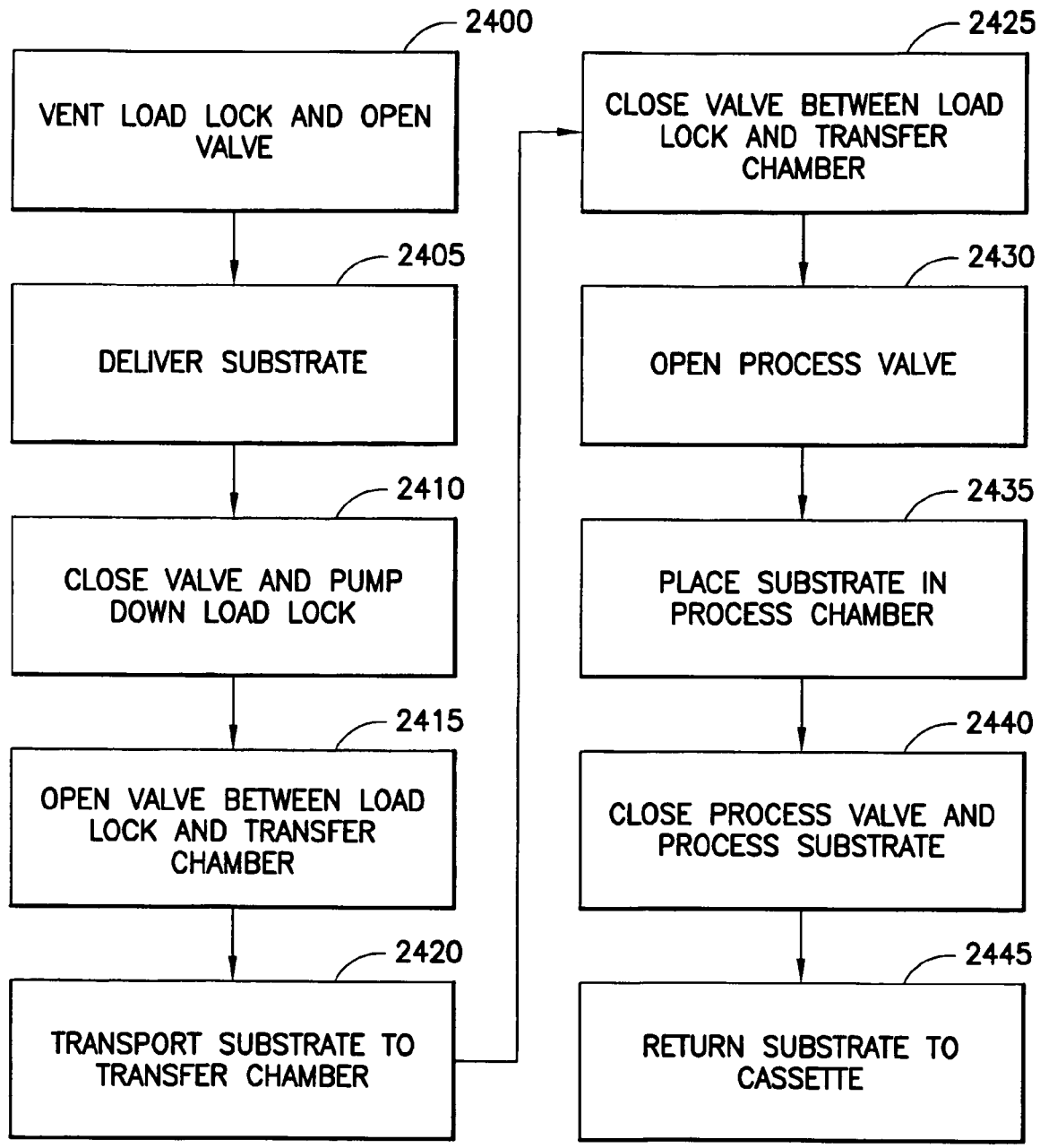
FIGS. 24A-B illustrate flow diagrams in accordance with an exemplary embodiment.

Referring now to FIGS. 21 and 24A, an exemplary operation of the transfer system will be described with respect to operational path CL2. Initially load lock 900LL is vented and a delivery port at the interface 160 is opened (FIG. 24A, Block 2400). Front end transport 2120 is actuated to deliver a substrate S from either of the load ports 1900 to the load lock 900LL for processing (FIG. 24A, Block 2405). The delivery port valve is sealed and load lock chamber 900LL is pumped to vacuum (FIG. 24A, Block 2410). When the process operational vacuum is obtained, slit valve 1000 is opened (FIG. 24A, Block 2415). The transport robot 2130 located in transfer chamber 900TC (which is maintained at vacuum) removes the substrate from the load lock 900LL via the transport trajectory shown in, for example, FIG. 16B and transports the substrate within the transfer chamber 900TC (FIG. 24A, Block 2420). The slit valve 1000 between the transport chamber and load lock is closed (FIG. 24A, Block 2425). It is noted that the robot 2130 in this example may have one end effector but the operation of a robot with dual end effectors will be described below. The process slit valve 940V is opened (FIG. 24A, Block 2430). At this point process chamber 1940 is empty and transport 2130 is at its so called start position. Transport 2130 translates through its delivery trajectory shown in, for example, FIG. 17B to full extension (or any other suitable extension distance) where it will drop off substrate S for processing (FIG. 24A, Block 2435). Transport 2130 retracts to its start position and the process valve 940V is closed and sealed. Whereupon substrate S is subjected to the process cycle in chamber 1940 (FIG. 24A, Block 2440). After processing the substrate S is returned to the load lock 900LL, in a manner substantially opposite to that described above, where the robot 2120 picks the processed substrate and places it within a transport cassette coupled to one of the load ports 1900 (FIG. 24A, Block 2455). The system at this point has completed a cycle and a new cycle is initiated to process the new substrate. As may be realized the load lock 900LL may include a buffer so that as a processed substrate is place in the load lock a new substrate can be transported from the load lock into the transfer chamber for processing.

Figure 20:
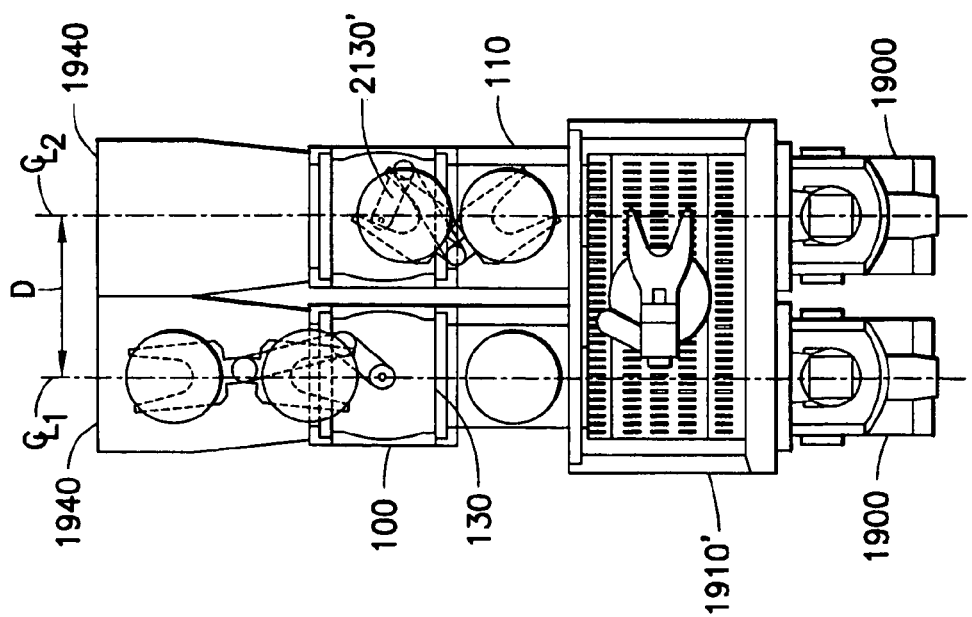
Figure 23:
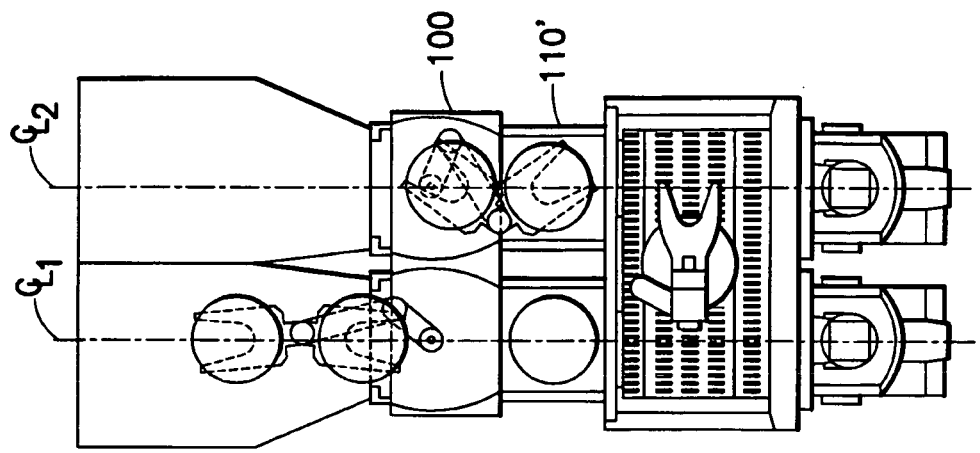
Figure 22:
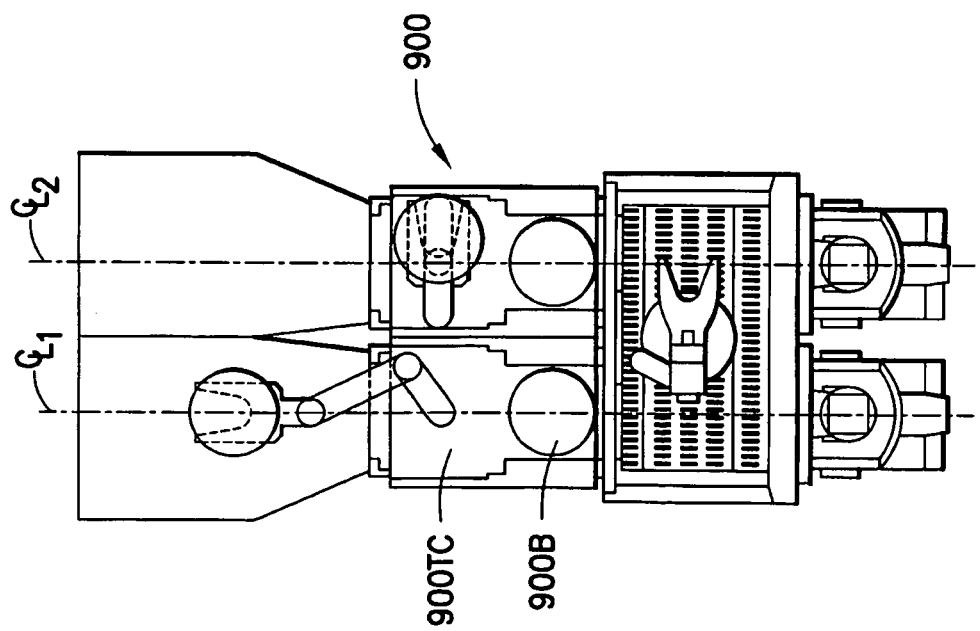
Figure 24B:
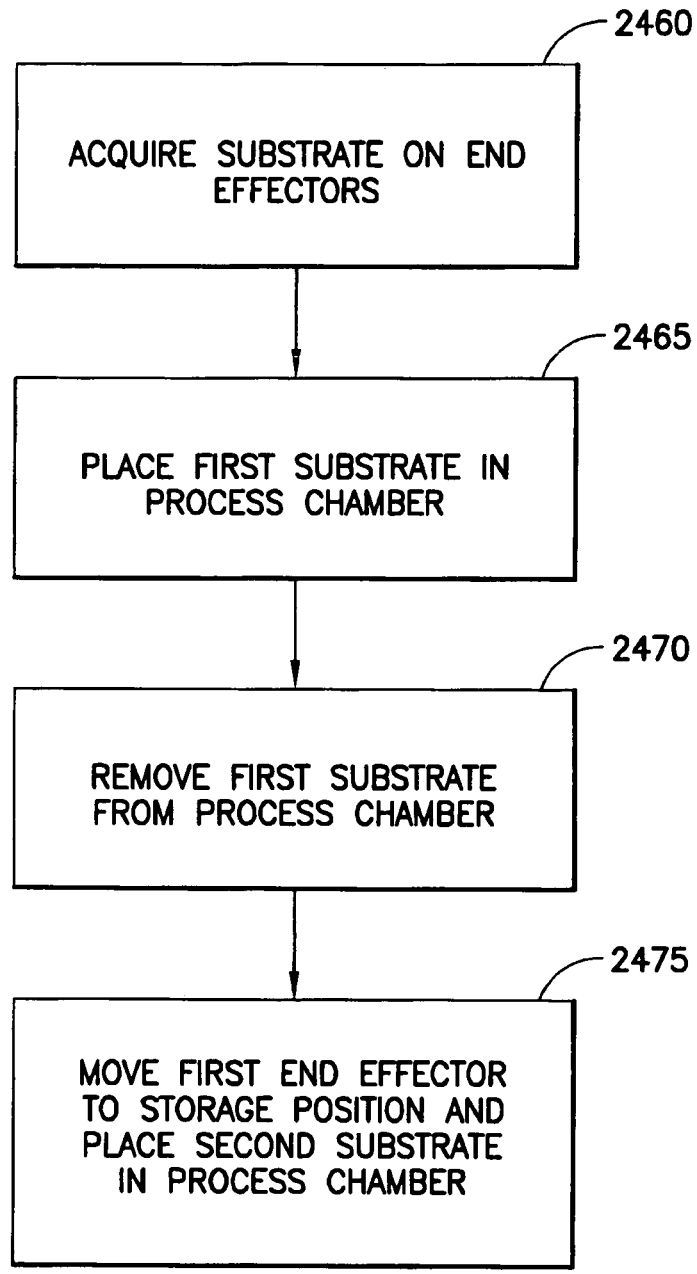

In another embodiment as shown in FIG. 20 and referring also to FIG. 24B, where the robot 2130' has two end effectors, the end effectors may be differentially driven for alternating use to pickup or drop off substrates as they are processed. The second end effector will be moved through similar trajectories as indicated in, for examples, FIGS. 16B and 17B. The additional end effector allows a substrate to be stored without the need for buffer shelves thereby increasing the throughput of the system by allowing the fast swapping of substrates as described above.

In operation, each of the end effectors will initially hold a substrate for processing (FIG. 24B, Block 2460). One of the end effectors will place its substrate in the processing chamber for processing (FIG. 24B, Block 2465). After the processing cycle is completed, the processed substrate is picked up by the empty end effector and retracted from the processing chamber (FIG. 24B, Block 2470). The end effector holding the processed substrate is moved into the storage position while the differentially coupled end effector holding the unprocessed substrate is moved forward to place the unprocessed substrate in the processing chamber (FIG. 24B, Block 2475) (e.g. fast swapping of the substrates). During processing, as before, the load lock is vented and opened to allow a new substrate to be loaded by the front end robot. The new substrate can be swapped from the load lock 100 with the processed substrate by the differentially driven end effectors of the transport 2130'.

In this manner a simplified, highly flexible transport system is constructed to service an individual process chamber. The integral transport mechanism provides a mechanism to deliver substrates to the process chamber and to recycle for the next process cycle during the period of processing. This provides the ability to mount complete process modules to existing front end systems to allow the side by side arrangement of the process modules, thereby avoiding the cumbersome systems which have emerged due to the increase in substrate diameter.

As may be realized the principal cycling event in the substrate processing is the operation of the vacuum pump 140 to pump the load lock 900LL to vacuum. Pump 140 also operates to maintain the vacuum in the process module 1940 and the transfer chamber 900TC. Pressure sensors may sense the pressure in the load lock 900LL and provide, for example, controller 310 with an indication of the load lock pressure. The time needed to pump the load lock to vacuum is dependent on the volume of the chamber 900LL. To minimize the volume of the load lock chamber, all space within the chamber, that is not needed for transport of the substrate or to buffer the substrate is filled by shaping the sides, top and bottom of the chamber walls to minimize the volume of gas held by the load lock 900LL.

Figure 24C:
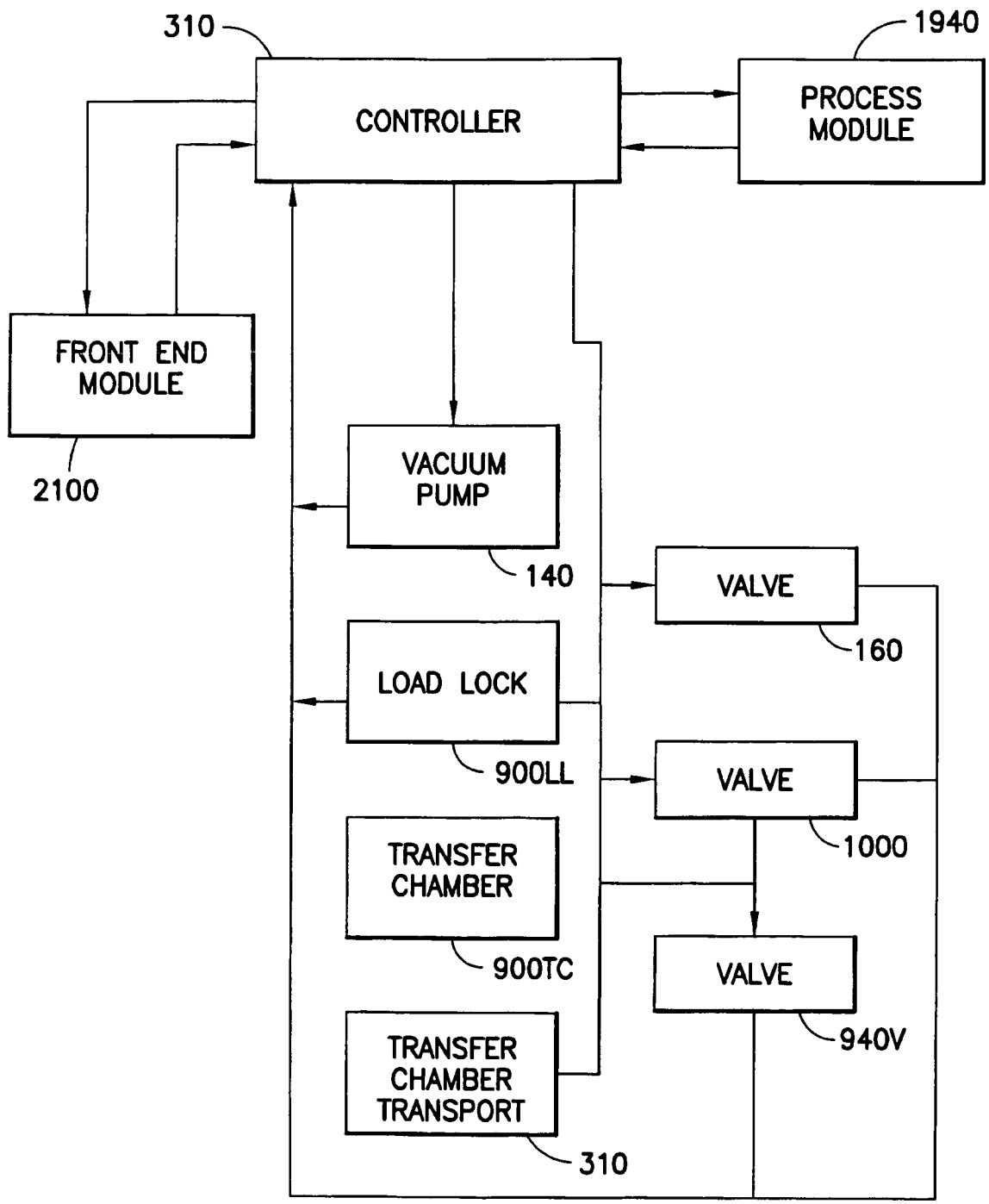
FIG. 24C illustrates an exemplary control diagram in accordance with an exemplary embodiment.

Referring now to FIG. 24C, it is noted that, for example, the controller 310 may include suitable control algorithms for operating the valves and transfer robot as described above with respect to FIGS. 24A, 24B. An exemplary process control system 2480, which can be used to accomplish the various functions described above is shown in FIG. 24C. Each of the process modules will be provided with appropriate sensing elements to feedback information to the controller 310 to monitor the progress of the process and time sequence of operational steps.

Referring now to FIGS. 25A-F another exemplary embodiment of the substrate transfer system will be described. The processing system may be substantially similar to the processing system of the embodiment described before. In this exemplary embodiment the transfer chamber 2520 may be coupled directly to a load port module 2510 (without being coupled to the load port module through an EFEM). In alternate embodiments the transfer chamber may have any suitable configuration. In this example, the processing system is shown as being configured as a stand alone (EFEM-less) vacuum system with a single process module. In alternate embodiments, the processing systems may be clustered in an assembly generally similar to that shown in FIGS. 20-21, with the transport chambers connected directly to load port modules without an intervening EFEM. The transfer chamber 2520 may be configured to transfer substrates from the load port module 2510 directly to the processing module with a "one touch" or single pass transfer of the substrate (e.g. the substrate is handled only once by one transfer apparatus during transfer between the load port and processing module). For example, the transfer robot may pick the substrate from the load port module and transfer it directly to the processing module without putting down the substrate or transferring the substrate to another transport. The EFEM-less vacuum system shown in FIGS. 25A-F may permit applications including, but not limited to, vacuum metrology, research and development of substrates and one-off substrate production as well as system demonstrations. The operation of the system without an EFEM may provide a low cost vacuum system.

In one embodiment, the vacuum system includes a load port module 2510 with a substrate cassette elevator/indexer, load lock/transport chamber 2520 and a single processing module 2530. The transfer chamber 2520 may include a transfer robot 2540 that is substantially similar to the compact two axes dual end effector robot as described above with respect to FIGS. 13 and 14A-C. In this example, because the load port module 2510 includes an elevator/indexer, the transfer robot 2540 may not have a Z-axis drive. A suitable interface may be provided between load port to carrier interface flange and the transport chamber to allow the substrate cassette to be unloaded from the carrier and indexed relative to the transfer robot. The load lock/transfer chamber may be substantially similar to transport chamber portion 200TC (configured with the valves 700) of transfer module 200.

In other exemplary embodiments, where the load port module 2510 is not equipped with an elevator/indexer the transfer robot 2540 may be equipped with a Z-axis drive. As may be realized, where the robot 2540 includes a Z-axis drive the transfer chamber 2520 may be substantially similar to transfer chamber 100 which may have a larger internal volume V1 than the transfer chamber portion 200TC which has an internal volume of V2 as can be seen best in FIGS. 8 and 9. The larger volume of transfer chamber 100 may accommodate the Z movement of the transfer robot 2540. However, as may be realized where the transfer robot 2540 incorporates a Z drive the rotor portion of the motor, as described above with respect to FIG. 13B, may be exposed to the vacuum atmosphere which may increase the pump down cycle time. In alternate embodiments, there may be suitable seals for isolating the rotor portion of the Z drive from the vacuum environment. The operation of the processing system shown in FIGS. 25A-F may be substantially similar to that described above with respect to FIG. 24B where the substrate is transported from a substrate holder of the load port 2510 and transferred directly to the processing module 2530.

Figure 25C:
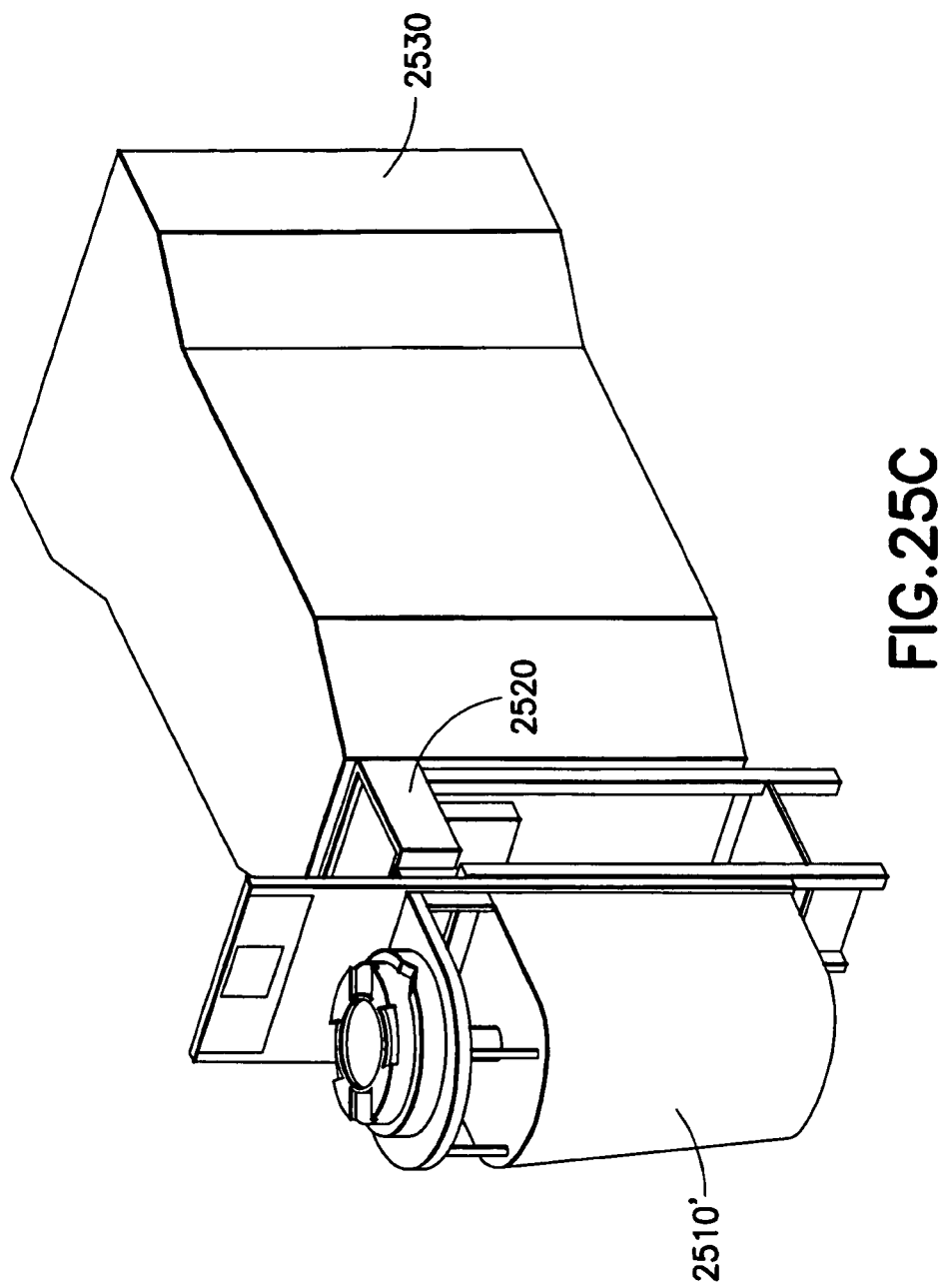
Figure 25E:
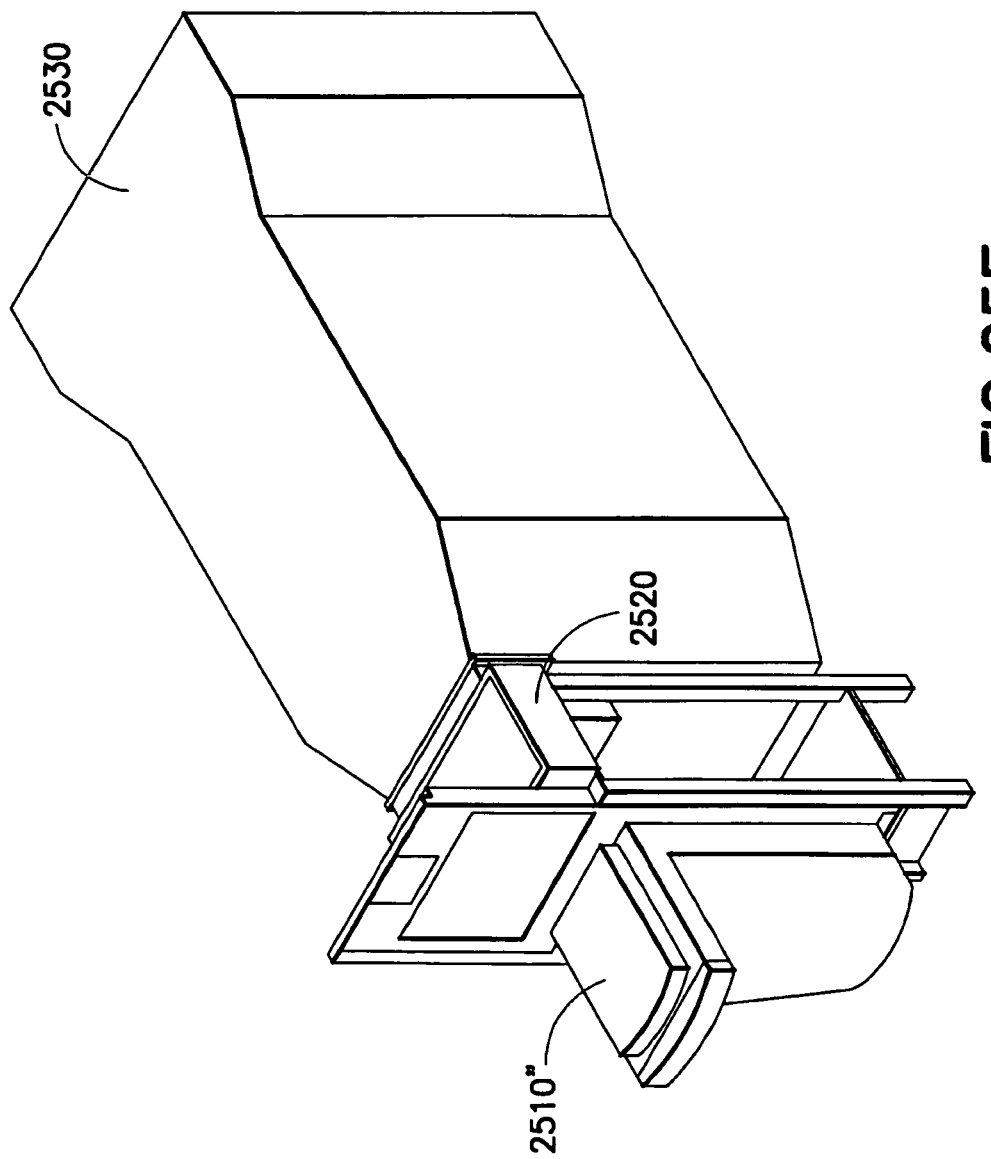
Figure 25F:
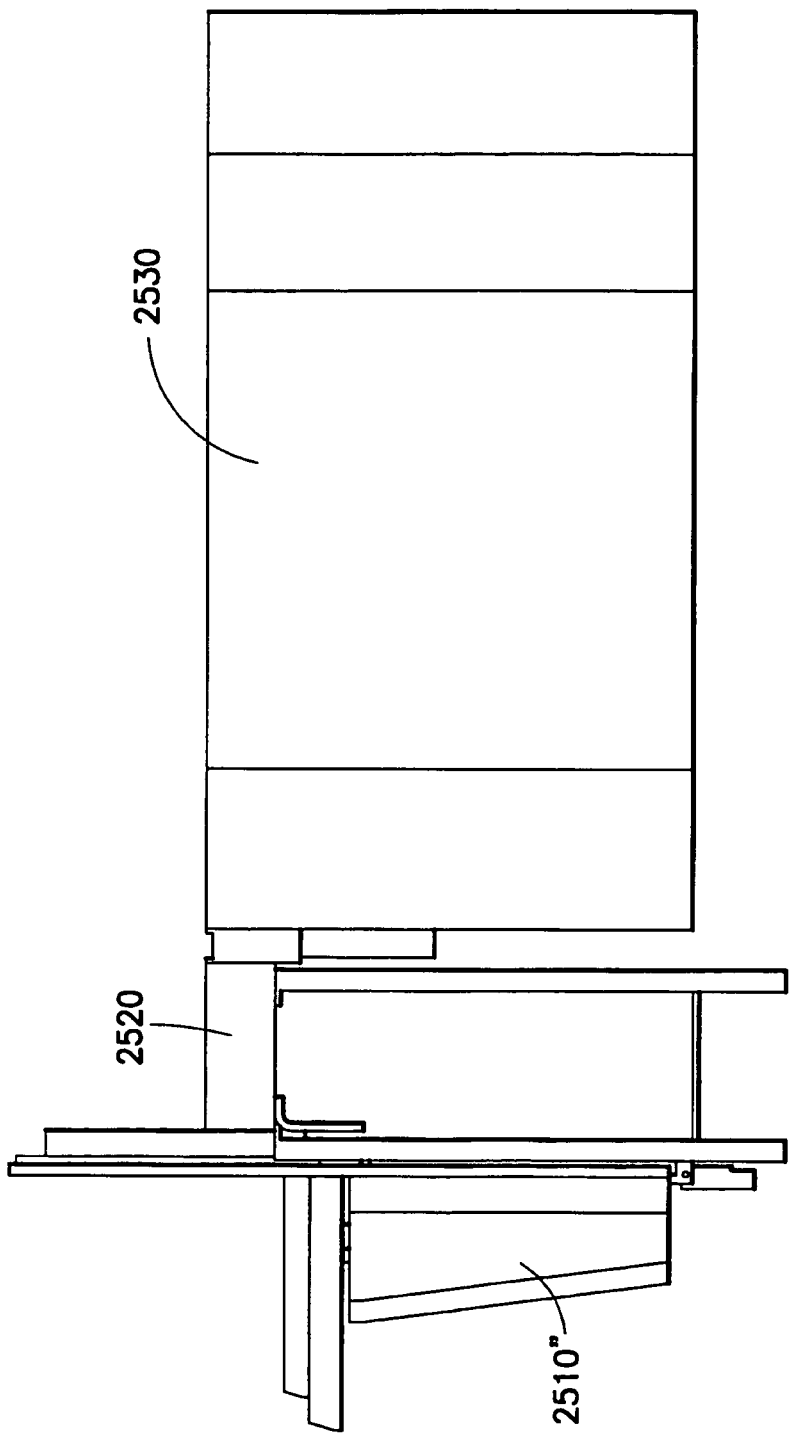

FIGS. 25C-F illustrate side and isometric views of the transport system in FIGS. 25A-B with different configurations of load port modules 2510', 2510". In the exemplary embodiment, the load port module 2510' is shown as a bottom opening load port module for example, and may include a substrate elevator/indexer while load port module 2510" may not have an elevator/indexer. In one embodiment, for example, where the transport 2540 may not be equipped with a Z-axis drive, load port module 2510' may include the elevator/indexer while load port module 2510" does not. The load port module 2510' may be configured to operate with a top or bottom opening substrate cassette. An example of a substrate cassette that may be utilized with the load port 2510' can be found in commonly assigned U.S. patent application Ser. Nos. 11/556,584; 11/594,365; and 11/787,981, entitled "REDUCED CAPACITY CARRIER TRANSPORT, LOAD PORT, BUFFER SYSTEM" and respectively filed on Nov. 3, 2006, Nov. 7, 2006 and Apr. 18, 2007, the disclosures of which are incorporated herein by reference in their entirety. In another exemplary embodiment, where the transport 2540 is equipped with a Z-axis drive, the load port module 2510" may be configured to operate with a side opening substrate carrier through for example, a slit valve or the atmospheric valve 960 (See FIGS. 9A-D). There may be any suitable seal, such as for example a bellows seal, between the load port module 2510 and the transfer chamber/load lock 2520 to allow for the vertical movement of the robot 2520 and/or substrate cassette while preventing leakage of the internal atmosphere of the transfer chamber/load lock 2520.

The configuration and compact size of the exemplary transport chambers 200TC and 100 allow the load port module, transfer chamber 2520 and processing module 2530 to be arranged along the same center line CL. The reduced volume of the load lock/transfer chambers also decrease the time it takes to vent and/or pump the load lock/transfer chamber to vacuum such that throughput is increased.

Figure 26:
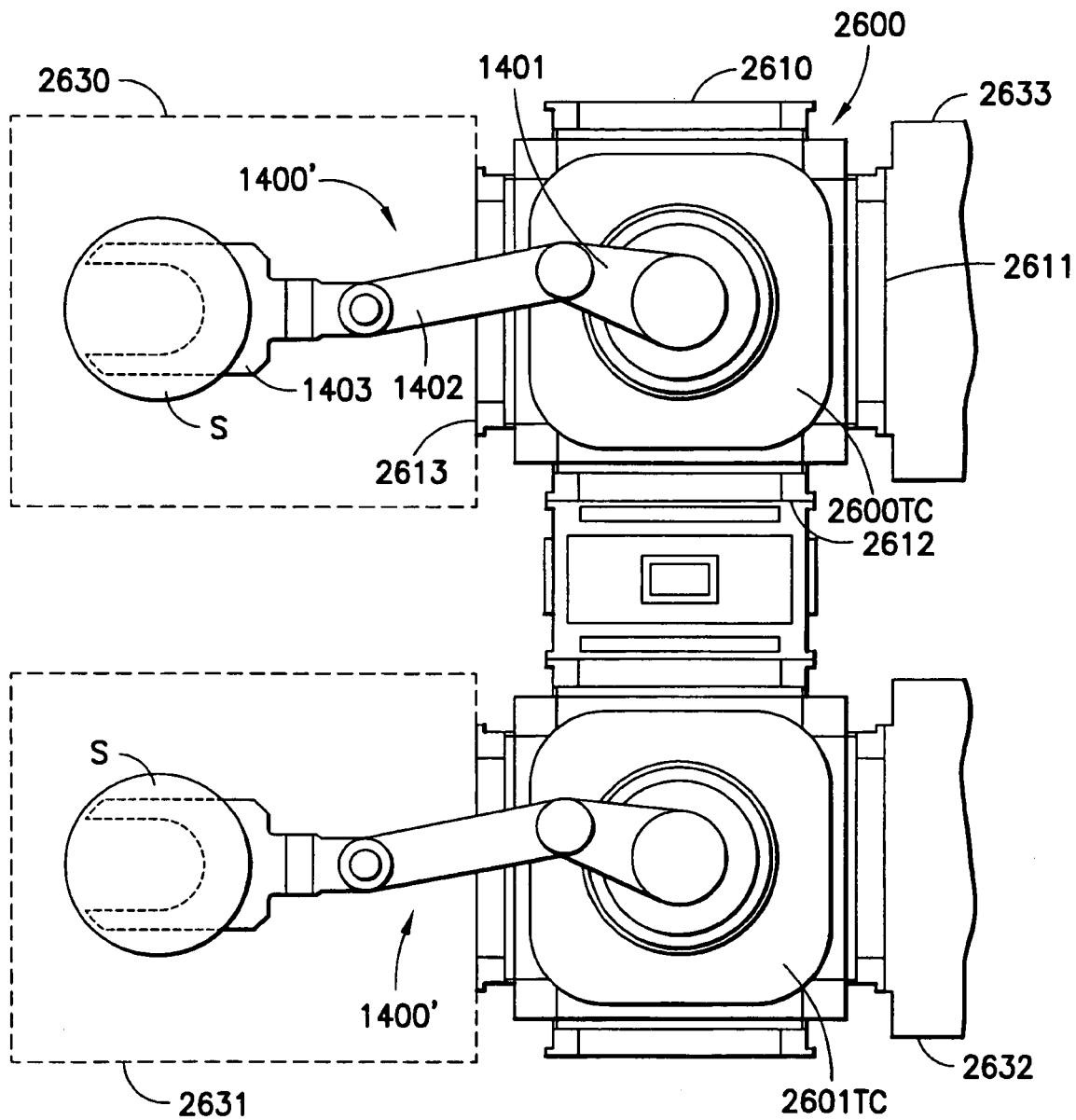
FIG. 26 illustrates another exemplary substrate processing system in accordance with an exemplary embodiment.

Referring now to FIG. 26, another processing configuration in which the exemplary embodiments may be utilized is shown. In one embodiment, the transfer chamber 2600TC may be substantially similar to, for example, transfer chamber 100 or 900TC and may be utilized as a modular transfer chamber in a linearly distributed processing tool 2600 such as described in U.S. patent application Ser. No. 11/442,511, entitled "LINEARLY DISTRIBUTED SEMICONDUCTOR WORKPIECE PROCESSING TOOL", filed on May 26, 2006, the disclosure of which is incorporated by reference herein in its entirety. The transfer chamber 2600TC may include transfer robot 1400' which may be substantially similar to transfer robot 1400 described above with respect to FIGS. 14A-C. Although the transfer robot 1400' is shown as having one end effector it may be realized that the transfer robot may have any suitable number of end effectors that may or may not be differentially driven. The transport chamber 2600TC may be connected or coupled in any suitable manner to other transfer chambers such as transfer chamber 2601TC, or any other substrate processing apparatus 2630-2632. The other substrate processing apparatus 2630-2632 may include, but are not limited to, processing modules, load ports, aligners, load locks, coolers, heaters, buffers and other transfer robots. Substrates S may be transferred from transfer robot to transfer robot, or between any suitable processing apparatus 2630-2632 by the transfer robots 1400'. Each of the transfer chambers 2600TC, 2601TC may have openings 2610-2613 along each of its four sides for communicating with the other substrate processing apparatus. It is noted that while the transfer chambers 2600TC, 2601TC are shown as having four sides, in alternate embodiments the transfer chambers may have any suitable number of sides that may or may not be open to other substrate processing apparatus. In one embodiment one or more of the openings 2610-2613 may include a valve for isolating the transfer chamber 2600TC, 2601TC from a processing apparatus connected to the transfer chamber.

The compact size of the transfer chambers 2600TC, 2601TC and the maximized containment to reach ratio of the transfer robots 1400' may reduce the footprint of the linearly distributed processing tool. The minimized volume of the transfer chamber may also decrease the cycle time of any pump down cycle of the transfer chambers. As may be realized the load locks, such as load locks 110 and 900LL may also be utilized in the linearly distributed processing tool in a manner substantially similar to that described above with respect to the transfer chambers 2600TC, 2601TC.

Figure 27C:
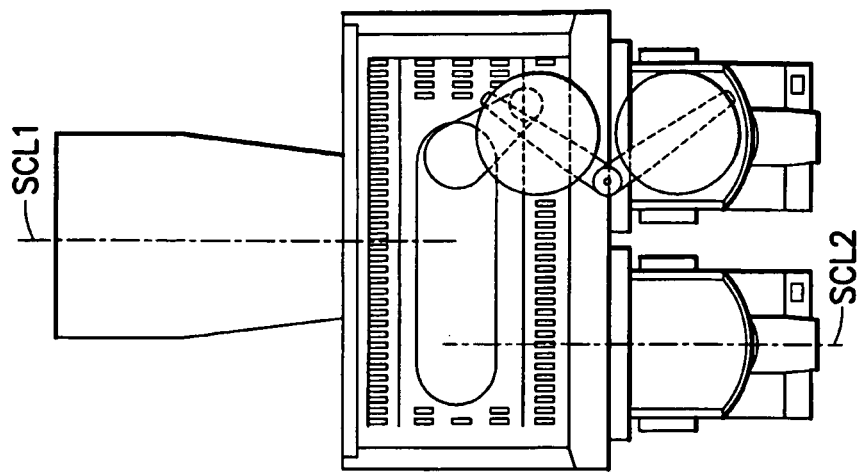
FIGS. 27A-C illustrates yet another exemplary substrate processing system in accordance with an exemplary embodiment.
Figure 27B:
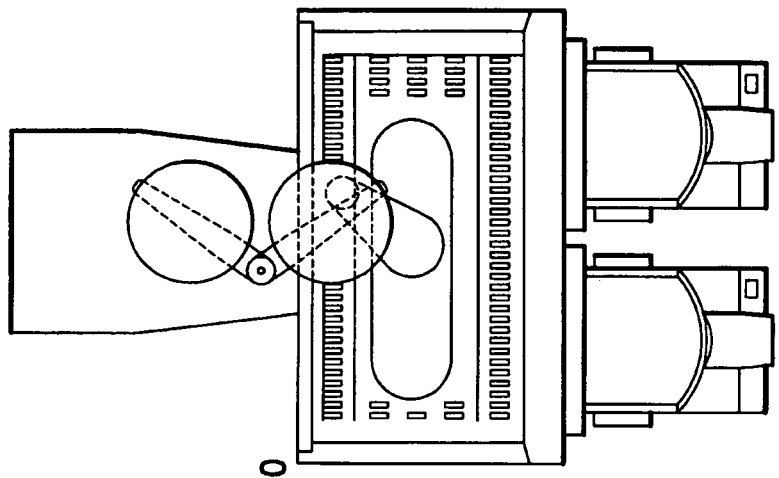
Figure 27A:
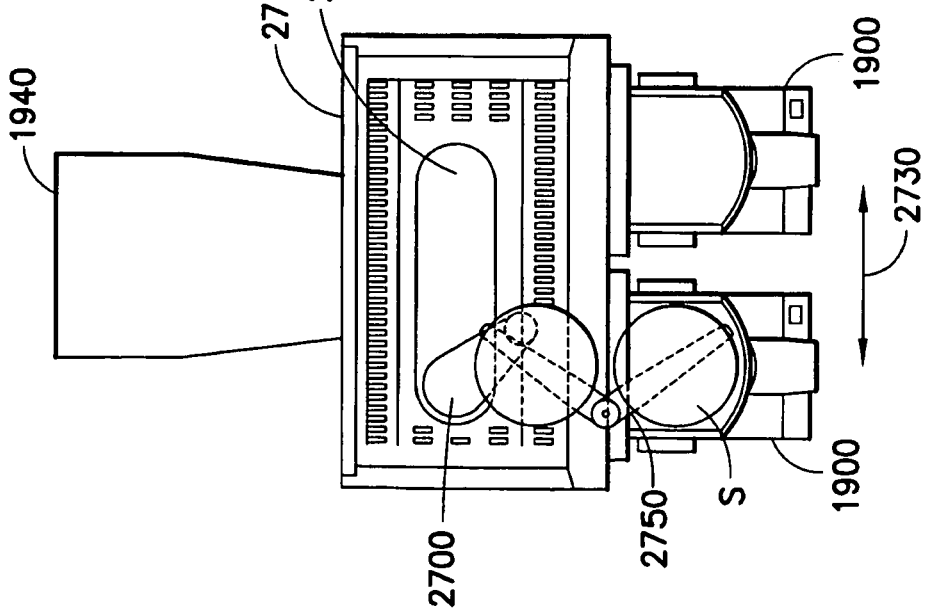

Referring now to FIGS. 27A-27C another exemplary substrate transfer system is shown. In this example, the transfer system includes an atmospheric transfer module 2710, load port modules 1900 and a processing module 1940. While two load port modules 1900 and one processing module 1940 are shown in the Figures, it should be realized that any suitable number of load port modules and processing modules may be coupled with the transfer module 2710. In this example, the transfer module 2710 may be configured as an atmospheric module substantially similar to an equipment front end module (similar to EFEM 150 in FIG. 1). The transfer module 2710 includes a transfer robot 2700 that may be substantially similar to robot 1400 described above where the robot is configured to operate in, for example, an atmospheric environment. The transfer robot 2710 may be mounted on a track 2720 so that the robot 2700 may be translated in the direction of arrow 2730 to allow for picking/placing substrates in the various modules coupled to the transfer module 2710. For exemplary purposes only, a suitable example of a track mounted transfer apparatus can be found in U.S. patent application Ser. No. 10/159,726, entitled "Dual Arm Substrate Transport Apparatus" and filed on May 29, 2002.

As may be realized, the motion profile of the transfer robot 2700 may be substantially similar to that described above with respect to FIG. 16B. For example, the substrate S located on the end effector 2750 follows a substantially arcuate or U-shaped path substantially similar to path 1670 while inside the transfer module 2710 and a substantially straight or linear path substantially similar to path 1680 while outside of the transfer module 2710 (i.e. within a load lock/buffer, processing module, or load port). In one example the substantially straight or linear path may be along a station centerline SCL1, SCL2 which may also be an operational path of the transfer module 2710.

In this example, the transfer module 2710 is shown coupled directly to the load port modules 1900 and the processing module 1940 for transferring substrates between the load ports 1900 and processing module 1940 with "one touch" as described above. In other exemplary embodiments, the transfer module may be coupled to load ports and load locks as shown in, for example, FIGS. 1B and 2B. In alternate embodiments, the transfer module 2710 may be directly coupled to a combination of load locks, load ports and processing module It should be understood that the exemplary embodiments described herein can be used individually or in any combination thereof. It should also be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate processing system comprising:
a load port module configured to hold at least one substrate container for storing and transporting substrates;
at least one substrate processing chamber;
at least one isolatable transfer chamber capable of holding an isolated atmosphere therein configured to couple the substrate processing chamber and the load port module, where the at least one substrate processing chamber and the at least one transfer chamber are arranged to form independent and substantially continuously parallel transport paths that have isolated atmospheres from each other where each of the substantially continuously parallel transport paths is a continuous substantially straight line path at least through a respective transfer chamber and into a respective processing chamber; and
a substrate transport mounted at least partially within each of the at least one transfer chamber and having a drive section fixed to a respective transfer chamber and having a SCARA arm configured to support at least one substrate, the SCARA arm being configured to bi-directionally extend in a substantially continuous linear motion along a respective continuous substantially straight line path to transport the at least one substrate from the at least one substrate container and to the processing chamber with but one touch of the at least one substrate, wherein the SCARA arm comprises a first arm link, a second arm link, and at least one end effector serially pivotally coupled to each other, where the first and second arm links have unequal lengths.

2. The substrate processing system of claim 1, wherein the at least one load port module is but one load port module, and the at least one substrate processing chamber is but one substrate processing chamber.

3. The substrate processing system of claim 1, wherein when transporting the substrate from the substrate container and to the substrate processing chamber with but one touch, the substrate is moved along a first path between the substrate container and substrate transfer chamber, and a second path between the transfer chamber and the substrate processing chamber, and the first and second paths are substantially aligned.

4. The substrate processing system of claim 1, wherein the SCARA arm defines a clearance envelope through which the SCARA arm moves to transfer substrates, and the transfer chamber is arranged so that it forms a transfer area substantially equal to the clearance envelope.

5. The substrate processing system of claim 1, wherein the at least one processing module, the at least one transport chamber and load port module are arranged substantially along a common centerline.

6. A substrate processing system comprising:
an equipment front end module having at least one transport path for transferring substrates from the equipment front end module;
at least one substrate transfer module coupled directly to the equipment front end module, the at least one substrate transfer module having a transfer chamber and a substrate transport; and
at least one substrate processing module coupled to each of the at least one substrate transfer module;
wherein the substrate processing system defines a cluster tool and the equipment front end module, the at least one substrate transfer module and the at least one substrate processing module are arranged to form independent and substantially continuously parallel transport paths of the unit or tool that have isolated atmospheres from each other, where each of the independent and substantially continuously parallel transport paths is a continuous substantially straight line path at least through a respective substrate transfer module and into a respective substrate processing module and the substrate transport is configured to bi-directionally extend in a substantially continuous linear motion along a respective continuous substantially straight line path to transport at least one substrate from outside a respective transfer chamber to the respective substrate processing module with but one touch of the at least one substrate.

7. The substrate processing system of claim 6, wherein the at least one substrate transfer module comprises:
a first chamber configured to interface with the equipment front end module and hold at least one substrate;
the transfer chamber being configured to interface with the at least one substrate processing module; and
the substrate transport is located at least partly in the transfer chamber and is configured to transfer substrates from the first chamber to the at least one substrate processing module.

8. The substrate processing system of claim 7, wherein the first chamber and transfer chamber are isolatable from each other and a respective one of the equipment front end module and the at least one substrate processing module.

9. The substrate processing system of claim 7, wherein the first chamber is configured as a substrate buffer and a removable valve insert is configured to isolate the first chamber and transfer chamber for converting the buffer into a load lock.

10. The substrate processing module of claim 7, wherein the first chamber and transfer chamber form one unitary isolatable chamber.

11. The substrate processing system of claim 6, wherein the substrate transfer module includes at least one of a substrate buffer, a substrate cooler and a substrate aligner.

12. A substrate transport system comprising:
a front end unit configured to transfer substrates from a substrate container;
at least one transfer module joined to the front end unit, the at least one transfer module having a transport portion;
at least one substrate processing chamber coupled to a respective one of the at least one transfer module, where the at least one transfer module and the at least one processing chamber form substantially continuously parallel inline transport paths, where each the substantially continuously parallel inline transport paths is a continuous substantially straight line path from the front end unit for transferring substrates from the front end unit to a respective processing chamber; and
a substrate transport mounted at least partially within each of the transfer modules and configured to transport substrates to the respective processing chamber from outside a respective transport portion with but one touch of the substrates in a substantially continuous linear motion along a respective continuous substantially straight line path, the substrate transport comprising a drive section substantially fixed to the transfer module, two unequal length arm links and at least one end effector pivotally joined to each other;
a first one of the arm links being pivotally joined to a housing of the transfer module at a first end about a stationary shoulder axis, the first arm link having a first length;
a first end of a second one of the arm links being pivotally joined to a second end of the first arm link, the second arm link having a second length where a rotation of the second arm link is slaved to a rotation of the first arm link; and
the at least one end effector being pivotally joined to a second end of the second arm link and being configured to hold at least one substrate, the at least one end effector being rotatably driven separately from the first and second links.

13. The transport system of claim 12, wherein the front end unit comprises a plurality of operational paths substantially parallel with each other, wherein a transfer module is coupled to each of the plurality of operational paths.

14. The transport system of claim 12, wherein the at least one transfer module comprises a buffer portion for buffering at least one substrate and the transport portion is configured for housing at least a portion of the transport.

15. The transport system of claim 14, wherein the at least one transfer module further comprises a removable valve insert configured to convert the buffer portion into a load lock having an atmosphere isolatable from the transport portion.

16. The transport system of claim 14, wherein the buffer portion and transport portion form a single unitary chamber selectably isolatable from the processing chamber and front end unit.

17. The transport system of claim 12, wherein the at least one transfer module includes at least one of a substrate buffer, a substrate cooler and a substrate aligner.

18. A substrate processing apparatus comprising:
a front end module configured to hold at least one substrate container for storing and transporting substrates;
at least one substrate processing chamber;
at least one isolatable transfer chamber capable of holding an isolated atmosphere therein configured to couple a respective one of the at least one substrate processing chamber and the front end module; and
a substrate transport mounted at least partially within each of the at least one transfer chambers having a drive section substantially fixed to a respective transfer chamber and having an unequal length SCARA arm configured to support at least one substrate, the SCARA arm being configured to transport the at least one substrate from the front end module and to the processing chamber with but one touch of the at least one substrate;
wherein the front end module, at least one substrate processing chamber and at least one isolatable transfer chamber are arranged for transporting substrates between the front end module and each of the at least one substrate processing chamber along independent and substantially continuously parallel transport paths that are atmospherically isolatable from each other, where each of the independent and substantially continuously parallel transport paths is a continuous substantially straight line path at least through a respective transfer chamber and into a respective substrate processing chamber and the SCARA arm is configured to bi-directionally extend in a substantially continuous linear motion along a respective continuous substantially straight line path to transport the at least one substrate.

19. The substrate processing apparatus of claim 18, wherein the at least one unequal length SCARA comprises,
a first arm link rotatably coupled to a first rotational axis of the drive section at a first end about a shoulder joint,
a second arm link rotatably coupled at a first end to a second end of the first arm link about an elbow joint and being slaved to the first arm link, a length of the second arm being different than a length of the first arm link,
at least two substrate holders each configured to hold at least one substrate, the at least two substrate holders being rotatably coupled to a second end of the second arm link at a wrist joint, and
where the at least two substrate holders are differentially coupled to but a second rotational axis of the drive section for substantially equal and opposite rotation of the at least two end effectors relative to each other, the transport being configured for bi-directional extension of the at least two end effectors relative to the shoulder joint.

20. The substrate processing apparatus of claim 18, wherein the unequal length SCARA arm is configured to transport substrates along a substantially curved path within the frame and along a substantially straight path along a centerline of the substrate transport outside the frame.

21. The substrate processing apparatus of claim 18, wherein the drive section further comprises at least one linear axes of motion.

22. The substrate processing apparatus of claim 18, wherein the substrate transport arm and drive section are configured to operate in an atmospheric or vacuum environment.

* * * * *

UNITED STATES PATENT AND TRADEMARK OFFICE
CERTIFICATE OF CORRECTION

| | | |
|---|---|---|
| PATENT NO. | : 8,562,271 B2 | Page 1 of 1 |
| APPLICATION NO. | : 12/123329 | |
| DATED | : October 22, 2013 | |
| INVENTOR(S) | : Hofmeister et al. | |

It is certified that error appears in the above-identified patent and that said Letters Patent is hereby corrected as shown below:

On the Title Page, column 1, Item (75) Inventors, lines 1-2, delete "Hempstead, NH (US)" and insert -- Hampstead, NH (US) --, therefore.

Signed and Sealed this
Fourteenth Day of April, 2015

Michelle K. Lee
*Director of the United States Patent and Trademark Office*